(12) United States Patent
Misaki et al.

(10) Patent No.: US 10,811,770 B2
(45) Date of Patent: Oct. 20, 2020

(54) SCANNING ANTENNA

(71) Applicant: SHARP KABUSHIKI KAISHA, Sakai, Osaka (JP)

(72) Inventors: Katsunori Misaki, Yonago (JP); Kunio Matsubara, Yonago (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 193 days.

(21) Appl. No.: 16/308,765

(22) PCT Filed: Jun. 6, 2017

(86) PCT No.: PCT/JP2017/021015
§ 371 (c)(1),
(2) Date: Dec. 10, 2018

(87) PCT Pub. No.: WO2017/213148
PCT Pub. Date: Dec. 14, 2017

(65) Prior Publication Data
US 2019/0157759 A1    May 23, 2019

(30) Foreign Application Priority Data
Jun. 10, 2016   (JP) ................. 2016-116500

(51) Int. Cl.
*H01Q 1/38*   (2006.01)
*H01Q 3/44*   (2006.01)
(Continued)

(52) U.S. Cl.
CPC ................. *H01Q 3/34* (2013.01); *G02F 1/13* (2013.01); *G02F 1/1333* (2013.01);
(Continued)

(58) Field of Classification Search
CPC ........ G02F 1/13; G02F 1/1333; G02F 1/1335; G02F 1/133; G02F 1/136;
(Continued)

(56) References Cited

U.S. PATENT DOCUMENTS 6,891,588 B2 *  5/2005  Kawachi ........... G02F 1/133555
                                                       349/114
7,466,269 B2   12/2008  Haziza
(Continued)

FOREIGN PATENT DOCUMENTS

JP    2002-217640 A   8/2002
JP    2007-116573 A   5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — Tho G Phan
(74) *Attorney, Agent, or Firm* — ScienBiziP, P.C.

(57) ABSTRACT

A scanning antenna includes a TFT substrate, a slot substrate, and a liquid crystal layer. The TFT substrate includes a transfer terminal section including a patch connection section formed of the same low-resistance metal film as that of a patch electrode, a first protection metal layer formed on the patch connection section, and a first insulating layer including an opening partially exposing an upper face of the first protection metal layer. The slot substrate includes a terminal section including a slot connection section formed of the same low-resistance metal film as that of the slot electrode, a second protection metal layer formed on the slot connection section, and a second insulating layer including an opening partially exposing an upper face of the second
(Continued)

protection metal layer. The first and second protection metal layers are each formed of at least one layer selected from the group consisting of a Ti layer, a MoNb layer, a MoNbNi layer, a MoNbN layer, and a MoNbNiN layer, and have a thickness of 18 nm or greater.

12 Claims, 48 Drawing Sheets

(51) Int. Cl.
*G02F 1/133* (2006.01)
*H01L 27/12* (2006.01)
*H01Q 3/34* (2006.01)
*G02F 1/1368* (2006.01)
*H01Q 13/22* (2006.01)
*H01Q 21/06* (2006.01)
*G02F 1/13* (2006.01)
*G02F 1/1333* (2006.01)
*G02F 1/1362* (2006.01)
*H01Q 21/20* (2006.01)

(52) U.S. Cl.
CPC ...... *G02F 1/1368* (2013.01); *G02F 1/136286* (2013.01); *H01L 27/124* (2013.01); *H01Q 3/44* (2013.01); *H01Q 13/22* (2013.01); *H01Q 21/06* (2013.01); *H01Q 21/20* (2013.01)

(58) Field of Classification Search
CPC ............. G02F 1/136286; G02F 1/1368; G02F 1/1362; H01L 27/12; H01L 27/124; H01L 27/1262; H01L 23/66; H01Q 1/00; H01Q 13/00; H01Q 13/10; H01Q 13/22; H01Q 19/06; H01Q 21/00; H01Q 21/06; H01Q 21/20; H01Q 3/34; H01Q 3/44; H01Q 21/065

See application file for complete search history.

(56) References Cited

U.S. PATENT DOCUMENTS

| | | | | |
|---|---|---|---|---|
| 7,777,842 B2* | 8/2010 | Igeta | ................. | G02F 1/133555 349/114 |
| 7,847,894 B2 | 12/2010 | Rho | | |
| 7,852,420 B2* | 12/2010 | Yamaguchi | ........ | G02F 1/134363 349/43 |
| 10,170,826 B2* | 1/2019 | Nakazawa | .......... | H01L 27/1255 |
| 10,637,141 B2* | 4/2020 | Inukai | ...................... | H01Q 1/38 |
| 2012/0092577 A1 | 4/2012 | Shi et al. | | |
| 2012/0138922 A1 | 6/2012 | Yamazaki et al. | | |
| 2012/0194399 A1 | 8/2012 | Bily et al. | | |
| 2013/0320334 A1 | 12/2013 | Yamazaki et al. | | |
| 2014/0286076 A1 | 9/2014 | Aoki et al. | | |
| 2018/0138594 A1* | 5/2018 | Orui | ......................... | H01Q 3/34 |
| 2019/0235291 A1* | 8/2019 | Miyake | ................. | H01Q 13/22 |
| 2020/0133039 A1* | 4/2020 | Mizusaki | .......... | G02F 1/134309 |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 DIGESTpp. 824-826.

Kuki, "New Functional Element Using Liquid Crystal" Polymer, vol. 55, August issue, pp. 599-602 (2006) (A concise explanation of the relevance can be found in paragraph [0054] of the specification of the subject application).

Co-pending letter regarding a related co-pending U.S. Appl. No. 15/542,488, filed Jul. 10, 2017.

* cited by examiner

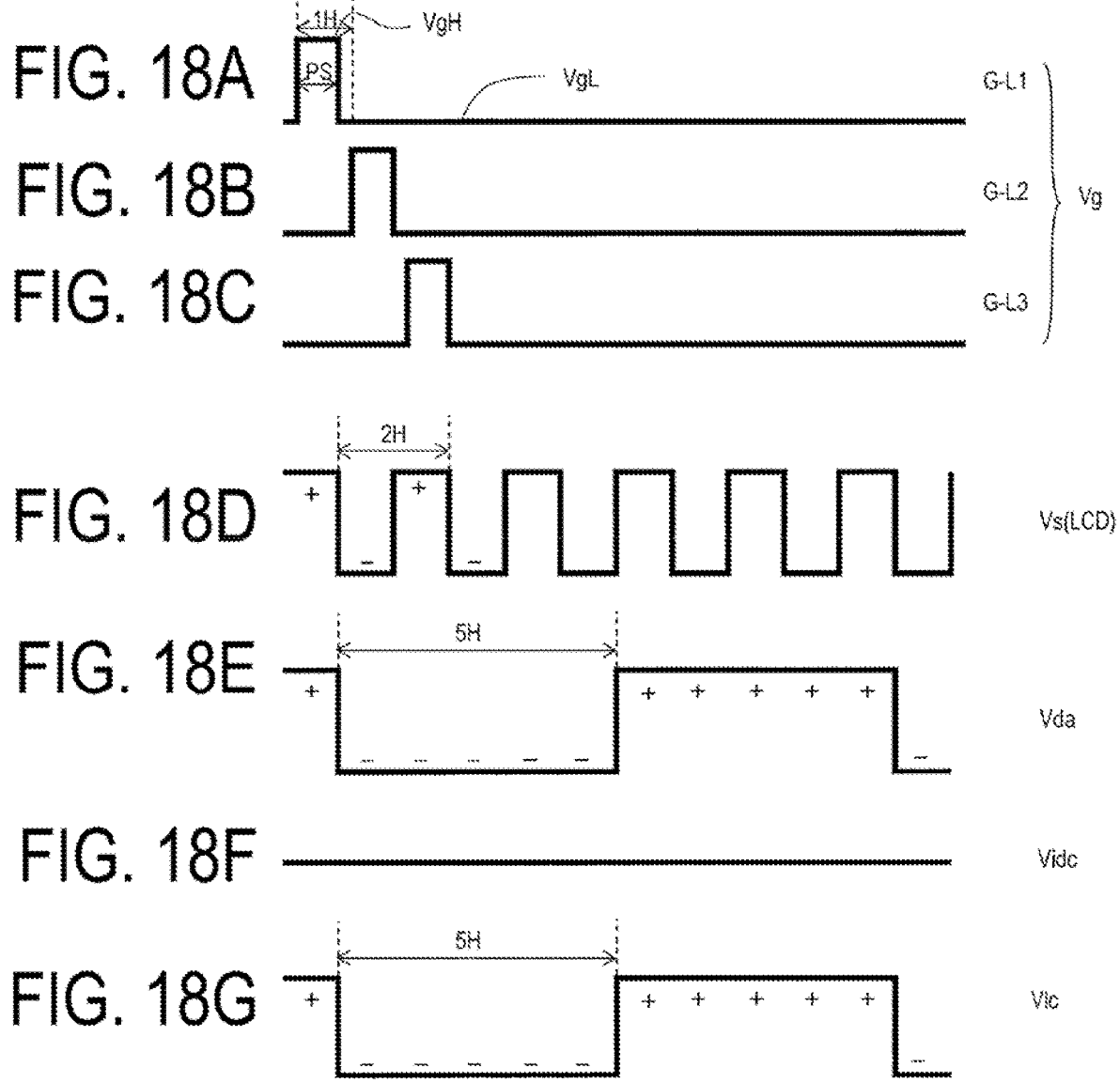

FIG. 19E ——————————————————— 0  Vlc(OFF)

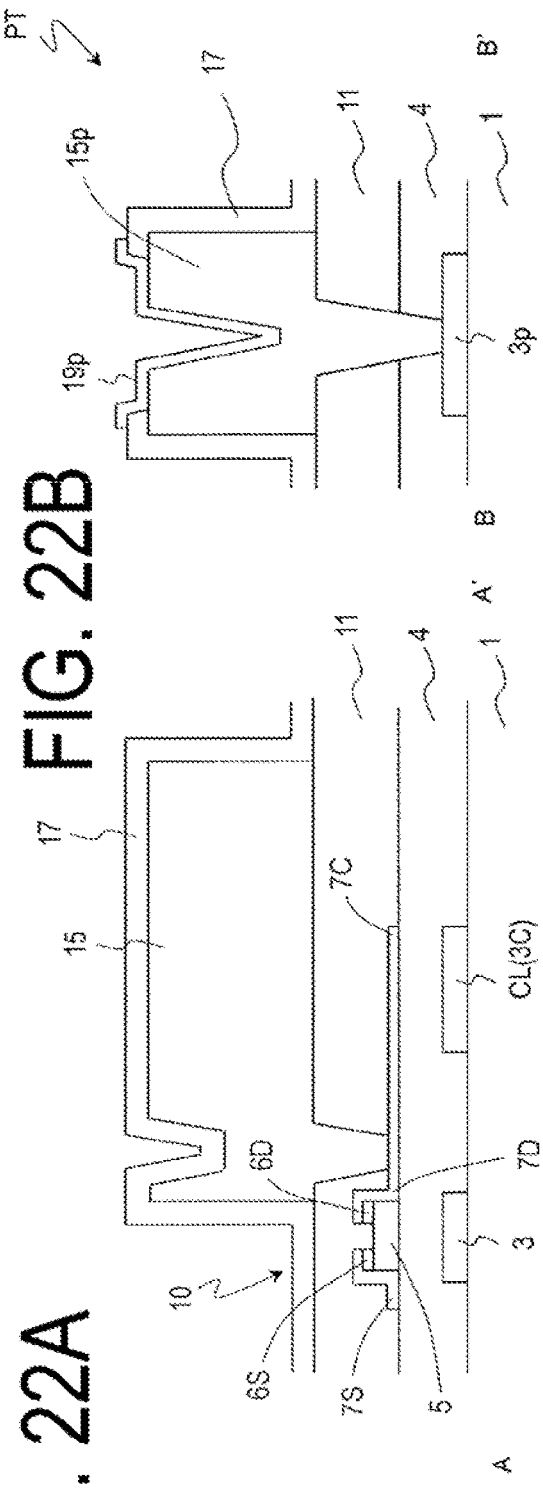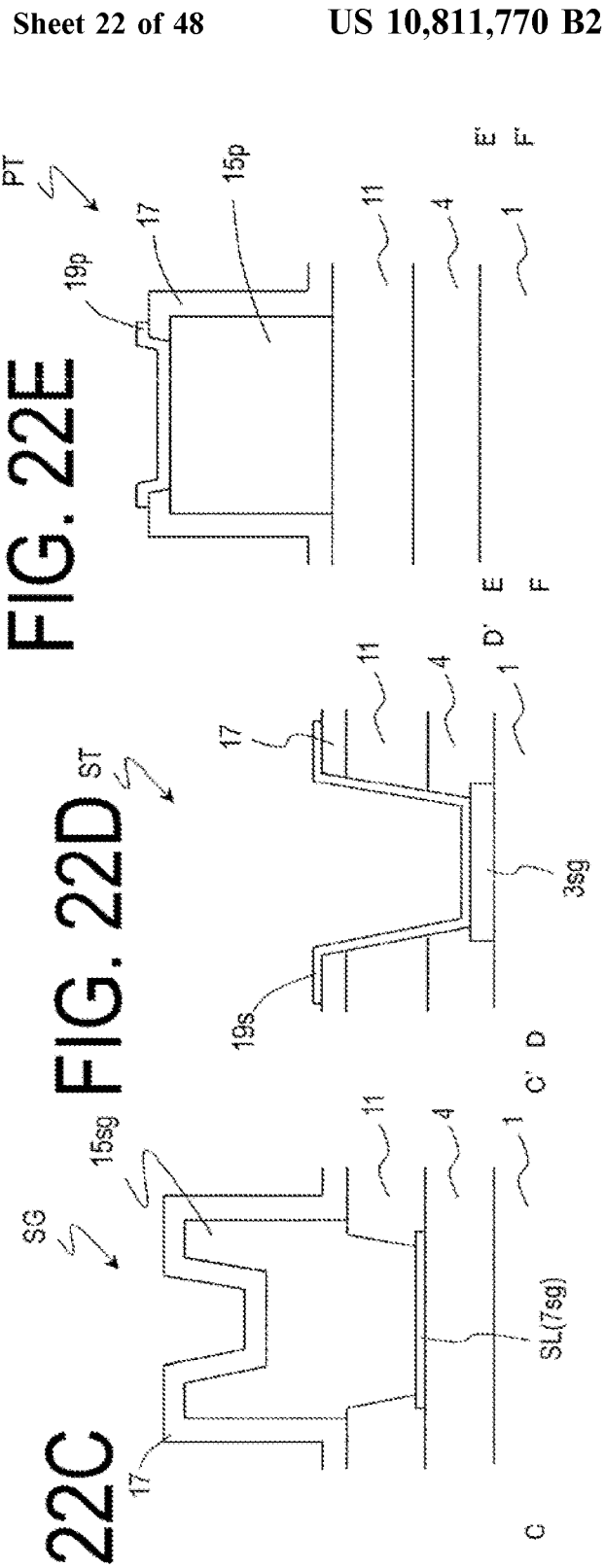

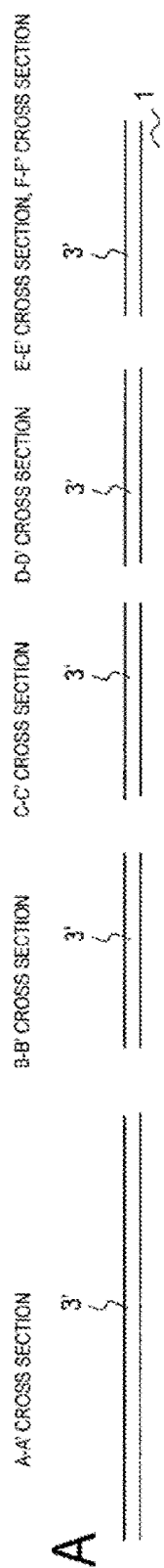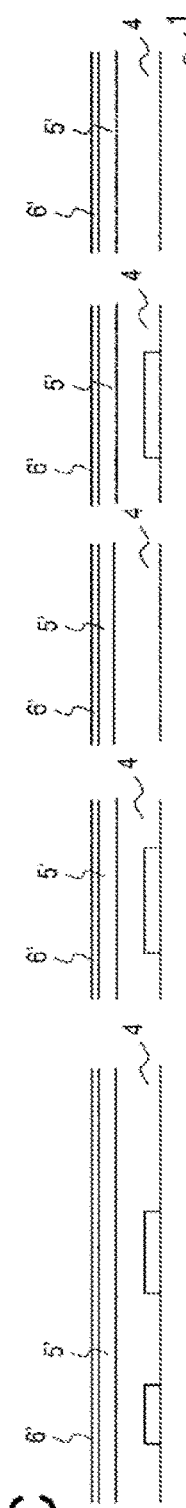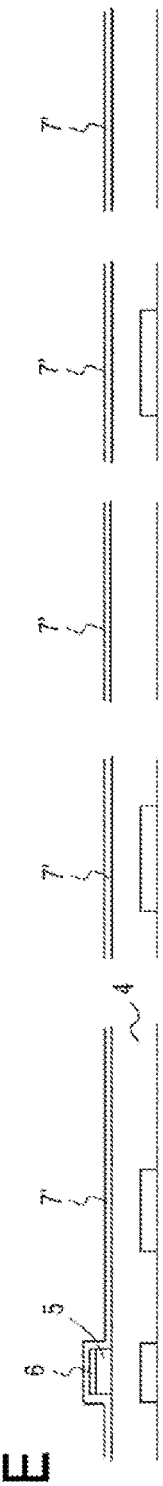

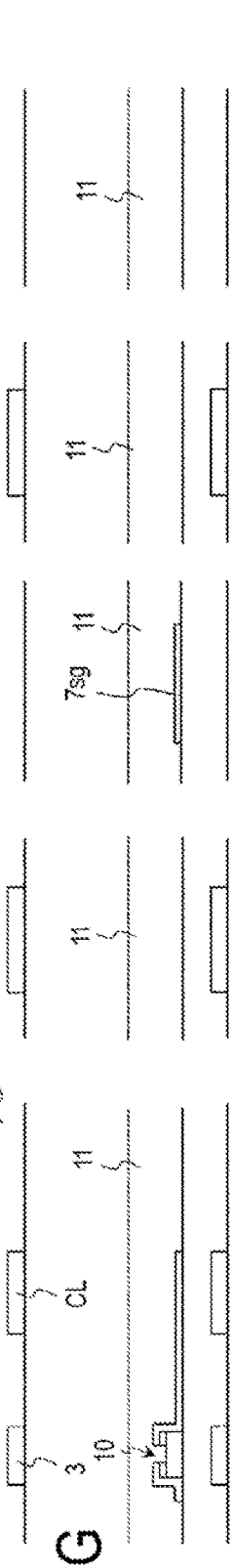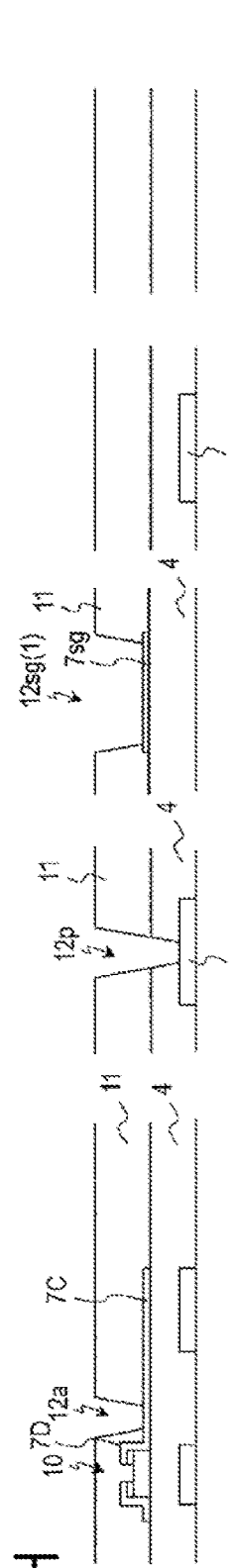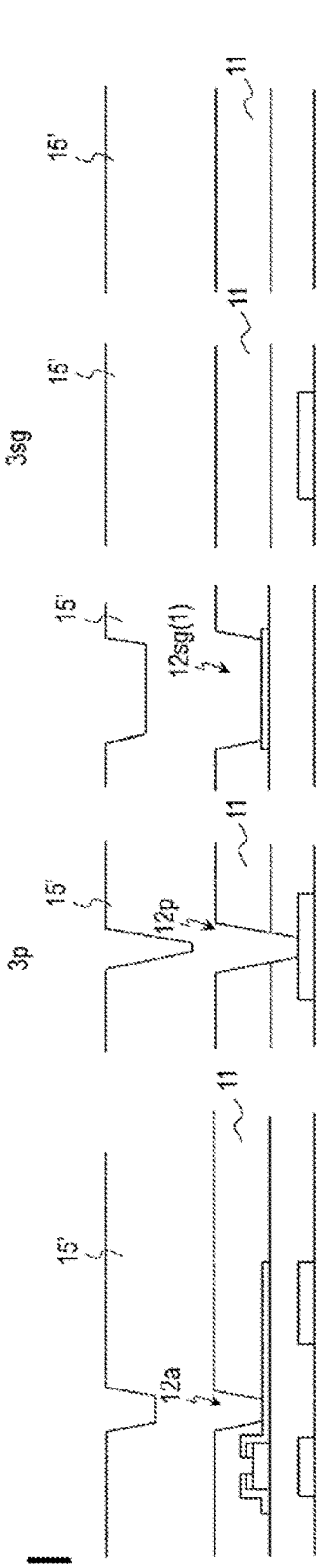

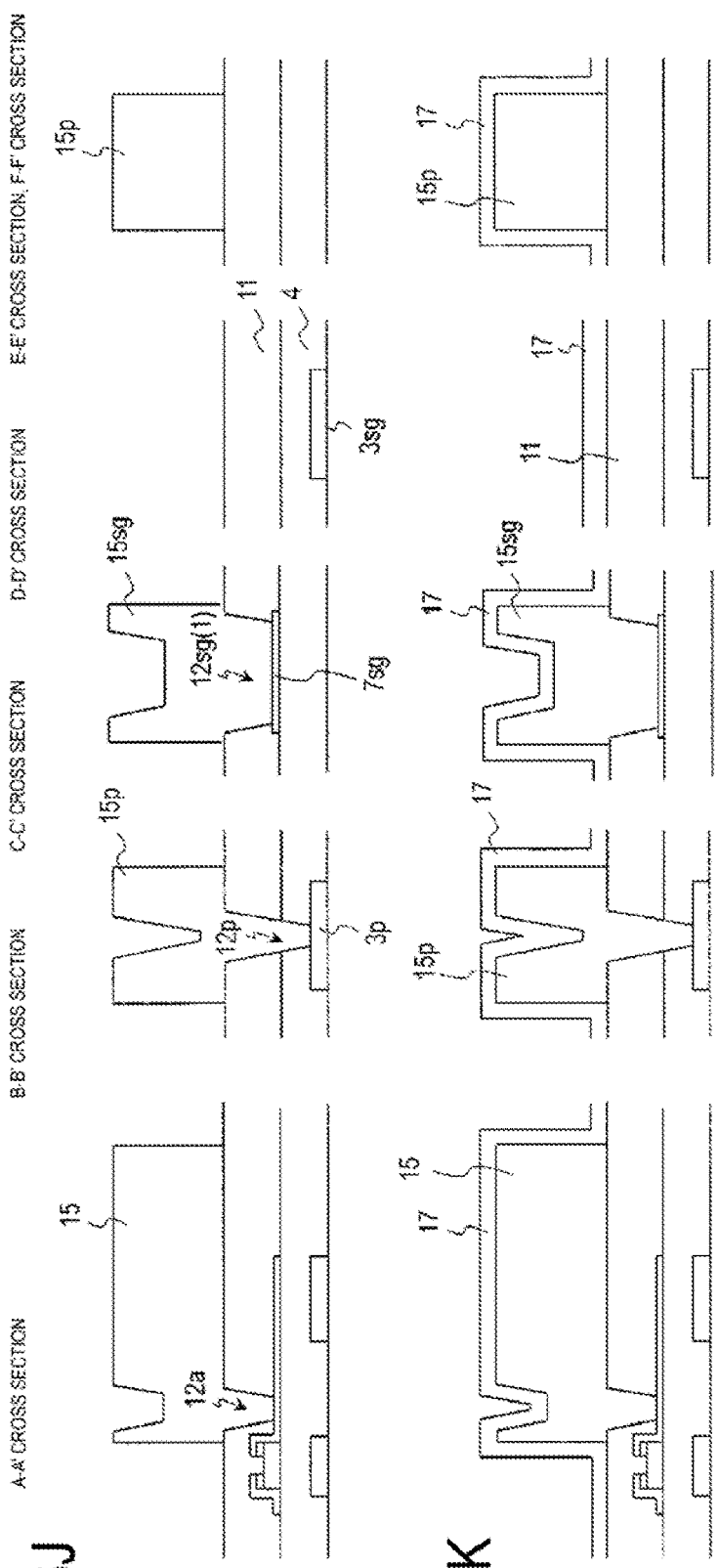

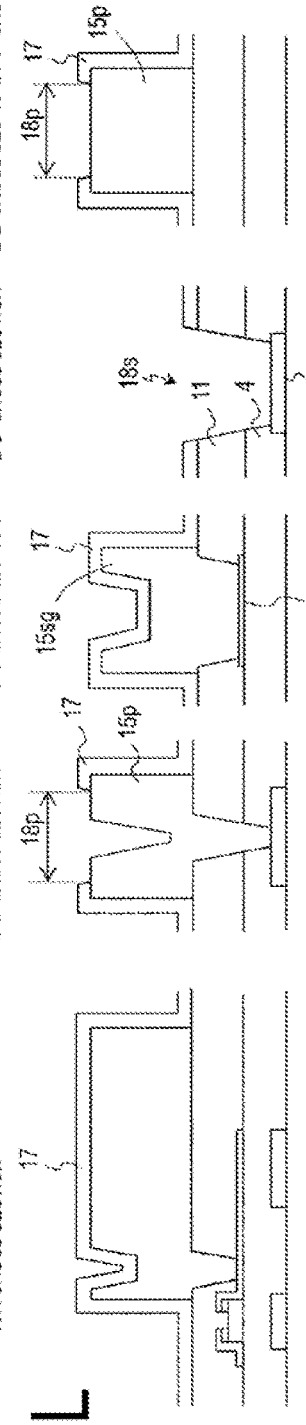
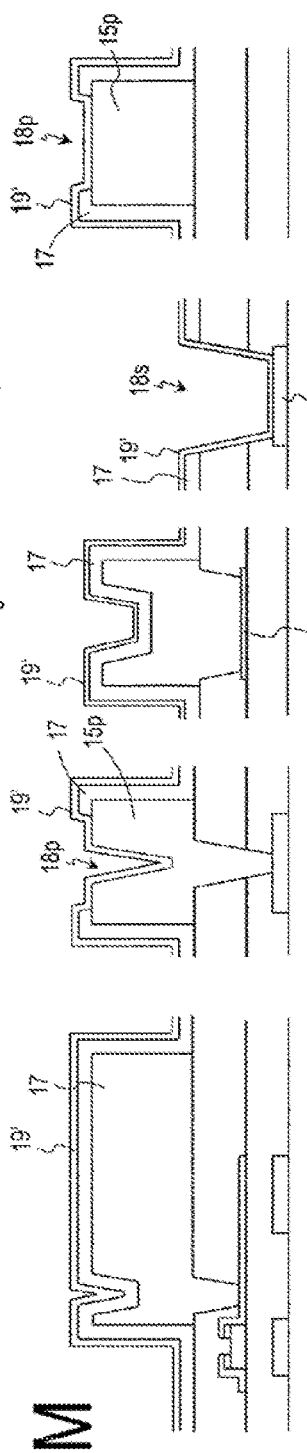
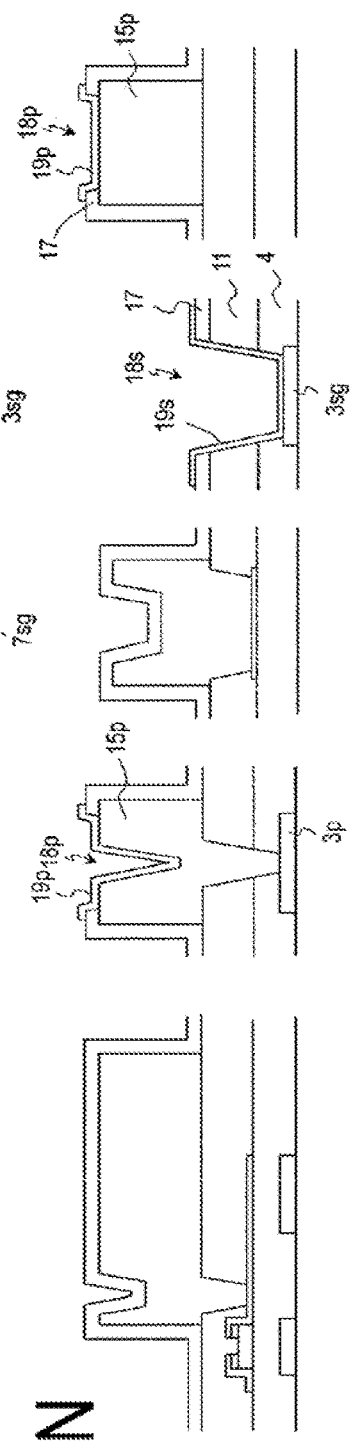
FIG. 27L
FIG. 27M
FIG. 27N

SCANNING ANTENNA

TECHNICAL FIELD

The disclosure relates to scanning antennas, and particularly relates to a scanning antenna (also referred to as a "liquid crystal array antenna") in which an antenna unit (also referred to as an "element antenna") has liquid crystal capacitance, and a manufacturing method of the scanning antenna.

BACKGROUND ART

Antennas for mobile communication and satellite broadcasting require functions that can change the beam direction (referred to as "beam scanning" or "beam steering"). A known example of an antenna (hereinafter referred to as a "scanning antenna", and may be referred to as "scanned antenna") having such functionality is a phased array antenna equipped with antenna units. However, existing phased array antennas are expensive, which is an obstacle for their popularization as a consumer product. In particular, as the number of antenna units increases, the cost rises considerably.

Therefore, scanning antennas that utilize the high dielectric anisotropy (birefringence) of liquid crystal materials (including nematic liquid crystals and polymer dispersed liquid crystals) have been proposed (PTL 1 to PTL 4 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

CITATION LIST

Patent Literature

PTL 1: JP 2007-116573 A
PTL 2: JP 2007-295044 A
PTL 3: JP 2009-538565 A
PTL 4: JP 2013-539949 A

Non Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

As described above, although the idea of realizing an inexpensive scanning antenna by applying LCD technology is known, there are no documents that specifically describe the structure, the manufacturing method, and the driving method of scanning antennas using LCD technology.

Accordingly, an object of the disclosure is to provide a scanning antenna which can be mass-manufactured by utilizing LCD manufacturing techniques in the related art.

Solution to Problem

A scanning antenna according to an embodiment of the disclosure includes a plurality of antenna units arranged therein. The scanning antenna includes: a TFT substrate including a first dielectric substrate (for example, a glass substrate), a plurality of TFTs supported by the first dielectric substrate, a plurality of gate bus lines, a plurality of source bus lines, and a plurality of patch electrodes connected to drains of the respective TFTs; a slot substrate including a second dielectric substrate (for example, a glass substrate), and a slot electrode formed on a first main surface (a surface facing the first dielectric substrate) of the second dielectric substrate, the slot electrode including a plurality of slots disposed in correspondence with the patch electrodes; a liquid crystal layer disposed between the TFT substrate and the slot substrate; and a reflective conductive plate facing a second main surface of the second dielectric substrate with a dielectric layer interposed between the reflective conductive plate and the second main surface, the second main surface being opposite to the first main surface. The TFT substrate further includes a transfer terminal section disposed in a non-transmission and/or reception region. The transfer terminal section includes: a patch connection section formed of a same low-resistance metal film as that of a first low-resistance metal layer of the patch electrodes; a first protection metal layer formed on the patch connection section; and a first insulating layer including an opening partially exposing an upper face of the first protection metal layer. The slot substrate further includes a terminal section disposed in the non-transmission and/or reception region. The terminal section includes: a slot connection section formed of a same low-resistance metal film as that of a second low-resistance metal layer of the slot electrode; a second protection metal layer formed on the slot connection section; and a second insulating layer including an opening partially exposing an upper face of the second protection metal layer. The first and second protection metal layers are each formed of at least one layer selected from the group consisting of a Ti layer, a MoNb layer, a MoNbNi layer, a MoNbN layer, and a MoNbNiN layer, and have a thickness of 18 nm or greater. Each of the first and second protection metal layers preferably has a thickness of 28 nm or greater. The upper limit of the thickness of the first and second protection metal layers is, for example, 300 nm. The first low-resistance metal layer is an Al layer having a thickness of 0.3 µm or greater and 2 µm or less, for example. The second low-resistance metal layer is a Cu layer having a thickness of 2 µm or greater and 6 µm or less, for example. The transfer terminal section may further include a transparent conductive layer formed on the first protection metal layer. The terminal section may further include a transparent conductive layer formed on the second protection metal layer. The transparent conductive layer has a thickness of 20 nm or greater and 250 nm or less, for example.

In an embodiment, the transfer terminal section further includes a first refractory metal containing layer disposed between the patch connection section and the first protection metal layer. The first refractory metal containing layer has a thickness of 10 nm or greater and 200 nm or less, for example.

In an embodiment, the terminal section further includes a second refractory metal containing layer disposed between the slot connection section and the second protection metal layer. The second refractory metal containing layer has a thickness of 10 nm or greater and 300 nm or less, for example.

In an embodiment, the first or second refractory metal containing layer contains Mo or MoN.

In an embodiment, the upper face, exposed from the opening of the first insulating layer, of the first protection metal layer is in a position higher than the first insulating layer with respect to a front face of the first dielectric substrate.

In an embodiment, the first and second insulating layers are each composed of a silicon nitride layer having a thickness of 0.2 µm or less.

In an embodiment, the second protection metal layer covers an upper face and an entire side surface of the slot connection section.

A scanning antenna according to another embodiment of the disclosure includes a plurality of antenna units arranged therein. The scanning antenna includes: a TFT substrate including a first dielectric substrate, a plurality of TFTs supported by the first dielectric substrate, a plurality of gate bus lines, a plurality of source bus lines, and a plurality of patch electrodes connected to drains of the respective TFTs; a slot substrate including a second dielectric substrate, and a slot electrode formed on a first main surface of the second dielectric substrate, the slot electrode including a plurality of slots disposed in correspondence with the patch electrodes; a liquid crystal layer disposed between the TFT substrate and the slot substrate; and a reflective conductive plate facing a second main surface of the second dielectric substrate with a dielectric layer interposed between the reflective conductive plate and the second main surface, the second main surface being opposite to the first main surface. The TFT substrate further includes a transfer terminal section disposed in a non-transmission and/or reception region. The transfer terminal section includes: a patch connection section formed of a same low-resistance metal film as that of a first low-resistance metal layer of the patch electrodes; a first protection metal layer formed on the patch connection section; and a first insulating layer including an opening partially exposing an upper face of the first protection metal layer. The slot substrate further includes a terminal section disposed in the non-transmission and/or reception region. The terminal section includes: a slot connection section formed of a same low-resistance metal film as that of a second low-resistance metal layer of the slot electrode; and a second protection metal layer covering an upper face and an entire side surface of the slot connection section. The first and second protection metal layers are each formed of at least one layer selected from the group consisting of a Ti layer, a MoNb layer, a MoNbNi layer, a MoNbN layer, and a MoNbNiN layer.

In an embodiment, the terminal section further includes a second insulating layer including an opening partially exposing the upper face of the slot connection section, and the second protection metal layer is formed on the second insulating layer.

In an embodiment, the terminal section further includes a second insulating layer including an opening partially exposing an upper face of the second protection metal layer.

In an embodiment, the first and second insulating layers are each composed of a silicon nitride layer having a thickness of 0.2 µm or less.

In an embodiment, the terminal section further includes a transparent conductive layer formed on the second protection metal layer. The transparent conductive layer has a thickness of 20 nm or greater and 250 nm or less, for example.

Advantageous Effects of Disclosure

According to an embodiment of the disclosure, a scanning antenna which can be mass-manufactured by utilizing LCD manufacturing techniques is provided in the related art.

BRIEF DESCRIPTION OF DRAWINGS

FIG. 18A to FIG. 18C, and FIG. 18E to FIG. 18G are each a diagram illustrating an example of a waveform of each signal used for driving the scanning antenna according to an embodiment, and FIG. 18D is a diagram illustrating a waveform of a display signal of an LCD panel performing dot inversion driving.

FIG. 19A to FIG. 19E are each a diagram illustrating another example of a waveform of each signal used for driving the scanning antenna according to an embodiment.

FIGS. 22A to 22E are schematic cross-sectional views illustrating the TFT substrate 107.

FIGS. 24A to 24E are schematic cross-sectional process drawings for describing an example of a manufacturing method of the TFT substrate 107.

FIGS. 25F to 25I are schematic cross-sectional process drawings for describing the example manufacturing method of the TFT substrate 107.

FIGS. 26J and 26K are schematic cross-sectional process drawings for describing the example manufacturing method of the TFT substrate 107.

FIGS. 27L to 27N are schematic cross-sectional process drawings for describing the example manufacturing method of the TFT substrate 107.

FIG. 48B is a schematic cross-sectional view of an LCD panel 900a.

DESCRIPTION OF EMBODIMENTS

Hereinafter, a scanning antenna and a manufacturing method thereof according to embodiments of the disclosure will be described with reference to the drawings. In the following description, first, the structure and manufacturing method of a known TFT-type LCD (hereinafter referred to as a "TFT-LCD") will be described. However, the description of matters well-known within the technical field of LCDs may be omitted. For a description of basic TFT-LCD technology, please refer to, for example, Liquid Crystals, Applications and Uses, Vol. 1-3 (Editor: Birenda Bahadur, Publisher: World Scientific Pub Co Inc), or the like. For reference, the entire contents of the disclosures of the above documents are incorporated herein.

The structure and operation of a typical transmissive TFT-LCD (hereinafter simply referred to as an "LCD") 900 will be described with reference to FIGS. 48A and 48B. Here, an LCD 900 with a vertical electric field mode (for example, a TN mode or a vertical alignment mode) in which a voltage is applied in a thickness direction of a liquid crystal layer is provided as an example. The frame frequency (which is typically twice a polarity inversion frequency) of the voltage applied to the liquid crystal capacitance of the LCD is 240 Hz even at quad speed driving, and the dielectric constant $\varepsilon$ of the liquid crystal layer that serves as the dielectric layer of the liquid crystal capacitance of the LCD is different from the dielectric constant M ($\varepsilon_M$) of microwaves (for example, satellite broadcasting, the Ku band (from 12 to 18 GHz), the K band (from 18 to 26 GHz), and the Ka band (from 26 to 40 GHz)).

Figure 48A:
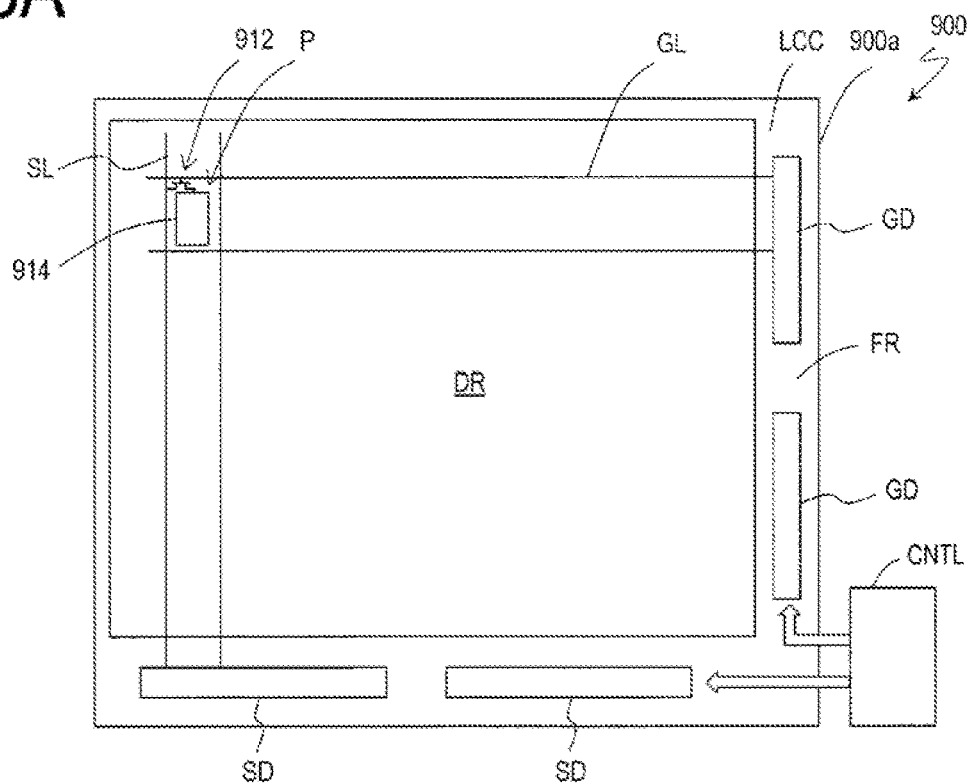
FIG. 48A is a schematic diagram illustrating a structure of an LCD 900 in the related art.

As is schematically illustrated in FIG. 48A, the transmissive LCD 900 includes a liquid crystal display panel 900a, a control circuit CNTL, a backlight (not illustrated), and a power source circuit (not illustrated). The liquid crystal display panel 900a includes a liquid crystal display cell LCC and a driving circuit including a gate driver GD and a source driver SD. The driving circuit may be, for example, mounted on a TFT substrate 910 of the liquid crystal display cell LCC, or all or a part of the driving circuit may be integrated (monolithic integration) with the TFT substrate 910.

Figure 48B:
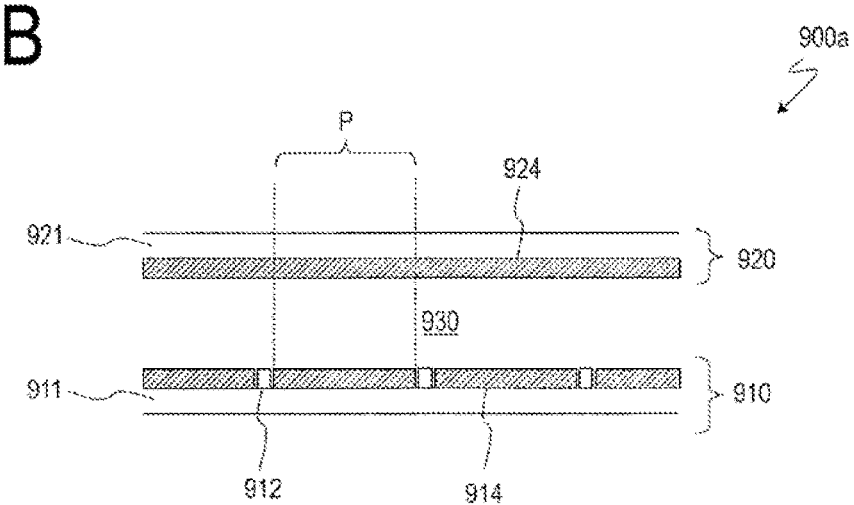

FIG. 48B is a schematic cross-sectional view of the liquid crystal display panel (hereinafter referred to as an "LCD panel") 900a included in the LCD 900. The LCD panel 900a includes the TFT substrate 910, a counter substrate 920, and a liquid crystal layer 930 provided therebetween. Both the TFT substrate 910 and the counter substrate 920 include transparent substrates 911 and 921, such as glass substrates. In addition to glass substrates, plastic substrates may also be used as the transparent substrates 911 and 921 in some cases.

The plastic substrates are formed of, for example, a transparent resin (for example, polyester) and a glass fiber (for example, nonwoven fabric).

A display region DR of the LCD panel 900a is configured of pixels P arranged in a matrix. A frame region FR that does not serve as part of the display is formed around the display region DR. The liquid crystal material is sealed in the display region DR by a sealing portion (not illustrated) formed surrounding the display region DR. The sealing portion is formed by curing a sealing material including, for example, an ultraviolet curable resin and a spacer (for example, resin beads or silica beads), and bonds and secures the TFT substrate 910 and the counter substrate 920 to each other. The spacer in the sealing material controls a gap between the TFT substrate 910 and the counter substrate 920, that is, a thickness of the liquid crystal layer 930, to be constant. To suppress an in-plane variation in the thickness of the liquid crystal layer 930, columnar spacers are formed on light blocking portions (for example, on a wiring line) in the display region DR by using an ultraviolet curable resin. In recent years, as seen in LCD panels for liquid crystal televisions and smart phones, a width of the frame region FR that does not serve as part of the display is very narrow.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacity line) (not illustrated) are formed on the transparent substrate 911. The CS bus line is provided parallel to the gate bus line. Alternatively, the gate bus line of the next stage may be used as the CS bus line (CS on-gate structure).

The pixel electrode 914 is covered with an alignment film (for example, a polyimide film) for controlling the alignment of the liquid crystals. The alignment film is provided so as to be in contact with the liquid crystal layer 930. The TFT substrate 910 is often disposed on the backlight side (the side opposite to the viewer).

The counter substrate 920 is often disposed on the observer side of the liquid crystal layer 930. The counter substrate 920 includes a color filter layer (not illustrated), a counter electrode 924, and an alignment film (not illustrated) on the transparent substrate 921. Since the counter electrode 924 is provided in common to a plurality of pixels P constituting the display region DR, it is also referred to as a common electrode. The color filter layer includes a color filter (for example, a red filter, a green filter, and a blue filter) provided for each pixel P, and a black matrix (light shielding layer) for blocking light unnecessary for display. The black matrix is arranged, for example, so as to block lights between the pixels P in the display region DR and at the frame region FR.

The pixel electrode 914 of the TFT substrate 910, the counter electrode 924 of the counter substrate 920, and the liquid crystal layer 930 therebetween constitute a liquid crystal capacitance Clc. Individual liquid crystal capacitances correspond to the pixels. To retain the voltage applied to the liquid crystal capacitance Clc (so as to increase what is known as the voltage retention rate), an auxiliary capacitance CS electrically connected in parallel with the liquid crystal capacitance Clc is formed. The auxiliary capacitance CS is typically composed of an electrode having the same potential as the pixel electrode 914, an inorganic insulating layer (for example, a gate insulating layer ($SiO_2$ layer)), and an auxiliary capacitance electrode connected to the CS bus line. Typically, the same common voltage as the counter electrode 924 is supplied from the CS bus line.

Factors responsible for lowering the voltage (effective voltage) applied to the liquid crystal capacitance Clc are (1) those based on a CR time constant which is a product of a capacitance value $C_{Clc}$ of the liquid crystal capacitance Clc and a resistance value R, and (2) interfacial polarization due to ionic impurities included in the liquid crystal material and/or the orientation polarization of liquid crystal molecules. Among these, the contribution of the CR time constant of the liquid crystal capacitance Clc is large, and the CR time constant can be increased by providing an auxiliary capacitance CS electrically connected in parallel to the liquid crystal capacitance Clc. Note that a volume resistivity of the liquid crystal layer 930 that serves as the dielectric layer of the liquid crystal capacitance Clc exceeds the order of $10^{12}$ Ω·cm in the case of widely used nematic liquid crystal materials.

A display signal supplied to the pixel electrode 914 is a display signal that is supplied to the source bus line SL connected to the TFT 912 when the TFT 912 selected by a scanning signal supplied from the gate driver GD to the gate bus line GL is turned on. Accordingly, the TFTs 912 connected to a particular gate bus line GL are simultaneously turned on, and at that time, corresponding display signals are supplied from the source bus lines SL connected to the respective TFTs 912 of the pixels P in that row. By performing this operation sequentially from the first row (for example, the uppermost row of a display surface) to the mth row (for example, the lowermost row of the display surface), one image (frame) is written in the display region DR composed of m rows of pixels and is displayed. Assuming that the pixels P are arranged in a matrix of m rows and n columns, at least n source bus lines SL are provided in total such that at least one source bus line SL corresponds to each pixel column.

Such scanning is referred to as line-sequential scanning, a time between one pixel row being selected and the next pixel row being selected is called a horizontal scan period, (1H), and a time between a particular row being selected and then being selected a second time is called a vertical scanning period, (1V), or a frame. Note that, in general, 1V (or 1 frame) is obtained by adding the blanking period to the period m·H for selecting all m pixel rows.

For example, when an input video signal is an NTSC signal, 1V (=1 frame) of an existing LCD panel is 1/60 of a second (16.7 milliseconds). The NTSC signals are interlaced signals, the frame frequency is 30 Hz, and the field frequency is 60 Hz, but in LCD panels, since it is necessary to supply display signals to all the pixels in each field, they are driven with 1V=(1/60) second (driven at 60 Hz). Note that, in recent years, to improve the video display characteristics, there are LCD panels driven at double speed drive (120 Hz drive, 1V=(1/120 second)), and some LCD panels are driven at quad speed (240 Hz drive, 1V=(1/240 second)) for 3D displays.

When a DC voltage is applied to the crystal layer 930, the effective voltage decreases and the luminance of the pixel P decreases. Since the above-mentioned interface polarization and/or the orientation polarization contribute to the decrease in the effective voltage, it is difficult for the auxiliary capacitance CS to prevent the decrease in the effective voltage completely. For example, when a display signal corresponding to a particular intermediate gray scale is written into every pixel in every frame, the luminance fluctuates for each frame and is observed as flicker. In addition, when a DC voltage is applied to the liquid crystal layer 930 for an extended period of time, electrolysis of the liquid crystal material may occur. Furthermore, impurity ions segregate at one side of the electrode, so that the effective voltage may not be applied to the liquid crystal layer and the liquid crystal molecules may not move. To prevent this, the LCD panel 900a is subjected to so-called AC driving. Typically, frame-reversal driving is performed in which the polarity of the display signal is inverted every frame (every vertical scanning period). For example, in existing LCD panels, the polarity inversion is performed every 1/60 second (a polarity inversion period is 30 Hz).

In addition, dot inversion driving, line reversal driving, or the like is performed in order to uniformly distribute the pixels having different polarities of applied voltages even within one frame. This is because it is difficult to completely match the magnitude of the effective voltage applied to the liquid crystal layer between a positive polarity and a negative polarity. For example, in a case where the volume resistivity of the liquid crystal material exceeds the order of $10^{12}$ Ω·cm, flicker is hardly recognizable in a case where the dot inversion or line reversal driving is performed every 1/60 second.

In the LCD panel 900a, on the basis of the signals supplied from the control circuit CNTL to the gate driver GD and the source driver SD, the scanning signal and the display signal are supplied from the gate driver GD and the source driver SD to the gate bus line GL and the source bus line SL, respectively. For example, the gate driver GD and the source driver SD are each connected to corresponding terminals provided on the TFT substrate 910. The gate driver GD and the source driver SD may be mounted on the frame region FR of the TFT substrate 910 as a driver IC, for example, or may be monolithically formed in the frame region FR of the TFT substrate 910.

The counter electrode 924 of the counter substrate 920 is electrically connected to a terminal (not illustrated) of the TFT substrate 910 with a conductive portion (not illustrated) known as a transfer therebetween. The transfer is formed, for example, so as to overlap with the sealing portion, or alternatively so as to impart conductivity to a part of the sealing portion. This is done to narrow the frame region FR. A common voltage is directly or indirectly supplied to the counter electrode 924 from the control circuit CNTL. Typically, the common voltage is also supplied to the CS bus line as described above.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit.

It can be considered that each antenna unit functions as a "phase shifter". For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, the structure of the antenna units is different from the structure of the pixel of the LCD panel, and the arrangement of the plurality of antenna units is also different from the arrangement of the pixels in the LCD panel. A basic structure of the scanning antenna according to the embodiments of the disclosure will be described with reference to FIG. 1, which illustrates a scanning antenna 1000 of a first embodiment to be described in detail later. Although the scanning antenna 1000 is a radial in-line slot antenna in which slots are concentrically arranged, the scanning antennas according to the embodiments of the disclosure are not limited to this. For example, the arrangement of the slots may be any of various known arrangements.

Figure 1:
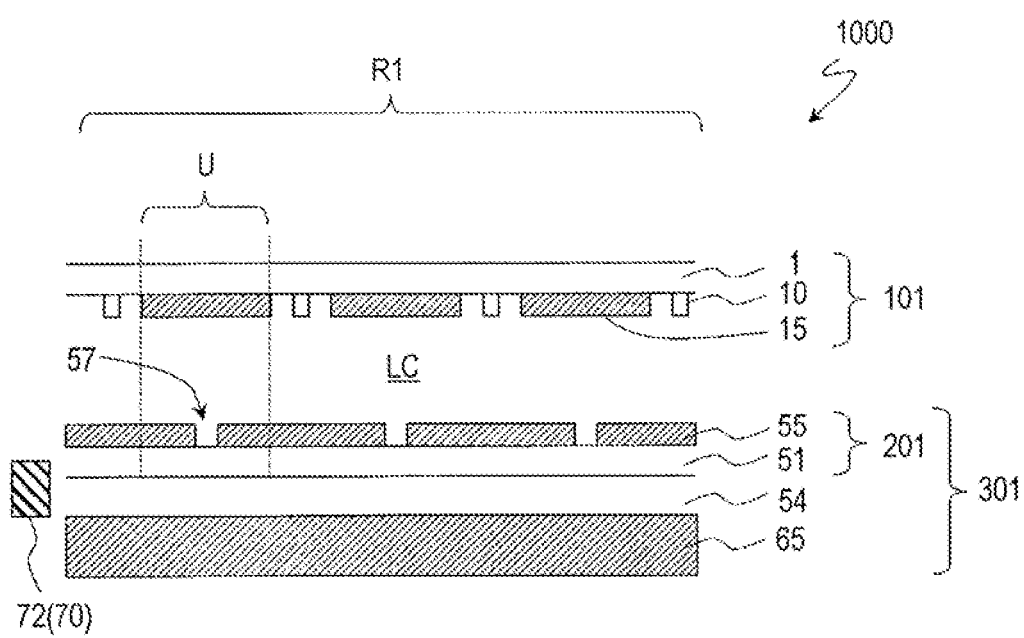
FIG. 1 is a cross-sectional view schematically illustrating a portion of a scanning antenna 1000 according to a first embodiment.

FIG. 1 is a cross-sectional view schematically illustrating a portion of the scanning antenna 1000 of the present embodiment, and schematically illustrates a part of the cross-section along the radial direction from a power feed pin 72 (see FIG. 2B) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and receives microwaves from a side closer to the TFT substrate 101.

The TFT substrate 101 includes a dielectric substrate 1 such as a glass substrate, a plurality of patch electrodes 15, and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

Figure 17:
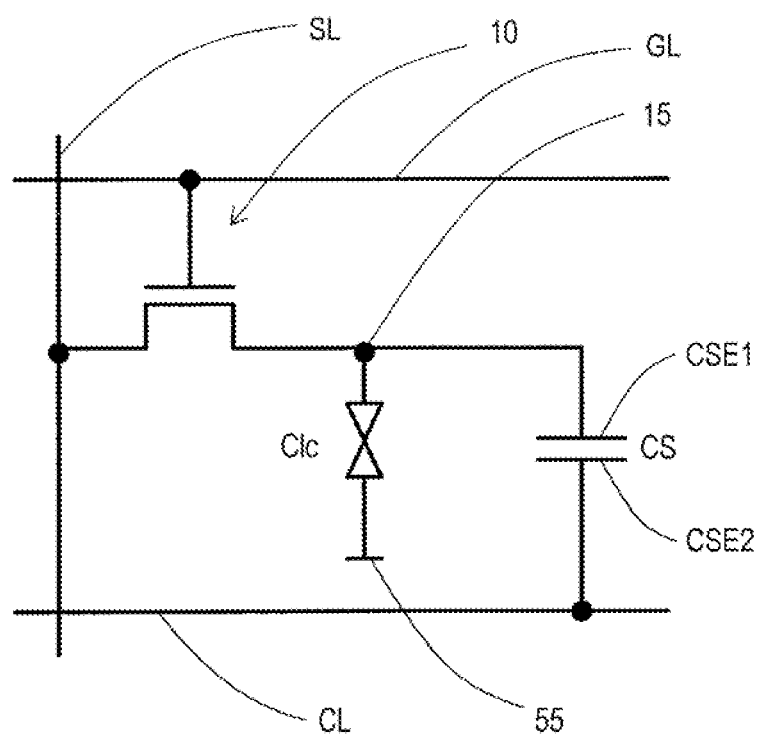
FIG. 17 is a diagram illustrating an equivalent circuit of one antenna unit in a scanning antenna according to an embodiment of the disclosure.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. The structure in which the patch electrode 15 and the slot electrode 55 are opposed to each other with the liquid crystal layer LC interposed therebetween is similar to the structure illustrated in FIGS. 48A and 48B in which the pixel electrode 914 and the counter electrode 924 of the LCD panel 900a are opposed to each other with the liquid crystal layer 930 interposed therebetween. That is, the antenna unit U of the scanning antenna 1000 and the pixel P of the LCD panel 900a have a similar configuration. In addition, the antenna unit has a configuration similar to the pixel P in the LCD panel 900a in that the antenna unit has an auxiliary capacitance electrically connected in parallel with the liquid crystal capacitance (see FIG. 13A and FIG. 17). However, the scanning antenna 1000 has many differences from the LCD panel 900a.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to $1/20$ (−26 dB), and in a case where the thickness is five times the skin depth, electromagnetic waves are attenuated to about $1/150$ (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to $1/150$. In addition, for a microwave of 30 GHz, in a case where a Cu layer having a thickness of greater than or equal to 1.9 μm and an Al layer having a thickness of greater than or equal to 2.3 μm are used, microwaves can be reduced to $1/150$. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. When the thin film depositions methods are used, the thickness of the metal layer is preferably less than or equal to 6 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that have a smaller thickness than that of the slot electrode 55. However, the patch electrode 15 preferably has a low resistance in order to avoid loss resulting from the oscillation of free electrons near the slot 57 of the slot electrode 55 changing to heat when inducing oscillation of free electrons in the patch electrode 15. From the viewpoint of manufacturability, an Al layer is preferably used rather than a Cu layer, and the thickness of the Al layer is preferably from 0.3 μm to 2 μm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to λ/4 and/or less than or equal to λ/5, the arrangement pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the arrangement of the antenna units U may be different from the arrangement of the pixels in the LCD panel. Herein, although an example is illustrated in which the antenna units U are arranged in concentric circles (for example, refer to JP 2002-217640 A), the embodiment is not limited thereto, and the antenna units may be arranged in a spiral shape as described in NPL 2, for example. Furthermore, the antenna units may be arranged in a matrix as described in PTL 4.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000 according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and $\tan\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and $\tan\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy $\Delta n$ with respect to visible light. Accordingly, it can be said that a material having a large refractive index anisotropy $\Delta n$ with respect to visible light is preferable as a liquid crystal material for an antenna unit for microwaves. The refractive index anisotropy $\Delta n$ of the liquid crystal material for LCDs is evaluated by the refractive index anisotropy for light having a wavelength of 550 nm. Here again, when a $\Delta n$ (birefringence index) is used as an index for light having a wavelength of 550 nm, a nematic liquid crystal having a $\Delta n$ of greater than or equal to 0.3, preferably greater than or equal to 0.4, can be used for an antenna unit for microwaves. $\Delta n$ has no particular upper limit. However, since liquid crystal materials having a large $\Delta n$ tend to have a strong polarity, there is a possibility that reliability may decrease. From the viewpoint of reliability, $\Delta n$ is preferably less than or equal to 0.4. The thickness of the liquid crystal layer is, for example, from 1 μm to 500 μm.

Hereinafter, the structure and manufacturing method of the scanning antenna according to the embodiments of the disclosure will be described in more detail.

First Embodiment

Figure 2A:
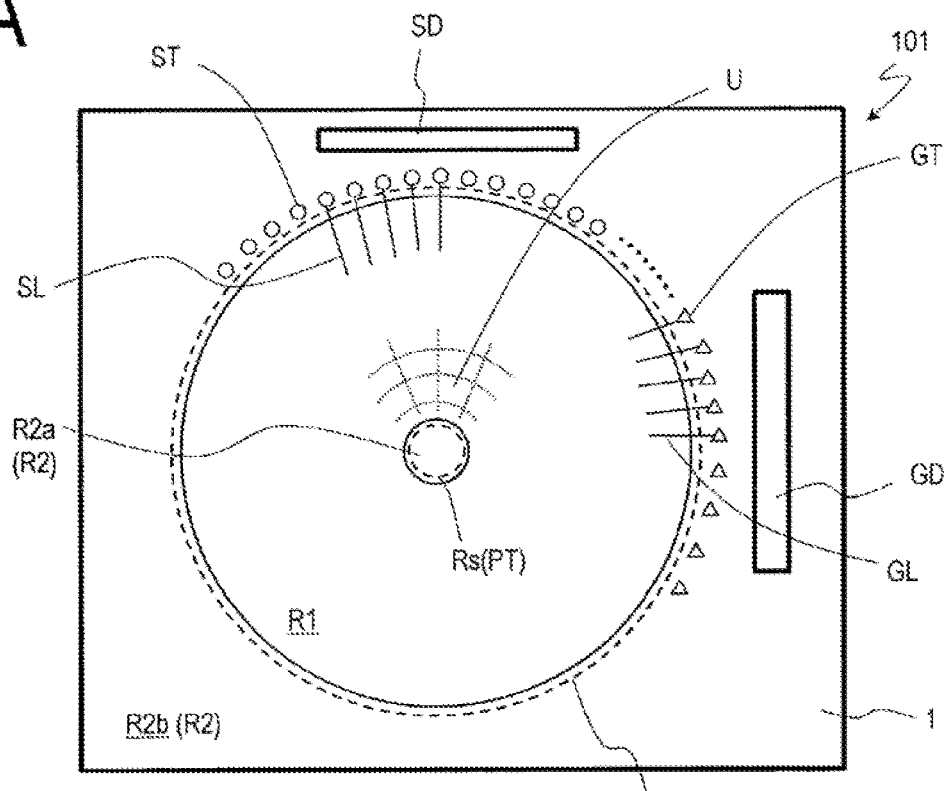
FIG. 2A and FIG. 2B are schematic plan views illustrating a TFT substrate 101 and a slot substrate 201 in the scanning antenna 1000, respectively.
Figure 2B:
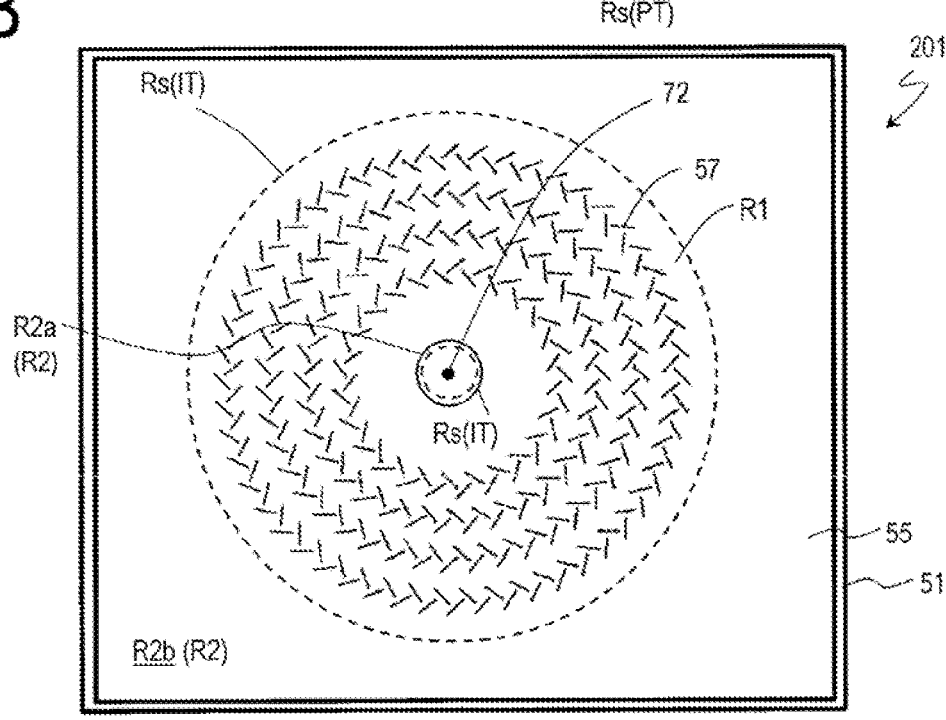

First, a description is given with reference to FIG. 1 and FIGS. 2A and 2B. FIG. 1 is a schematic partial cross-sectional view of the scanning antenna 1000 near the center thereof as described above, and FIG. 2A and FIG. 2B are schematic plan views illustrating the TFT substrate 101 and the slot substrate 201 in the scanning antenna 1000, respectively.

The scanning antenna 1000 includes a plurality of antenna units U arranged two-dimensionally. In the scanning antenna 1000 exemplified here, the plurality of antenna units are arranged concentrically. In the following description, the region of the TFT substrate 101 and the region of the slot substrate 201 corresponding to the antenna unit U will be referred to as "antenna unit region", and be denoted with the same reference numeral U as the antenna unit. In addition, as illustrated in FIG. 2A and FIG. 2B, in the TFT substrate 101 and the slot substrate 201, a region defined by the plurality of two-dimensionally arranged antenna unit regions is referred to as "transmission and/or reception region R1", and a region other than the transmission and/or reception region R1 is called a "non-transmission and/or reception region R2". A terminal section, a drive circuit, and the like are provided in the non-transmission and/or reception region R2.

FIG. 2A is a schematic plan view illustrating the TFT substrate 101 in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a data traffic volume or the like.

A plurality of gate bus lines GL and a plurality of source bus lines SL supported on the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, a drain electrode is electrically connected to the patch electrode.

In the non-transmission and/or reception region R2 (R2a, R2b), a seal region Rs is disposed surrounding the transmission and/or reception region R1. A sealing material (not illustrated) is applied to the seal region Rs. The sealing material bonds the TFT substrate 101 and the slot substrate 201 to each other, and also encloses liquid crystals between these substrates 101, 201.

A gate terminal section GT, the gate driver GD, a source terminal section ST, and the source driver SD are provided outside the sealing region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal section PT and the slot electrode 55 is referred to as a "transfer section". As illustrated in drawings, the transfer terminal section PT (transfer section) may be disposed in the seal region Rs. In this case, a resin containing conductive particles may be used as the sealing material. In this way, liquid crystals are sealed between the TFT substrate 101 and the slot substrate 201, and an electrical connection can be secured between the transfer terminal section PT and the slot electrode 55 of the slot substrate 201. In this example, although the transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal unit PT may be disposed outside the seal region Rs in the non-transmission and/or reception region R2.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slot 57 is formed corresponding to the antenna unit region U on the TFT substrate 101. For the plurality of slots 57 in the illustrated example, a pair of slots 57 extending in directions substantially orthogonal to each other are concentrically disposed so that a radial inline slot antenna is configured. Since the scanning antenna 1000 includes slots that are substantially orthogonal to each other, the scanning antenna 1000 can transmit and receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal section IT is disposed within the seal region Rs, and is electrically connected to the corresponding transfer terminal section PT by a sealing material containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

In the following, each component of the scanning antenna 1000 will be described in detail with reference to drawings.

Structure of TFT Substrate 101

Antenna Unit Region U

Figure 3A:
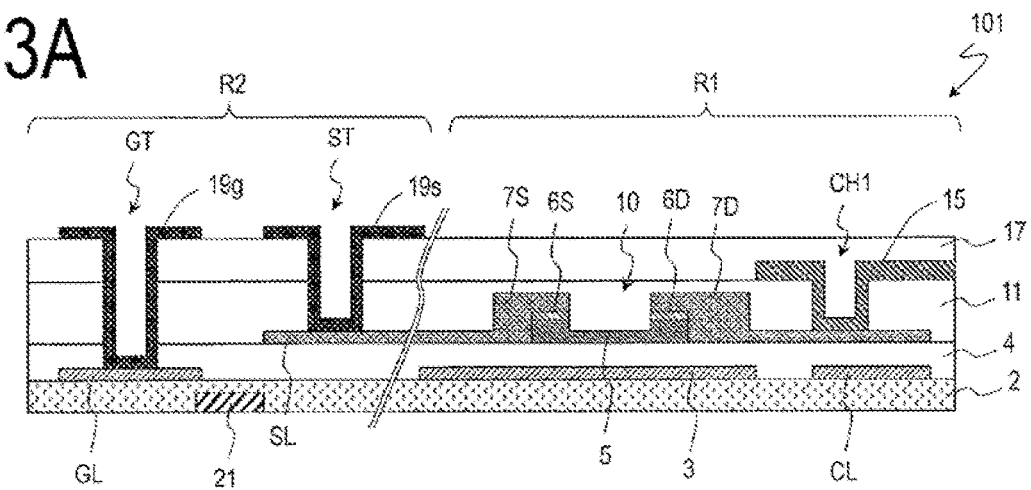
FIG. 3A and FIG. 3B are a cross-sectional view and a plane view schematically illustrating an antenna unit region U of the TFT substrate 101, respectively.
Figure 3B:
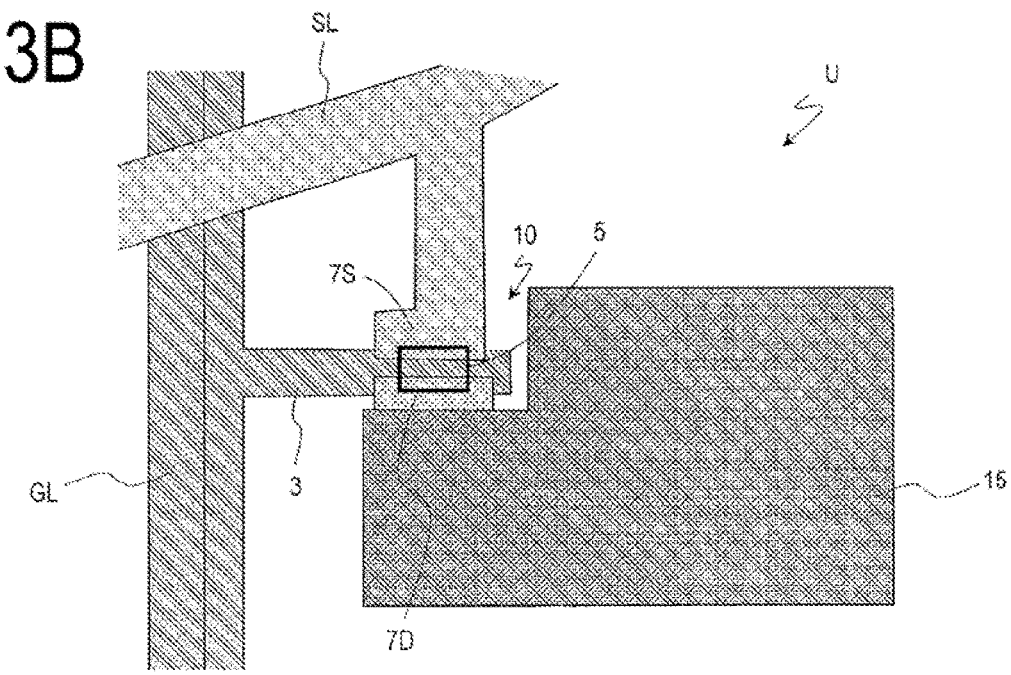

FIG. 3A and FIG. 3B are a cross-sectional view and a plane view schematically illustrating the antenna unit region U of the TFT substrate 101, respectively.

Each of the antenna unit regions U includes a dielectric substrate (not illustrated), a TFT 10 supported on the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near an intersection of the gate bus line GL and the source bus line SL.

The TFT 10 include a gate electrode 3, an island-shaped semiconductor layer 5, a gate insulating layer 4 disposed between the gate electrode 3 and the semiconductor layer 5, a source electrode 7S, and a drain electrode 7D. The structure of the TFT 10 is not particularly limited to a specific structure. In this example, the TFT 10 is a channel etch-type TFT having a bottom gate structure.

The gate electrode 3 is electrically connected to the gate bus line GL, and a scanning signal is supplied via the gate bus line GL. The source electrode 7S is electrically connected to the source bus line SL, and a data signal is supplied via the source bus line SL. The gate electrode 3 and the gate bus line GL may be formed of the same conductive film (gate conductive film). The source electrode 7S, the drain electrode 7D, and the source bus line SL may be formed from the same conductive film (source conductive film). The gate conductive film and the source conductive film are, for example, metal films. In the present specification, layers formed using a gate conductive film may be referred to as "gate metal layers", and layers formed using a source conductive film may be referred to as "source metal layers".

The semiconductor layer 5 is disposed overlapping with the gate electrode 3 with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be n$^+$ type amorphous silicon (n$^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes a contact hole CH1 that at least reaches the drain electrode 7D of the TFT 10.

The patch electrode 15 is provided on the first insulating layer 11 and within the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as that of the source electrode 7S and the drain electrode 7D. However, a thickness of the metal layer in the patch electrode 15 (a thickness of the patch electrode 15 when the patch electrode 15 is a metal electrode) is set to be greater than thicknesses of the source electrode 7S and the drain electrode 7D. The thickness of the metal layer in the patch electrode 15 in the case of being formed using an Al layer is set to, for example, greater than or equal to 0.3 µm.

A CS bus line CL may be provided using the same conductive film as that of the gate bus line GL. The CS bus line CL may be disposed overlapping with the drain electrode (or extended portion of the drain electrode) 7D with the gate insulating layer 4 interposed therebetween, and may constitute the auxiliary capacity CS having the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. The alignment mark 21 is used as follows. When manufacturing m TFT substrates from one glass substrate, in a case where the number of photomasks is n (where n<m), for example, it is necessary to perform each exposure process multiple times. In this way, when the number (n) of photomasks is less than the number (m) of TFT substrates 101 manufactured from one glass substrate 1, the alignment mark 21 can be used for alignment of the photomasks. The alignment marks 21 may be omitted.

In the present embodiment, the patch electrode 15 is formed on a layer different from the source metal layer. This provides the advantages described below.

Since the source metal layer is typically formed using a metal film, it is conceivable to form a patch electrode in the source metal layer. However, the patch electrode preferably has a resistance low as much as the electron oscillation is not inhibited, and is formed of, for example, an Al layer having a relatively thick thickness of 0.3 μm or more. From the viewpoint of antenna performance, the patch electrode is preferably thicker. However, although it depends on the TFT configuration, a patch electrode having a thickness of, for example, greater than 1 μm and formed in the source metal layer may cause a problem that desired patterning accuracy is not achieved. For example, a problem may arise that a gap between the source electrode and the drain electrode (corresponding to the channel length of the TFT) cannot be controlled with high accuracy. In contrast, in the present embodiment, since the patch electrode 15 is formed separately from the source metal layer, the thickness of the source metal layer and the thickness of the patch electrode 15 can be controlled independently. This allows the controllability for forming the source metal layer to be secured and a patch electrode 15 having a desired thickness to be formed.

In the present embodiment, the thickness of the patch electrode 15 can be set with a high degree of freedom separately from the thickness of the source metal layer. Note that since the size of the patch electrode 15 needs not be controlled as strictly as the source bus line SL or the like, it is acceptable for the line width shift (deviation from the design value) to be increased by thickening the patch electrode 15. A case that the thickness of the patch electrode 15 is equal to the thickness of the source metal layer is not excluded.

The patch electrode 15 may include a Cu layer or an Al layer as a main layer. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer.

Figure 4A:
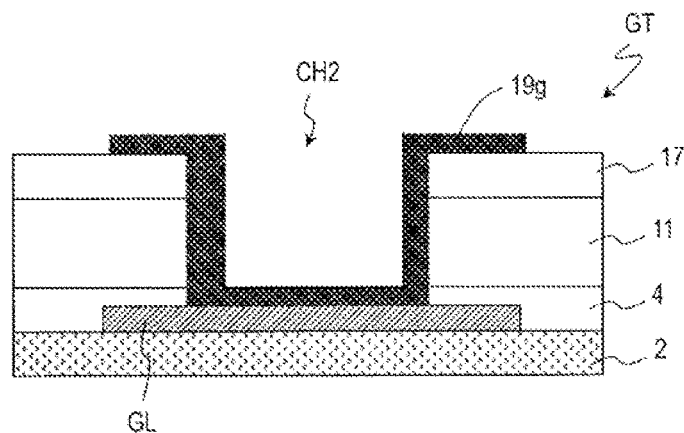
FIG. 4A to FIG. 4C are cross-sectional views schematically illustrating a gate terminal section GT, a source terminal section ST, and a transfer terminal section PT of the TFT substrate 101, respectively.
Figure 4B:
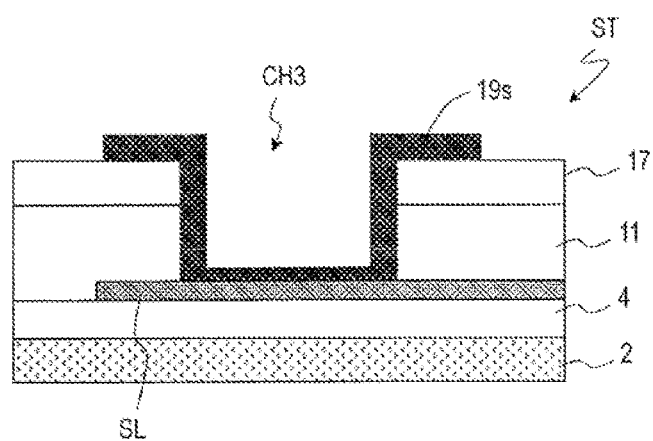
Figure 4C:
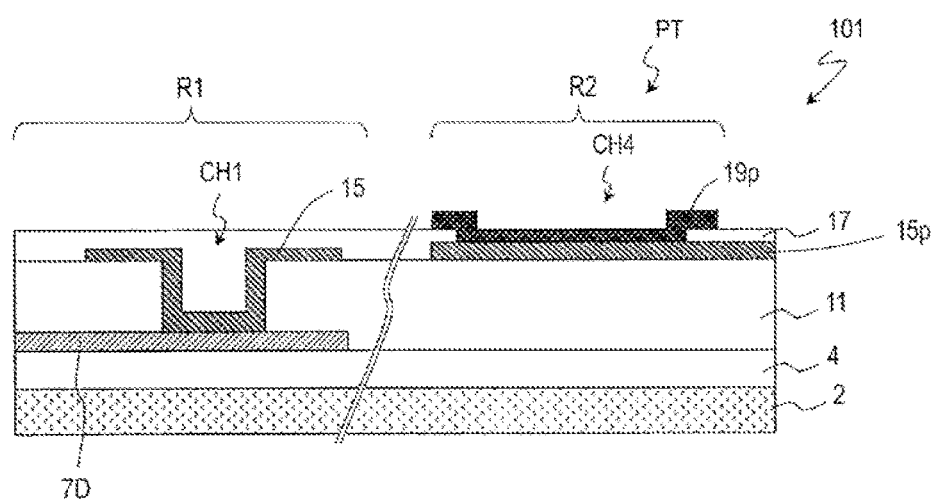

Gate Terminal Section GT, Source Terminal Section ST, and Transfer Terminal Section PT FIG. 4A to FIG. 4C are cross-sectional views schematically illustrating the gate terminal section GT, the source terminal section ST, and the transfer terminal section PT, respectively.

The gate terminal section GT includes the gate bus line GL formed on the dielectric substrate, an insulating layer covering the gate bus line GL, and a gate terminal upper connection section 19g. The gate terminal upper connection section 19g is in contact with the gate bus line GL within a contact hole CH2 formed in the insulating layer. In this example, the insulating layer covering the gate bus line GL includes the gate insulating layer 4, the first insulating layer 11 and the second insulating layer 17 in that order from the dielectric substrate side. The gate terminal upper connection section 19g is, for example, a transparent electrode formed of a transparent conductive film provided on the second insulating layer 17.

The source terminal section ST includes the source bus line SL formed on the dielectric substrate (here, on the gate insulating layer 4), an insulating layer covering the source bus line SL, and a source terminal upper connection section 19s. The source terminal upper connection section 19s is in contact with the source bus line SL within a contact hole CH3 formed in the insulating layer. In this example, the insulating layer covering the source bus line SL includes the first insulating layer 11 and the second insulating layer 17. The source terminal upper connection section 19s is, for example, a transparent electrode formed of a transparent conductive film provided on the second insulating layer 17.

The transfer terminal section PT include a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p within a contact hole CH4 formed in the second insulating layer 17. The patch connection section 15p is formed of the same conductive film as that of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p for the respective terminal sections are formed of the same transparent conductive film.

In the present embodiment, it is advantageous that the contact holes CH2, CH3, and CH4 of the respective terminal sections can be simultaneously formed by the etching process after the formation of the second insulating layer 17. The detailed manufacturing process thereof will be described later.

Manufacturing Method of TFT Substrate 101

Figure 5:
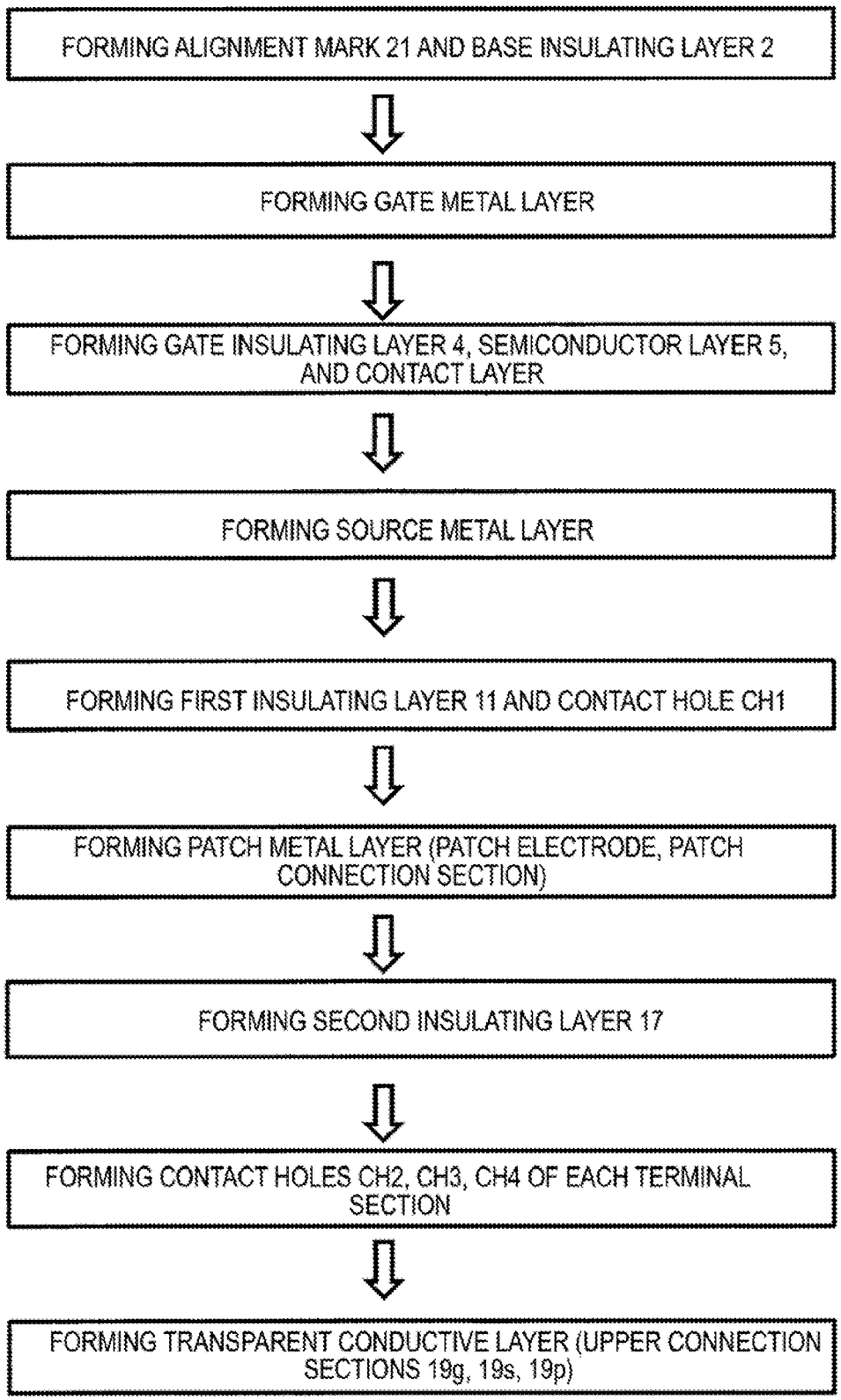
FIG. 5 is a diagram illustrating an example of a manufacturing process of the TFT substrate 101.

As an example, the TFT substrate 101 can be manufactured by the following method. FIG. 5 is a diagram exemplifying the manufacturing process of the TFT substrate 101.

First, a metal film (for example, a Ti film) is formed on a dielectric substrate and patterned to form the alignment mark 21. A glass substrate, a plastic substrate (resin substrate) having heat resistance, or the like can be used as the dielectric substrate, for example. Next, the base insulating film 2 is formed so as to cover the alignment marks 21. An $SiO_2$ film is used as the base insulating film 2.

Subsequently, a gate metal layer including the gate electrode 3 and the gate bus line GL is formed on the base insulating film 2.

The gate electrode 3 can be formed integrally with the gate bus line GL. Here, a not-illustrated gate conductive film (with a thickness of greater than or equal to 50 nm and less than or equal to 500 nm) is formed on the dielectric substrate by a sputtering method or the like. Next, the gate conductive film is patterned to obtain the gate electrode 3 and the gate bus line GL. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a gate conductive film, a layered film is formed by layering MoN (having a thickness of 50 nm, for example), Al (having a thickness of 200 nm, for example), and MoN (having a thickness of 50 nm, for example) in this order.

Next, the gate insulating layer 4 is formed so as to cover the gate metal layer. The gate insulating layer 4 can be formed by a CVD method or the like. As the gate insulating layer 4, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 4 may have a layered structure. Here, a SiNx layer (having a thickness of 410 nm, for example) is formed as the gate insulating layer 4.

Next, the semiconductor layer 5 and a contact layer are formed on the gate insulating layer 4. Here, an intrinsic amorphous silicon film (with a thickness of 125 nm, for example) and an n+ type amorphous silicon film (with a thickness of 65 nm, for example) are formed in this order and patterned to obtain an island-shaped semiconductor layer 5 and a contact layer. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (having a thickness of greater than or equal to 50 nm and less than or equal to 500 nm, for example) is formed on the gate insulating layer 4 and the contact layer, and patterned to form a source metal layer including the source electrode 7S, the drain electrode 7D, and the source bus line SL. At this time, the contact layer is also etched, and the source contact layer 6S and the drain contact layer 6D separated from each other are formed.

The material of the source conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a source conductive film, a layered film is formed by layering MoN (having a thickness of 30 nm, for example), Al (having a thickness of 200 nm, for example), and MoN (having a thickness of 50 nm, for example) in this order. Instead, as a source conductive film, a layered film may be formed by layering Ti (having a thickness of 30 nm, for example), MoN (having a thickness of 30 nm, for example), Al (having a thickness of 200 nm, for example), and MoN (having a thickness of 50 nm, for example) in this order.

Here, for example, a source conductive film is formed by a sputtering method and the source conductive film is patterned by wet etching (source/drain separation). Thereafter, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching).

Note that, when a layered film in which a Ti film and an Al film are layered in this order is used as a source conductive film, for example, after patterning the Al film by wet etching using, for example, an aqueous solution of phosphoric acid, acetic acid, and nitric acid, the Ti film and the contact layer (n+ type amorphous silicon layer) 6 may be simultaneously patterned by dry etching. Alternatively, it is also possible to collectively etch the source conductive film and the contact layer. However, in the case of simultaneously etching the source conductive film or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the formation of the source/drain separation and the gap portion formation, the etching amount of the gap portion can be more easily controlled.

Next, the first insulating layer 11 is formed so as to cover the TFT 10. In this example, the first insulating layer 11 is disposed so as to be in contact with the channel region of the semiconductor layer 5. In addition, the contact hole CH1 that at least reaches the drain electrode 7D is formed in the first insulating layer 11 by a known photolithographic method.

The first insulating layer 11 may be an inorganic insulating layer such as a silicon oxide ($SiO_2$) film, a silicon nitride (SiNx) film, a silicon oxynitride (SiOxNy; x>y) film, or a silicon nitride oxide (SiNxOy; x>y) film, for example. Here, as the first insulating layer 11, a SiNx layer having a thickness of 330 nm, for example, is formed by a CVD method.

Next, a patch conductive film is formed on the first insulating layer 11 and within the contact hole CH1, and this is subsequently patterned. In this way, the patch electrode 15 is formed in the transmission and/or reception region R1, and the patch connection section 15p is formed in the non-transmission and/or reception region R2. The patch electrode 15 is in contact with the drain electrode 7D within the contact hole CH1. Note that, in the present specification, the layer including the patch electrode 15 and the patch connection section 15p formed from the patch conductive film may be referred to as a "patch metal layer" in some cases.

The same material as that of the gate conductive film or the source conductive film can be used as the material of the patch conductive film. However, the patch conductive film is set to be thicker than the gate conductive film and the source conductive film. This reduces the sheet resistance of the patch electrode, and thus, the loss resulting from the oscillation of free electrons in the patch electrode changing to heat can be reduced. A suitable thickness of the patch conductive film is, for example, greater than or equal to 0.3 µm. In a case where the thickness of the patch conductive film becomes thinner than this, the sheet resistance becomes greater than or equal to 0.10 Ω/sq, and there is a possibility of the loss becoming larger. The thickness of the patch conductive film is, for example, less than or equal to 3 µm, and more preferably less than or equal to 2 µm. In a case where the thickness becomes thicker than this, the substrate may warp. A significant warp may cause a problem of transportation trouble, a chip in the substrate, a crack in the substrate, or the like in a mass-manufacturing process.

Here, as a patch conductive film, a layered film (MoN/Al/MoN) is formed by layering MoN (having a thickness of 50 nm, for example), Al (having a thickness of 1000 nm, for example), and MoN (having a thickness of 50 nm, for example) in this order. Instead, a layered film (MoN/Al/MoN/Ti) may be formed by layering Ti (having a thickness of 50 nm, for example), MoN (having a thickness of 50 nm, for example), Al (having a thickness of 2000 nm, for example), and MoN (having a thickness of 50 nm, for example) in this order. Alternatively, instead, a layered film (MoN/Al/MoN/Ti) may be formed by layering Ti (having a thickness of 50 nm, for example), MoN (having a thickness of 50 nm, for example), Al (having a thickness of 500 nm, for example), and MoN (having a thickness of 50 nm, for example) in this order. Alternatively, a layered film (Ti/Cu/Ti) in which a Ti film, a Cu film, and a Ti film are layered in this order, or a layered film (Cu/Ti) in which a Ti film and a Cu film are layered in this order may be used.

Next, the second insulating layer (having a thickness of greater than or equal to 100 nm and less than or equal to 300 nm) 17 is formed on the patch electrode 15 and the first insulating layer 11. The second insulating layer 17 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Here, as the second insulating layer 17, for example, a SiNx layer having a thickness of 200 nm is formed.

Thereafter, the inorganic insulating films (the second insulating layer 17, the first insulating layer 11, and the gate insulating layer 4) are etched collectively by dry etching using a fluorine-based gas, for example. During the etching, the patch electrode 15, the source bus line SL, and the gate bus line GL each function as an etch stop. In this way, the contact hole CH2 that at least reaches the gate bus line GL is formed in the second insulating layer 17, the first insulating layer 11, and the gate insulating layer 4, and the contact hole CH3 that at least reaches the source bus line SL is formed in the second insulating layer 17 and the first insulating layer 11. In addition, the contact hole CH4 that at least reaches the patch connection section 15$p$ is formed in the second insulating layer 17.

In this example, since the inorganic insulating films are etched collectively, side surfaces of the second insulating layer 17, first insulating layer 11, and gate insulating layer 4 are aligned on a side wall of the obtained contact hole CH2, and the side walls of the second insulating layer 17 and first insulating layer 11 are aligned on a side wall of the contact hole CH3. Note that, in the present embodiment, the expression that "the side surfaces of different two or more layers are aligned" within the contact hole does not only refer to when the side surfaces exposed in the contact hole in these layers are flush in the vertical direction, but also includes cases where inclined surfaces such as continuous tapered shapes are formed. Such a structure can be obtained, for example, by etching these layers using the same mask, or alternatively by using one of these layers as a mask to etch the other layer.

Next, a transparent conductive film (having a thickness of greater than or equal to 50 nm and less than or equal to 200 nm) is formed on the second insulating layer 17 and within the contact holes CH2, CH3, and CH4 by a sputtering method, for example. An indium tin oxide (ITO) film, an IZO film, a zinc oxide (ZnO) film or the like can be used as the transparent conductive film. Here, an ITO film having a thickness of, for example, 100 nm is used as the transparent conductive film.

Next, the transparent conductive film is patterned to form the gate terminal upper connection section 19$g$, the source terminal upper connection section 19$s$, and the transfer terminal upper connection section 19$p$. The gate terminal upper connection section 19$g$, the source terminal upper connection section 19$s$, and the transfer terminal upper connection section 19$p$ are used for protecting the electrodes or wiring lines exposed at each terminal section. In this way, the gate terminal section GT, the source terminal section ST, and the transfer terminal section PT are obtained.

Structure of Slot Substrate 201

Next, the structure of the slot substrate 201 will be described in greater detail.

Figure 6:
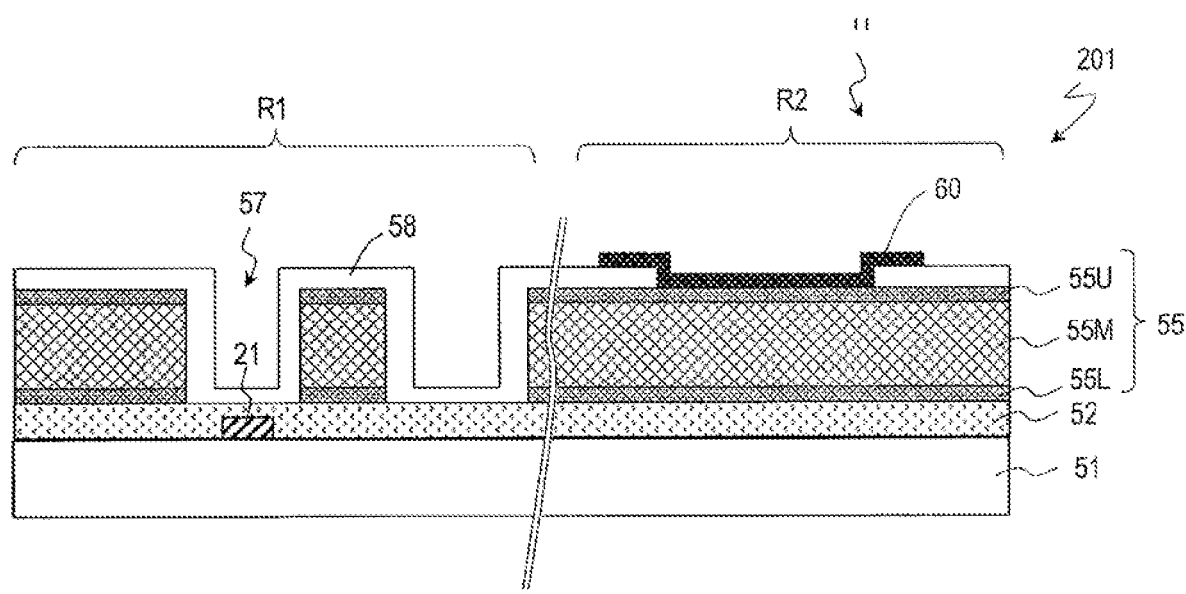
FIG. 6 is a cross-sectional view schematically illustrating an antenna unit region U and a terminal section IT in the slot substrate 201.

FIG. 6 is a cross-sectional view schematically illustrating the antenna unit region U and the terminal section IT in the slot substrate 201.

The slot substrate 201 includes the dielectric substrate 51 having a front surface and a rear surface, a third insulating layer 52 formed on the front surface of the dielectric substrate 51, the slot electrode 55 formed on the third insulating layer 52, and a fourth insulating layer 58 covering the slot electrode 55. A reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, so that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil as the Al layer on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. A thickness of the main layer 55M may be set in consideration of the skin effect depending on the material, and may be, for example, greater than or equal to 2 μm and less than or equal to 30 μm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

Transfer Section

Figure 7:
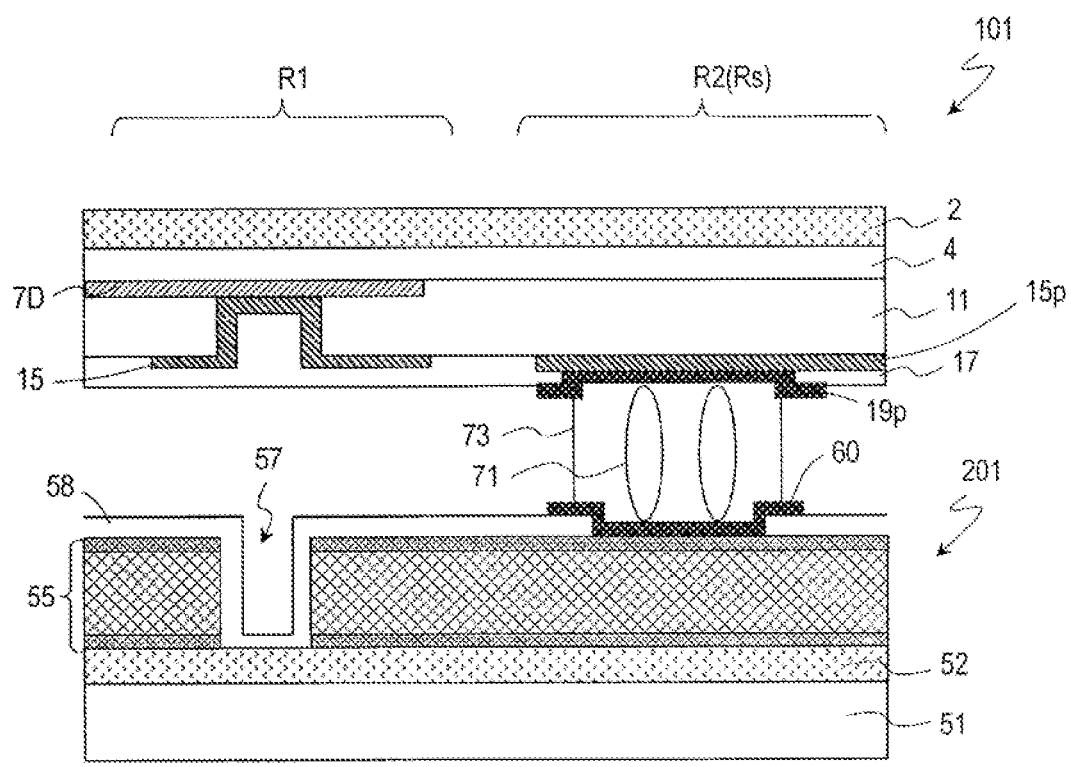
FIG. 7 is a schematic cross-sectional view for illustrating a transfer section in the TFT substrate 101 and the slot substrate 201.

FIG. 7 is a schematic cross-sectional view for illustrating the transfer section connecting the transfer terminal section PT of the TFT substrate 101 and the terminal section IT of the slot substrate 201. In FIG. 7, the same reference numerals are attached to the same components as those in FIG. 1 to FIG. 4C.

In the transfer section, the upper connection section 60 of the terminal section IT is electrically connected to the transfer terminal upper connection section 19$p$ of the transfer terminal section PT in the TFT substrate 101. In the present embodiment, the upper connection section 60 and the transfer terminal upper connection section 19$p$ are connected via a resin (sealing resin) 73 (also referred to as a sealing portion 73) including conductive beads (for example, Au beads) 71.

Each of the upper connection sections 60 and 19$p$ is a transparent conductive layer such as an ITO film or an IZO film, and the thickness of the transparent conductive layer is set so that its sheet resistance is less than 0.10 Ω/sq, for example. The transparent conductive layer has a thickness of 20 nm or greater and 250 nm or less, for example.

The transfer section may be disposed at both a center portion and a peripheral portion (that is, inside and outside of the donut-shaped transmission and/or reception region R1 when viewed from the normal direction of the scanning antenna 1000) of the scanning antenna 1000, or alternatively may be disposed at only one of them. The transfer section may be disposed in the seal region Rs in which the liquid crystals are sealed, or may be disposed outside the seal region Rs (opposite to the liquid crystal layer).

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant $\varepsilon_M$ and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 μm to 6 μm may be used. Here, a layered film obtained by layering a Ti film, a Cu film, and a Ti film in this order is used. Instead, a layered film may be formed by layering Ti (having a thickness of 50 nm, for example) and Cu (having a thickness of 5000 nm, for example) in this order.

Thereafter, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure of two or more layers. In cases where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In cases where the oxide semiconductor layer has a two-layer structure including an upper layer and a lower layer, an energy gap of the oxide semiconductor included in the upper layer is preferably greater than an energy gap of the oxide semiconductor included in the lower layer. However, when the different in the energy gap between these layers is relatively small, the energy gap of the lower layer oxide semiconductor may be larger than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The oxide semiconductor layer may include, for example, at least one metal element selected from In, Ga, and Zn. In the present embodiment, the oxide semiconductor layer includes, for example, an In—Ga—Zn—O based semiconductor (for example, indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. Such an oxide semiconductor layer can be formed from an oxide semiconductor film including an In—Ga—Zn—O based semiconductor. Note that channel etch type TFTs with an active layer including an oxide semiconductor, such as In—Ga—Zn—O based semiconductors, may be referred to as a "CE-OS-TFT" in some cases.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a drive circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3A and FIG. 3B, the TFT 10 is a channel etch type TFT having a bottom gate structure. The channel etch type TFT does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Second Embodiment

The scanning antenna of a second embodiment will be described with reference to drawings. The TFT substrate of the scanning antenna of the present embodiment differs from the TFT substrate 101 illustrated in FIG. 2A in that a transparent conductive layer that serves as an upper connection section for each terminal section is provided between the first insulating layer and the second insulating layer of the TFT substrate.

Figure 8A:
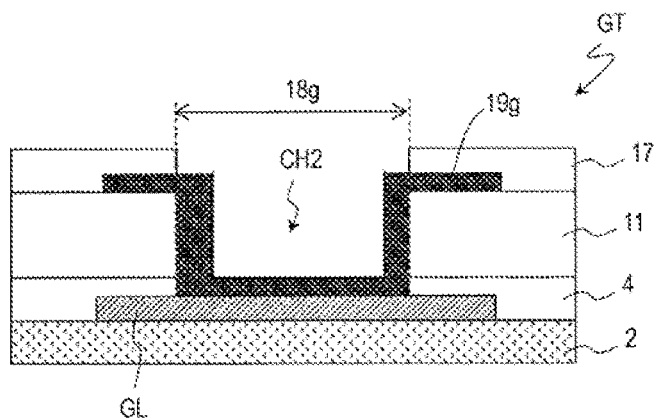
FIG. 8A to FIG. 8C are cross-sectional views illustrating a gate terminal section GT, a source terminal section ST, and a transfer terminal section PT of a TFT substrate 102, respectively, in a second embodiment.
Figure 8B:
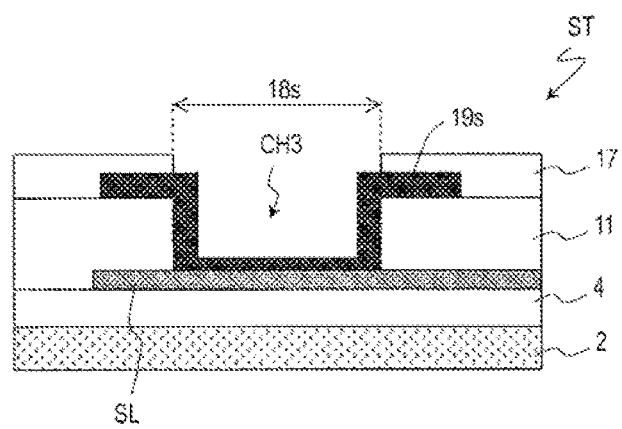
Figure 8C:
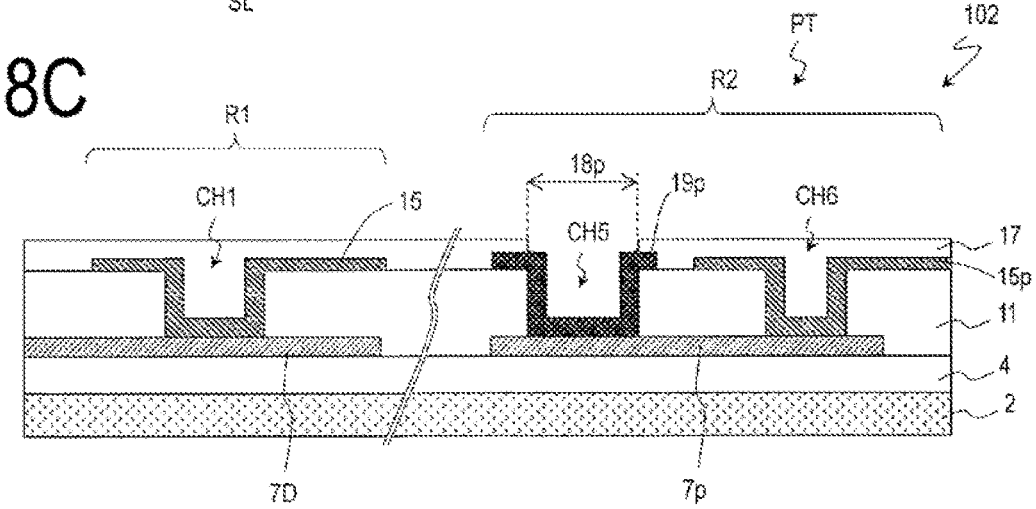

FIG. 8A to FIG. 8C are cross-sectional views illustrating the gate terminal section GT, the source terminal section ST, and the transfer terminal section PT, respectively, of a TFT substrate 102 in the present embodiment. Constituent elements similar to those in FIG. 4A to FIG. 4C are denoted by the same reference numerals, and the description thereof is omitted. Since the cross-sectional structure of the antenna unit region U is similar to that of the above-described embodiments (FIG. 3A and FIG. 3B), the illustration and description thereof will be omitted.

The gate terminal section GT in the present embodiment includes the gate bus line GL formed on a dielectric substrate, the insulating layer covering the gate bus line GL, and the gate terminal upper connection section 19g. The gate terminal upper connection section 19g is in contact with the gate bus line GL within the contact hole CH2 formed in the insulating layer. In this example, the insulating layer covering the gate bus line GL includes the gate insulating layer 4 and the first insulating layer 11. The second insulating layer 17 is formed on the gate terminal upper connection section 19g and the first insulating layer 11. The second insulating layer 17 includes an opening 18g exposing a part of the gate terminal upper connection section 19g. In this example, the opening 18g of the second insulating layer 17 may be disposed so as to expose the entire contact hole CH2.

The source terminal section ST includes the source bus line SL formed on the dielectric substrate (here, on the gate insulating layer 4), the insulating layer covering the source bus line SL, and the source terminal upper connection section 19s. The source terminal upper connection section 19s is in contact with the source bus line SL within the contact hole CH3 formed in the insulating layer. In this example, the insulating layer covering the source bus line SL includes only the first insulating layer 11. The second insulating layer 17 extends over the source terminal upper connection section 19s and the first insulating layer 11. The second insulating layer 17 includes an opening 18s exposing a part of the source terminal upper connection section 19s. The opening 18s of the second insulating layer 17 may be disposed so as to expose the entire contact hole CH3.

The transfer terminal section PT includes a source connection wiring line 7p formed from the same conductive film (source conductive film) as that of the source bus line SL, the first insulating layer 11 extending over the source connection wiring line 7p, the transfer terminal upper connection section 19p and the patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and within the contact hole CH5, and is in contact with the source connection wiring line 7p within the contact hole CH5. The patch connection section 15p is disposed on the first insulating layer 11 and within the contact hole CH6, and is in contact with the source connection wiring line 7p within the contact hole CH6. The transfer terminal upper connection section 19p is a transparent electrode formed of a transparent conductive film. The patch connection section 15p is formed of the same conductive film as that of the patch electrode 15. Note that the upper connection sections 19g, 19s, and 19p of the respective terminal sections may be formed of the same transparent conductive film.

The second insulating layer 17 extends over the transfer terminal upper connection section 19p, the patch connection section 15p, and the first insulating layer 11. The second insulating layer 17 includes an opening 18p exposing a part of the transfer terminal upper connection section 19p. In this example, the opening 18p of the second insulating layer 17 is disposed so as to expose the entire contact hole CH5. In contrast, the patch connection section 15p is covered with the second insulating layer 17.

In this way, in the present embodiment, the source connection wiring line 7p formed in the source metal layer electrically connects the transfer terminal upper connection section 19p of the transfer terminal section PT and the patch connection section 15p. Although not illustrated in drawings, similar to the above-described embodiment, the transfer terminal upper connection section 19p is connected to the slot electrode of the slot substrate 201 by a sealing resin containing conductive particles.

In the previously described embodiment, the contact holes CH1 to CH4 having different depths are collectively formed after the formation of the second insulating layer 17. For example, while the relatively thick insulating layers (the gate insulating layer 4, the first insulating layer 11 and the second insulating layer 17) are etched in the gate terminal section GT, only the second insulating layer 17 is etched in the transfer terminal section PT. Accordingly, there is a possibility that the conductive film (for example, a patch electrode conductive film) that serves as the base of the shallow contact holes is considerably damaged during etching.

In contrast, in the present embodiment, the contact holes CH1 to CH3, CH5, and CH6 are formed prior to formation of the second insulating layer 17. Since these contact holes are formed only in the first insulating layer 11 or in the layered film of the first insulating layer 11 and the gate insulating layer 4, the difference in depth of the collectively formed contact holes can be reduced more than in the previous embodiment. Accordingly, damage to the conductive film that serves as the base of the contact holes can be reduced. In particular, when an Al film is used for the patch electrode conductive film, since a favorable contact cannot be obtained in a case where the ITO film and the Al film are brought into direct contact with each other, a cap layer such as a MoN layer may be formed on the Al film in some cases. In these cases, there is the advantage that the thickness of the cap layer need not be increased to compensate for damage during etching.

Manufacturing Method of TFT Substrate 102

Figure 9:
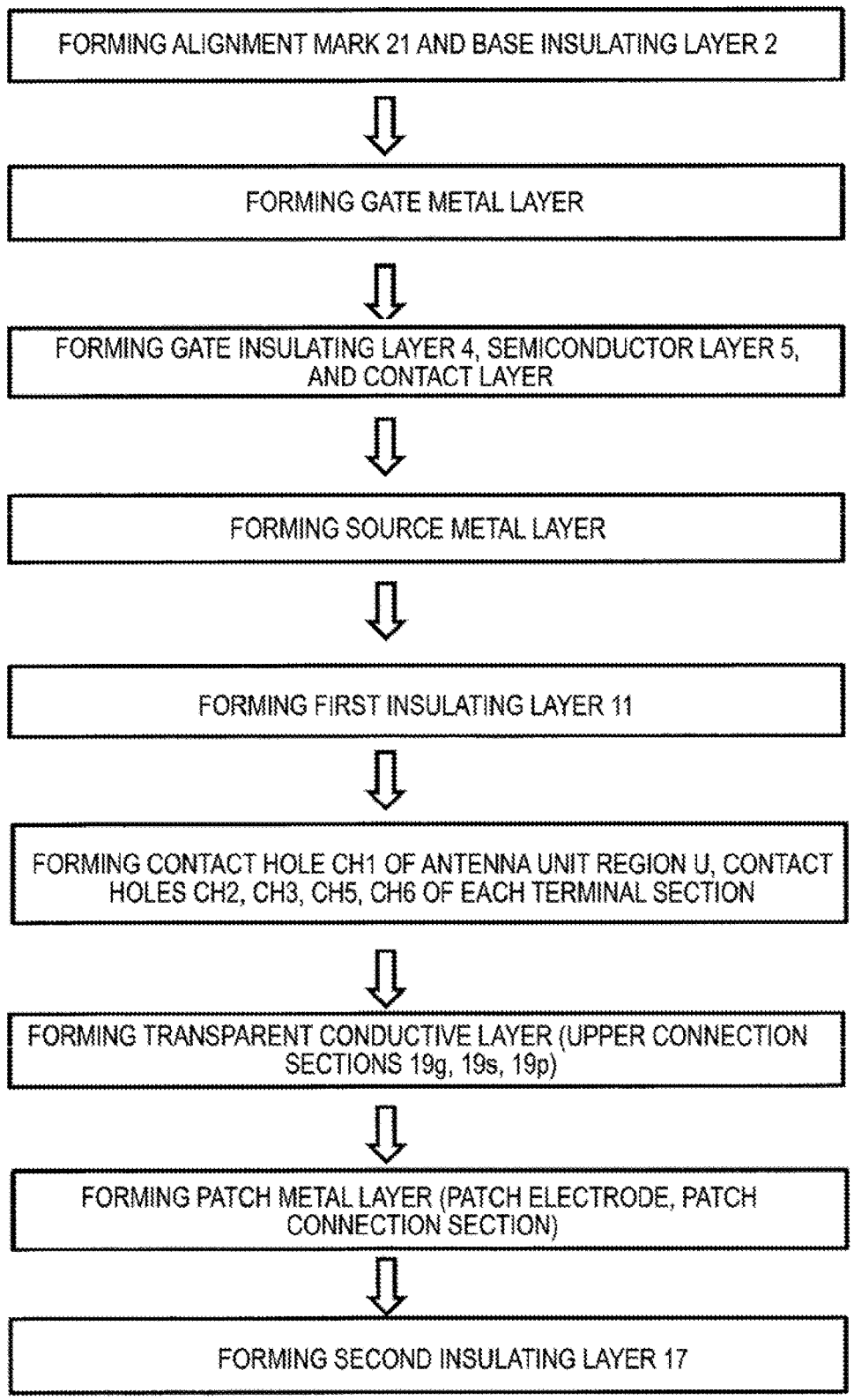
FIG. 9 is a diagram illustrating an example of a manufacturing process of the TFT substrate 102.

The TFT substrate 102 is manufactured by the following method, for example. FIG. 9 is a diagram illustrating an example of a manufacturing process of the TFT substrate 102. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT. In the step of forming the source metal layer, in addition to the source and drain electrodes and the source bus line, the source connection wiring line 7p is also formed from the source conductive film.

Next, the first insulating layer 11 is formed so as to cover the source metal layer. Subsequently, the first insulating layer 11 and the gate insulating layer 4 are collectively etched to form the contact holes CH1 to CH3, CH5, and CH6. During etching, each of the source bus line SL and the gate bus line GL functions as an etch stop. In this way, in the transmission and/or reception region R1, the contact hole CH1 that at least reaches the drain electrode of the TFT is formed in the first insulating layer 11. In addition, in the non-transmission and/or reception region R2, the contact hole CH2 that at least reaches the gate bus line GL is formed in the first insulating layer 11 and the gate insulating layer 4, and the contact hole CH3 that at least reaches the source bus line SL and contact holes CH5 and CH6 that at least reach the source connection wiring line 7p are formed in the first insulating layer 11. The contact hole CH5 may be disposed in the seal region Rs and the contact hole CH6 may be disposed outside the seal region Rs. Alternatively, both may be disposed outside the seal region Rs.

Next, a transparent conductive film is formed on the first insulating layer 11 and within the contact holes CH1 to CH3, CH5, and CH6, and patterned. In this way, the gate terminal upper connection section 19g in contact with the gate bus line GL within the contact hole CH2, the source terminal upper connection section 19s in contact with the source bus line SL within the contact hole CH3, and the transfer terminal upper connection section 19p in contact with the source connection wiring line 7p within the contact hole CH5 are formed.

Next, a patch electrode conductive film is formed on the first insulating layer 11, the gate terminal upper connection section 19g, the source terminal upper connection section 19s, the transfer terminal upper connection section 19p, and within the contact holes CH1 and CH6 and patterned. In this way, the patch electrode 15 in contact with the drain electrode 7D within the contact hole CH1 is formed in the transmission and/or reception region R1, and the patch connection section 15p in contact with the source connection wiring line 7p within the contact hole CH6 is formed in the non-transmission and/or reception region R2. Patterning of the patch electrode conductive film may be performed by wet etching. Here, an etchant capable of increasing the etching selection ratio between the transparent conductive film (ITO or the like) and the patch electrode conductive film (for example, an Al film) is used. In this way, when patterning the patch electrode conductive film, the transparent conductive film can function as an etch stop. Since the portions of the source bus line SL, the gate bus line GL, and the source connection wiring line 7p exposed by the contact holes CH2, CH3, and CH5 are covered with an etch stop (transparent conductive film), they are not etched.

Subsequently, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this manner, the TFT substrate 102 is obtained.

Third Embodiment

The scanning antenna of a third embodiment will be described with reference to drawings. The TFT substrate in the scanning antenna of the present embodiment differs from the TFT substrate 102 illustrated in FIGS. 8A to 8C in that the upper connection section made of a transparent conductive film is not provided in the transfer terminal section.

Figure 10A:
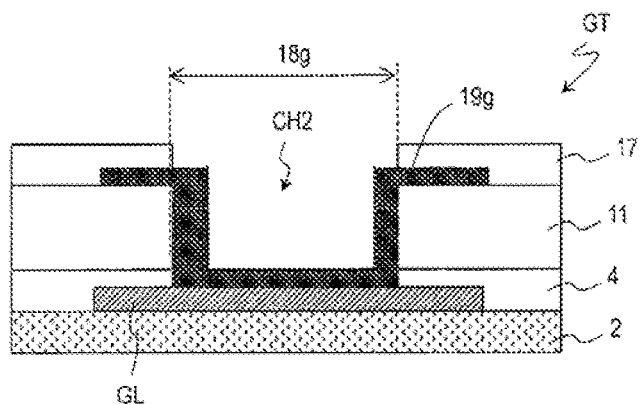
FIG. 10A to FIG. 10C are cross-sectional views illustrating a gate terminal section GT, a source terminal section ST, and a transfer terminal section PT of a TFT substrate 103, respectively, in a third embodiment.
Figure 10B:
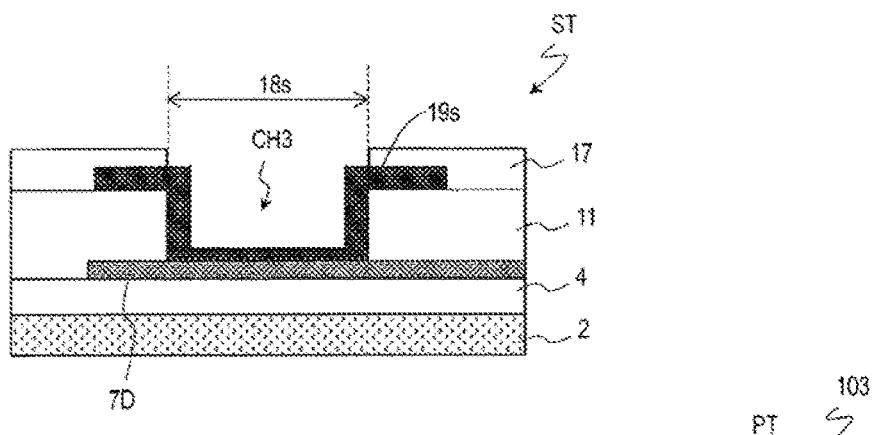
Figure 10C:
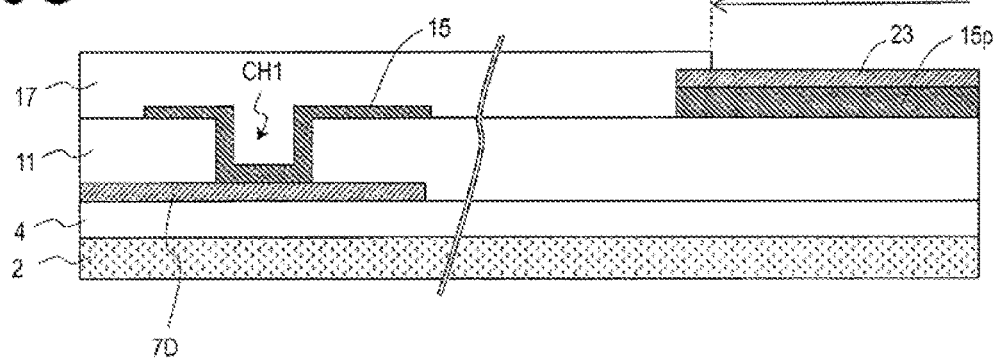

FIG. 10A to FIG. 10C are cross-sectional views illustrating the gate terminal section GT, the source terminal section ST, and the transfer terminal section PT, respectively, of a TFT substrate 103 in the present embodiment. Constituent elements similar to those in FIG. 8A to FIG. 8C are denoted by the same reference numerals. Since the structure of the antenna unit region U is similar to that of the above-described embodiments (FIG. 3A and FIG. 3B), the illustration and description thereof will be omitted.

The structures of the gate terminal section GT and the source terminal section ST are similar to the structures of the gate terminal section and the source terminal section of the TFT substrate 102 illustrated in FIG. 8A and FIG. 8B.

The transfer terminal section PT includes the patch connection section 15p formed on the first insulating layer 11 and a protective conductive layer 23 layered on the patch connection section 15p. The second insulating layer 17 extends over the protective conductive layer 23 and includes an opening 18p exposing a part of the protective conductive layer 23. In contrast, the patch electrode 15 is covered with the second insulating layer 17.

Manufacturing Method of TFT Substrate 103

Figure 11:
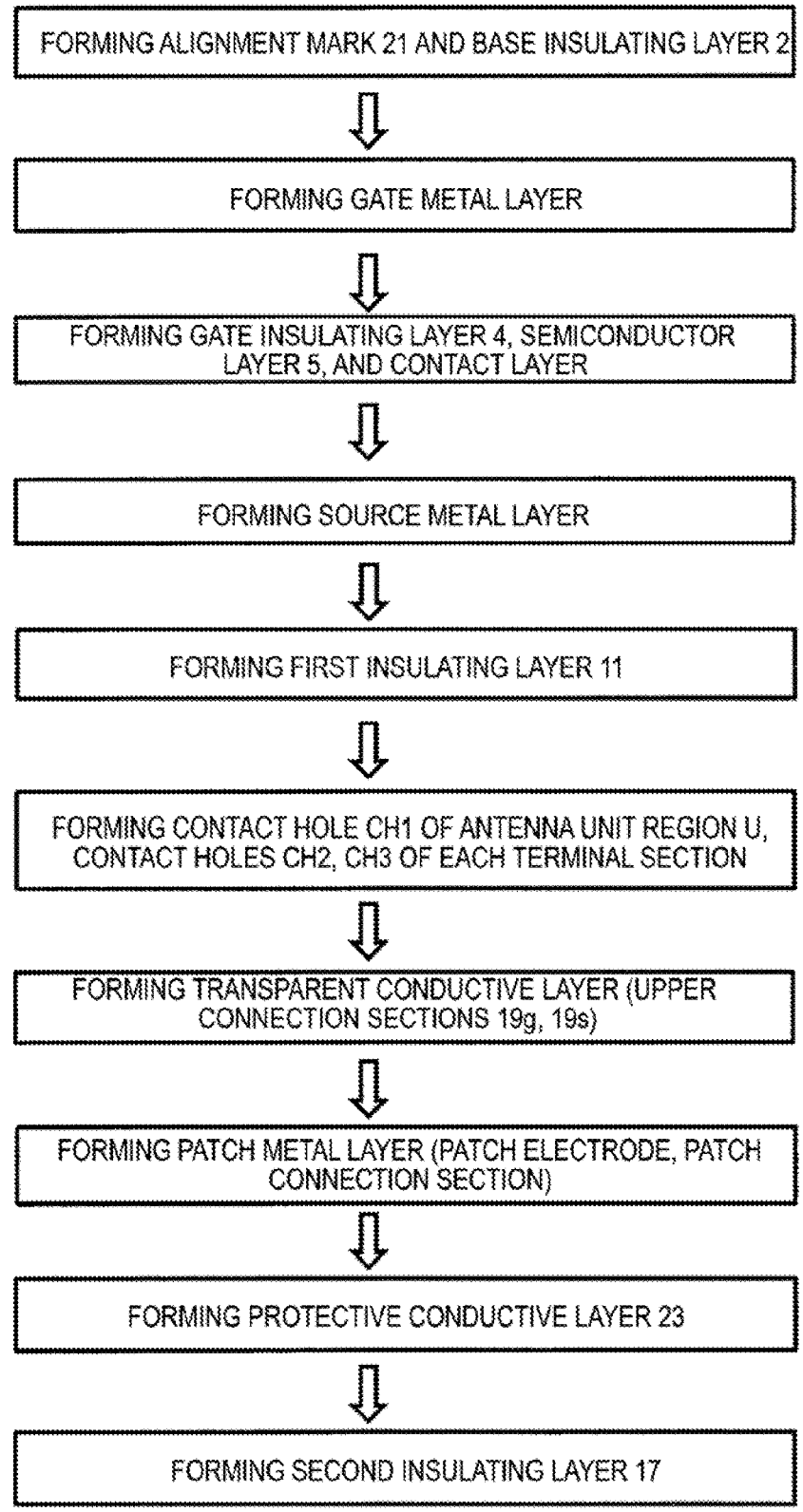
FIG. 11 is a diagram illustrating an example of a manufacturing process of the TFT substrate 103.

The TFT substrate 103 is manufactured by the following method, for example. FIG. 11 is a diagram illustrating an example of a manufacturing process of the TFT substrate 103. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT.

Next, the first insulating layer 11 is formed so as to cover the source metal layer. Subsequently, the first insulating layer 11 and the gate insulating layer 4 are collectively etched to form the contact holes CH1 to CH3. During etching, each of the source bus line SL and the gate bus line GL functions as an etch stop. In this way, the contact hole CH1 that at least reaches the drain electrode of the TFT is formed in the first insulating layer 11, the contact hole CH2 that at least reaches the gate bus line GL is formed in the first insulating layer 11 and the gate insulating layer 4, and the contact hole CH3 that at least reaches the source bus line SL is formed in the first insulating layer 11. No contact hole is formed in the region where the transfer terminal section is formed.

Next, a transparent conductive film is formed on the first insulating layer 11 and within the contact holes CH1, CH2, and CH3, and patterned. In this way, the gate terminal upper connection section 19g in contact with the gate bus line GL within the contact hole CH2 and the source terminal upper connection section 19s in contact with the source bus line SL within the contact hole CH3 are formed. In the region where the transfer terminal section is formed, the transparent conductive film is removed.

Next, a patch electrode conductive film is formed on the first insulating layer 11, on the gate terminal upper connection section 19g and the source terminal upper connection section 19s, and within the contact hole CH1, and patterned. In this way, the patch electrode 15 in contact with the drain electrode 7D within the contact hole CH1 is formed in the transmission and/or reception region R1, and the patch connection section 15p is formed in the non-transmission and/or reception region R2. Similar to the previous embodiments, an etchant capable of ensuring an etching selection ratio between the transparent conductive film (ITO or the like) and the patch electrode conductive film is used for patterning the patch electrode conductive film.

Subsequently, the protective conductive layer 23 is formed on the patch connection section 15p. A Ti layer, an ITO layer, and an indium zinc oxide (IZO) layer (having a thickness of greater than or equal to 50 nm and less than or equal to 100 nm, for example), or the like can be used as the protective conductive layer 23. Here, a Ti layer (having a thickness of 50 nm, for example) is used as the protective conductive layer 23. Note that the protective conductive layer may be formed on the patch electrode 15.

Next, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the protective conductive layer 23 are provided in the second insulating layer 17. In this manner, the TFT substrate 103 is obtained.

Structure of Slot Substrate 203

Figure 12:
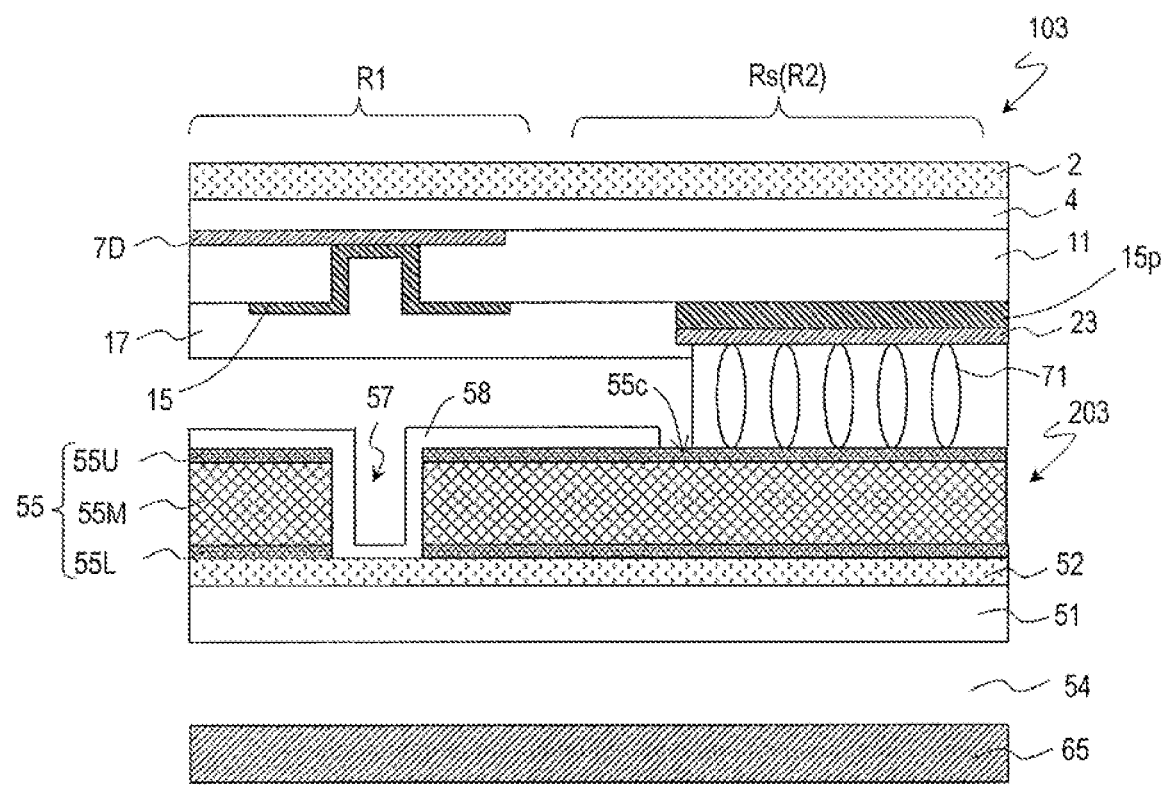
FIG. 12 is a schematic cross-sectional view for illustrating a transfer section in the TFT substrate 103 and a slot substrate 203.

FIG. 12 is a schematic cross-sectional view for illustrating a transfer section that connects the transfer terminal section PT of the TFT substrate 103 and a terminal section IT of a slot substrate 203 in the present embodiment. In FIG. 12, the same reference numerals are attached to the same constituent elements as those in the embodiments described above.

First, the slot substrate 203 in this embodiment will be described. The slot substrate 203 includes the dielectric substrate 51, the third insulating layer 52 formed on the front surface of the dielectric substrate 51, the slot electrode 55 formed on the third insulating layer 52, and the fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

The slot electrode 55 has a layered structure in which a Cu layer or an Al layer is the main layer 55M. In the transmission and/or reception region R1, a plurality of slots 57 are formed in the slot electrode 55. The structure of the slot electrode 55 in the transmission and/or reception region R1 is the same as the structure of the slot substrate 201 described above with reference to FIG. 6.

The terminal section IT is provided in the non-transmission and/or reception region R2. The terminal section IT includes an opening exposing the front surface of the slot electrode 55 provided in the fourth insulating layer 58. The exposed area of the slot electrode 55 serves as a contact surface 55c. As described above, in the present embodiment, the contact surface 55c of the slot electrode 55 is not covered with the fourth insulating layer 58.

In the transfer section, the protective conductive layer 23 covering the patch connection section 15p of the TFT substrate 103 and the contact surface 55c of the slot electrode 55 of the slot substrate 203 are connected with a resin (sealing resin) containing the conductive beads 71 therebetween.

As in the above-described embodiments, the transfer section in the present embodiment may be disposed at both the central portion and the peripheral portion of the scanning antenna, or may be disposed in only one of them. In addition, the transfer section may be disposed within the seal region Rs or may be disposed outside the seal region Rs (opposite to the liquid crystal layer).

In the present embodiment, no transparent conductive film is provided on the transfer terminal PT and the contact surface of the terminal section IT. Accordingly, the protective conductive layer 23 and the slot electrode 55 of the slot substrate 203 can be connected with a sealing resin containing conductive particles therebetween.

Furthermore, in the present embodiment, since the difference in the depth of the collectively formed contact holes is small in comparison with the first embodiment (FIG. 3A to FIG. 4C), the damage to the conductive film that serves as the base of the contact holes can be reduced.

Manufacturing Method of Slot Substrate 203

The slot substrate 203 is manufactured as follows. Since the material, the thickness, and the formation method of each layer are the same as those of the slot substrate 201, the description thereof is omitted.

First, the third insulating layer 52 and the slot electrode 55 are formed on the dielectric substrate in the same manner as the slot substrate 201, and a plurality of slots 57 are formed in the slot electrode 55. Next, the fourth insulating layer 58 is formed on the slot electrode 55 and within the slot. Subsequently, the opening 18p is formed in the fourth insulating layer 58 so as to expose a region that will become the contact surface of the slot electrode 55. In this way, the slot substrate 203 is manufactured.

Internal Heater Structure

As described above, it is preferable that the dielectric anisotropy $\Delta\varepsilon_M$ of the liquid crystal material used for the antenna unit of the antenna be large. However, the viscosity of liquid crystal materials (nematic liquid crystals) having large dielectric anisotropies $\Delta\varepsilon_M$ is high, and the slow response speed may lead to problems. In particular, as the temperature decreases, the viscosity increases. The environmental temperature of a scanning antenna mounted on a moving body (for example, a ship, an aircraft, or an automobile) fluctuates. Accordingly, it is preferable that the temperature of the liquid crystal material can be adjusted to a certain extent, for example 30° C. or higher, or 45° C. or higher. The set temperature is preferably set such that the viscosity of the nematic liquid crystal material is about 10 cP (centipoise) or less.

In addition to the above structure, the scanning antenna according to the embodiments of the disclosure preferably has an internal heater structure. A resistance heating type heater that uses Joule heat is preferable as the internal heater. The material of the resistance film for the heater is not particularly limited to a specific material, but a conductive material having relatively high specific resistance such as ITO or IZO can he utilized, for example. In addition, to adjust the resistance value, a resistive film may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

For example, to set the heat generation temperature of the resistive film to 30° C. for an area (roughly 90000 mm$^2$) of a circle having a diameter of 340 mm with 100 V AC (60 Hz), the resistance value of the resistive film should be set to 139Ω, the current should be set to 0.7 A, and the power density should be set to 800 W/m$^2$. To set the heat generation temperature of the resistive film to 45° C. for the same area with 100 V AC (60 Hz), the resistance value of the resistive film should be set to 82Ω, the current should be set to 1.2 A, and the power density should be set to 1350 W/m$^2$.

Figure 13A:
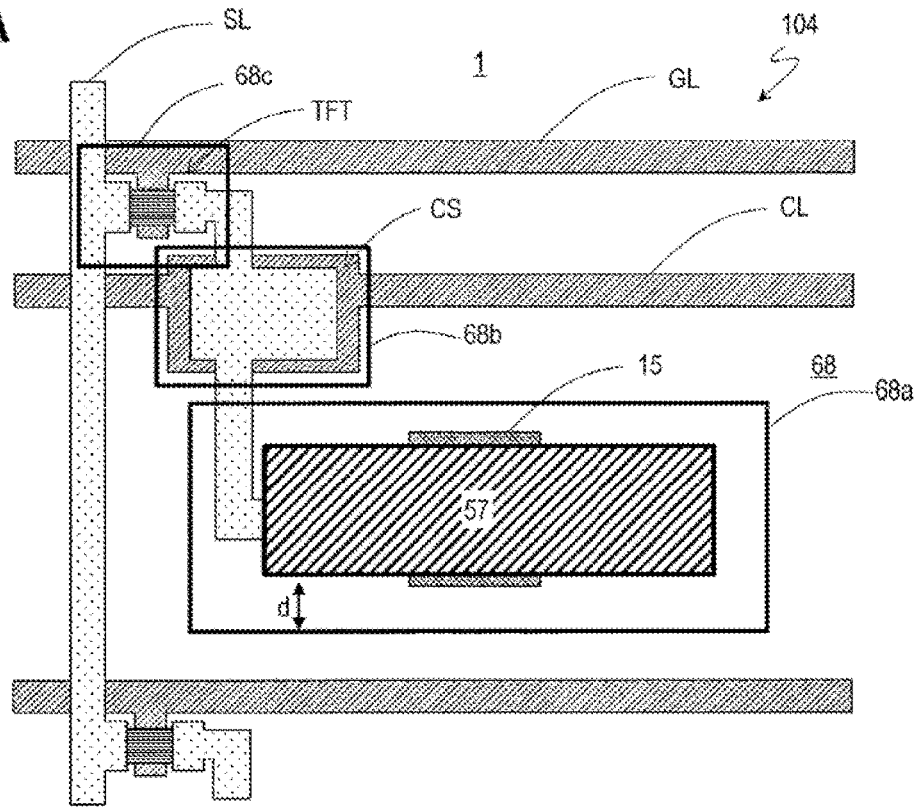
FIG. 13A is a schematic plan view of a TFT substrate 104 including a heater resistive film 68.

The resistive film for the heater may be provided anywhere as long as it does not affect the operation of the scanning antenna, but to efficiently heat the liquid crystal material, the resistive film is preferably provided near the liquid crystal layer. For example, as illustrated in a TFT substrate 104 illustrated in FIG. 13A, a resistive film 68 may be formed on almost the entire surface of the dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have a sufficient dielectric strength.

The resistive film 68 preferably has openings 68a, 68b, and 68c. When the TFT substrate 104 and the slot substrate are bonded to each other, the slots 57 are positioned to oppose the patch electrodes 15. At this time, the opening 68a is disposed such that the resistive film 68 is not present within an area having a distance d from an edge of the slot 57. The distance d is 0.5 mm, for example. In addition, it is also preferable to dispose the opening 68b under the auxiliary capacitance CS and to dispose the opening 68c under the TFT.

Figure 13B:
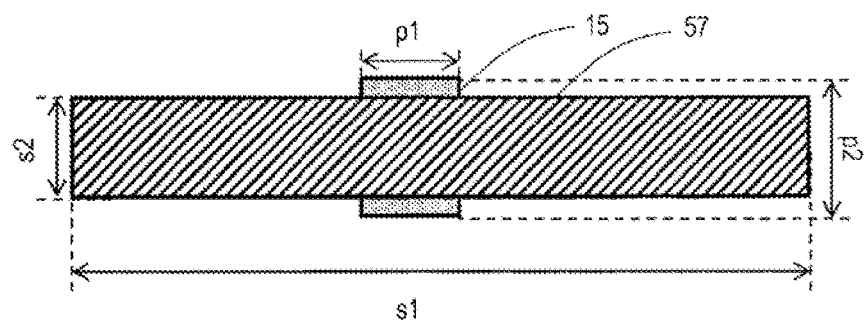
FIG. 13B is a schematic plan view for illustrating sizes of a slot 57 and a patch electrode 15.

Note that the size of the antenna unit U is, for example, 4 mm×4 mm. In addition, as illustrated in FIG. 13B, a width s2 of the slot 57 is 0.5 mm, a length s1 of the slot 57 is 3.3 mm, a width p2 of the patch electrode 15 in a width direction of the slot 57 is 0.7 mm, and a width p1 of the patch electrode 15 in a length direction of the slot 57 is 0.5 mm. Note that the size, shape, arrangement relationships, and the like of the antenna unit U, the slot 57, and the patch electrode 15 are not limited to the examples illustrated in FIG. 13A and FIG. 13B.

To further reduce the influence of the electric field from the heater resistive film 68, a shield conductive layer may be formed. The shield conductive layer is formed, for example, on the base insulating film 2 over almost the entire surface of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential.

In addition, the resistive film preferably has a distribution of the resistance value so that the liquid crystal layer can be uniformly heated. A temperature distribution of the liquid crystal layer is preferably such that a difference between a maximum temperature and a minimum temperature (temperature fluctuation) is, for example, less than or equal to 15° C. When the temperature fluctuation exceeds 15° C., there are cases that phase difference modulation varies within the plane, and good quality beam formation cannot be achieved. Furthermore, when the temperature of the liquid crystal layer approaches the Tni point (for example, 125° C.), $\Delta\varepsilon_M$ becomes small, which is not preferable.

With reference to FIG. 14A, FIG. 14B, and FIG. 15A to FIG. 15C, the distribution of the resistance value in the resistive film will be described. FIG. 14A, FIG. 14B, and FIG. 15A to FIG. 15C illustrate schematic structures of resistance heating structures 80a to 80e and a current distribution. The resistance heating structure includes a resistive film and a heater terminal.

Figure 14A:
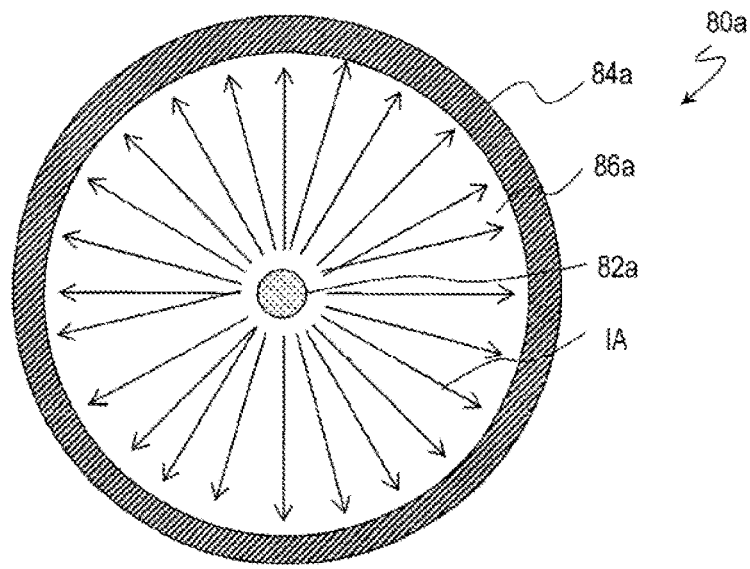
FIG. 14A and FIG. 14B are diagrams illustrating a schematic structure and current distribution of resistance heating structures 80a and 80b, respectively.

The resistance heating structure 80a illustrated in FIG. 14A includes a first terminal 82a, a second terminal 84a, and a resistive film 86a connected thereto. The first terminal 82a is disposed at the center of the circle, and the second terminal 84a is disposed along the entire circumference. Here, the circle corresponds to the transmission and/or reception region R1. When a DC voltage is applied between the first terminal 82a and the second terminal 84a, for example, a current IA flows radially from the first terminal 82a to the second terminal 84a. Accordingly, even though an in-plane resistance value is constant, the resistive film 86a can uniformly generate heat. Of course, the direction of a current flow may be a direction from the second terminal 84a to the first terminal 82a.

Figure 14B:
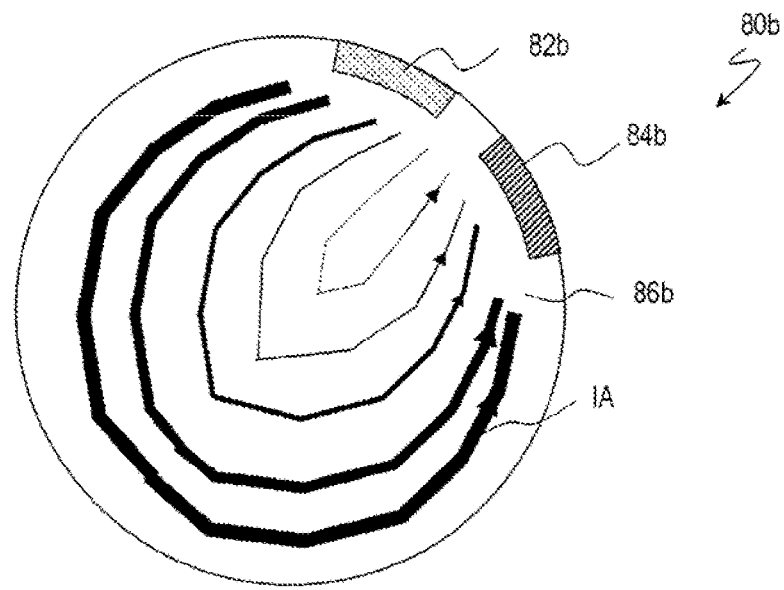

The resistance heating structure 80b illustrated in FIG. 14B includes a first terminal 82b, a second terminal 84b, and a resistive film 86b connected thereto. The first terminal 82b and the second terminal 84b are disposed adjacent to each other along the circumference. A resistance value of the resistive film 86b has an in-plane distribution such that an amount of heat generated per unit area by the current IA flowing between the first terminal 82b and the second terminal 84b in the resistive film 86b is constant. In a case where the resistive film 86b is formed of a thin line, for example, the in-plane distribution of the resistance value of the resistive film 86 may be adjusted by the thickness of the thin line and the density of the thin line.

Figure 15A:
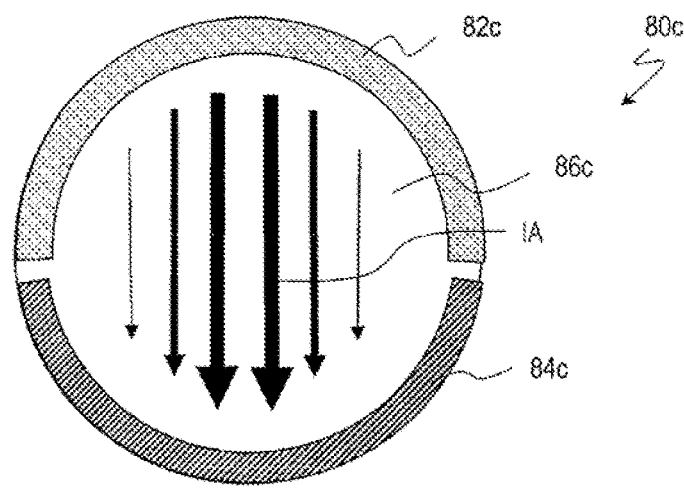
FIG. 15A to FIG. 15C are diagrams illustrating a schematic structure and current distribution of resistance heating structures 80c to 80e, respectively.

The resistance heating structure 80c illustrated in FIG. 15A includes a first terminal 82c, a second terminal 84c, and a resistive film 86c connected thereto. The first terminal 82c is disposed along the circumference of the upper half of the circle, and the second terminal 84c is disposed along the circumference of the lower half of the circle. When the resistive film 86c is constituted by thin lines extending vertically between the first terminal 82c and the second terminal 84c, for example, a thickness and a density of the thin lines near the center are adjusted such that the amount of heat generated per unit area by the current IA is constant in the plane.

Figure 15B:
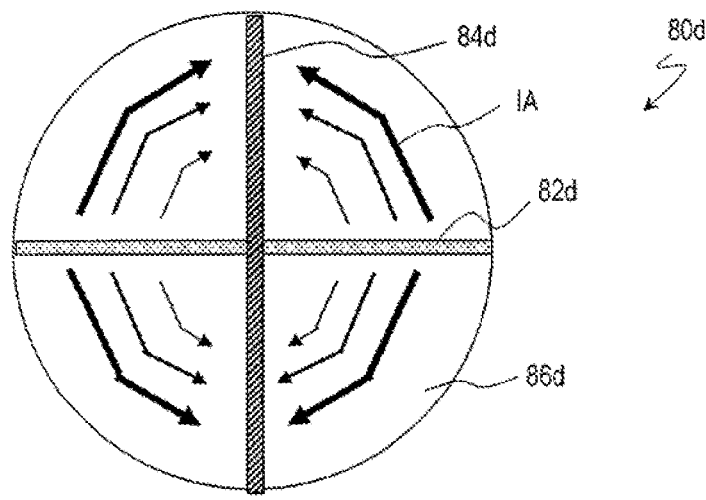

The resistance heating structure 80d illustrated in FIG. 15B includes a first terminal 82d, a second terminal 84d, and a resistive film 86d connected thereto. The first terminal 82d and the second terminal 84d are provided so as to extend in the vertical direction and the horizontal direction, respectively, along the diameter of the circle. Although simplified in drawings, the first terminal 82d and the second terminal 84d are electrically insulated from each other.

Figure 15C:
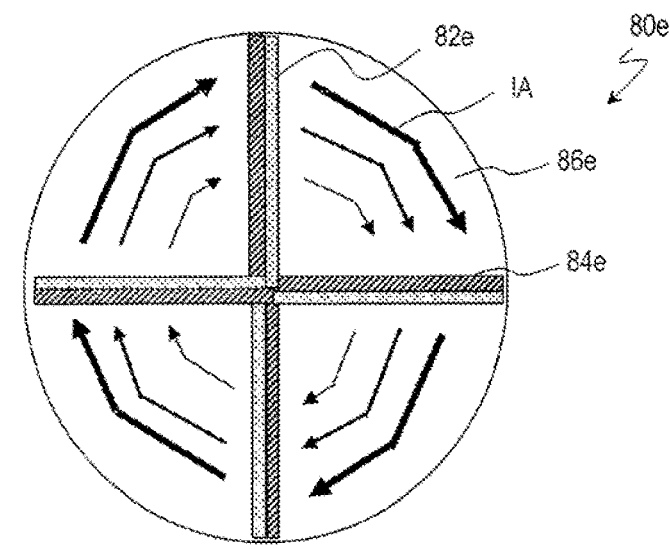

In addition, the resistance heating structure 80e illustrated in FIG. 15C includes a first terminal 82e, a second terminal 84e, and a resistive film 86e connected thereto. Unlike the resistance heating structure 80d, both the first terminal 82e and the second terminal 84e of the resistance heating structure 80e include four portions extending from the center of the circle in four directions upward, downward, left, and right. The portions of the first terminal 82e and the second terminal 84e that form a 90 degree angle with each other are disposed such that the current IA flows clockwise.

In both of the resistance heating structure 80d and the resistance heating structure 80e, the thin line closer to the circumference is adjusted to be thick and have a higher density, for example, so that the closer to the circumference the more the current IA increases and the amount of heat generated per unit area becomes uniform within the plane.

Such an internal heater structure may automatically operate, for example, when it is detected that the temperature of the scanning antenna has fallen below a preset temperature. Of course, it may also operate in response to the operation of a user.

External Heater Structure

Instead of the internal heater structure described above, or in addition to the internal heater structure, the scanning antenna according to the embodiments of the disclosure may include an external heater structure. A resistance heating type heater that uses Joule heat is preferable as the external heater although various known heaters can be used. Assume that a part generating heat in the heater is a heater section. In the following description, an example in which a resistive film is used as the heater section is described. In the following description also, the resistive film is denoted by the reference numeral 68.

Figure 16A:
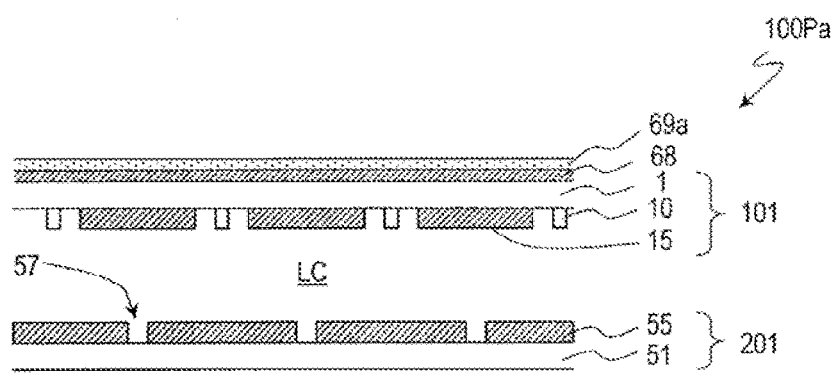
FIG. 16A is a schematic cross-sectional view of a liquid crystal panel 100Pa including the heater resistive film 68.
Figure 16B:
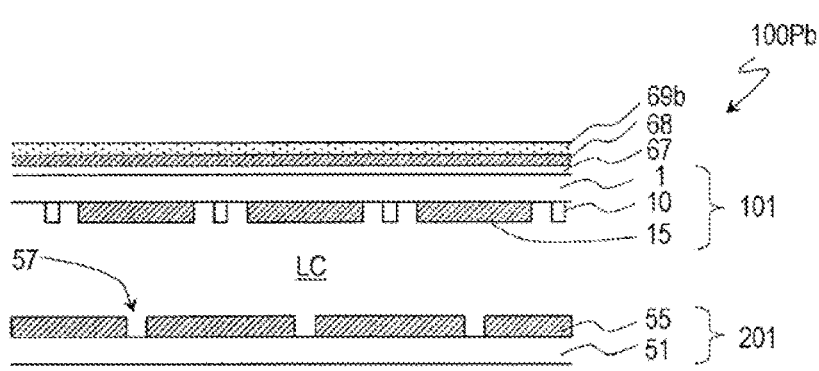
FIG. 16B is a schematic cross-sectional view of a liquid crystal panel 100Pb including the heater resistive film 68.

For example, the heater resistive film 68 is preferably disposed as in a liquid crystal panel 100Pa or 100Pb illustrated in FIGS. 16A and 16B. Here, the liquid crystal panels 100Pa and 100Pb include the TFT substrate 101, slot substrate 201, and liquid crystal layer LC provided therebetween in the scanning antenna 1000 illustrated in FIG. 1, and further includes a resistance heating structure including the resistive film 68 on an outer side of the TFT substrate 101. The resistive film 68 may be formed on a side of the dielectric substrate 1 of the TFT substrate 101 closer to the liquid crystal layer LC. However, such a configuration complicates a manufacturing process of the TFT substrate 101, and thus the resistive film 68 is preferably disposed on the outer side of the TFT substrate 101 (opposite to the liquid crystal layer LC).

The liquid crystal panel 100Pa illustrated in FIG. 16A includes the heater resistive film 68 formed on an outer surface of the dielectric substrate 1 of the TFT substrate 101 and a protective layer 69a covering the heater resistive film 68. The protective layer 69a may be omitted. The scanning antenna is housed in a case made of plastic, for example, and therefore, the resistive film 68 is not directly contacted by the user.

The resistive film 68 can be formed on the outer surface of the dielectric substrate 1 by use of, for example, a known thin film deposition technique (e.g., sputtering, CVD), a coating method, or a printing method. The resistive film 68 is patterned as needed. Patterning is performed through a photolithographic process, for example.

The material of the heater resistive film 68 is not particularly limited to a specific material as described above for the internal heater structure, but a conductive material having relatively high specific resistance such as ITO or IZO can be utilized, for example. In addition, to adjust the resistance value, the resistive film 68 may be formed with thin lines or meshes made of a metal (e.g., nichrome, titanium, chromium, platinum, nickel, aluminum, and copper). Thin lines or meshes made of ITO and IZO may be also used. The resistance value may be set according to the required calorific value.

The protective layer 69a is made of an insulating material and formed to cover the resistive film 68. The protective layer 69a may not be formed on a portion where the resistive film 68 is patterned and the dielectric substrate 1 is exposed. The resistive film 68 is patterned so as not to decrease the antenna performance as described later. In a case where a presence of the material forming the protective layer 69a causes the antenna performance to decrease, the patterned protective layer 69a is preferably used similar to the resistive film 68.

The protective layer 69a may be formed by any of a wet process and a dry process. For example, a liquid curable resin (or precursor of resin) or a solution is applied on the surface of the dielectric substrate 1 on which the resistive film 68 is formed, and thereafter, the curable resin is cured to form the protective layer 69a. The liquid resin or the resin solution is applied to the surface of the dielectric substrate 1 to have a predetermined thickness by various coating methods (e.g., using a slot coater, a spin coater, a spray) or various printing methods. After that, the resultant substrate is subjected to room temperature curing, thermal curing, or light curing depending on a kind of the resin to form the protective layer 69a which is an insulating resin film. The insulating resin film may be patterned by a photolithographic process, for example.

A curable resin material is preferably used as a material for forming the protective layer 69a. The curable resin material includes those of a thermal curing type resin material and a light curing type resin material. The thermal curing type includes a thermal cross-linking type and a thermal polymerization type.

Examples of the resin material of thermal cross-linking type include a combination of an epoxy-based compound (e.g., an epoxy resin) and amine-based compound, a combination of an epoxy-based compound and a hydrazide-based compound, a combination of an epoxy-based compound and an alcohol-based compound (e.g., including a phenol resin), a combination of an epoxy-based compound and a carboxylic acid-based compound (e.g., including an acid anhydride), a combination of an isocyanate-based compound and an amine-based compound, a combination of an isocyanate-based compound and a hydrazide-based compound, a combination of an isocyanate-based compound and an alcohol-based compound (e.g., including an urethane resin), and a combination of an isocyanate-based compound and a carboxylic acid-based compound. Examples of a cationic polymerization type adhesive include a combination of an epoxy-based compound and a cationic polymerization initiator (a representative cationic polymerization initiator: aromatic sulfonium salt). Examples of the resin material of radical polymerization type include a combination of a monomer and/or an oligomer containing a vinyl group of various acrylic, methacrylic, and urethane modified acrylic (methacrylic) resins and a radical polymerization initiator (a representative radical polymerization initiator: azo-based compound (e.g., azobisisobutyronitrile (AIBN))), and examples of the resin material of ring-opening polymerization type include an ethylene oxide-based compound, an ethyleneimine-based compound, and a siloxane-based compound. In addition, examples of the resin material may also include a maleimide resin, a combination of a maleimide resin and an amine, a combination of maleimide and a methacrylic compound, a bismaleimide-triazine resin, and a polyphenylene ether resin. Moreover, polyimide can be preferably used. Note that "polyimide" including polyamic acid that is a precursor of polyimide is used. Polyimide is used in combination with an epoxy-based compound or an isocyanate-based compound, for example.

In terms of a heat resistance, a chemical stability, and mechanical characteristics, the thermal curing type resin material is preferably used. Particularly, the resin material containing an epoxy resin or a polyimide resin is preferable, and in terms of the mechanical characteristics (in particular, a mechanical strength) and a hygroscopicity, the resin material containing a polyimide resin is preferable. A polyimide resin and an epoxy resin may be mixed to be used. A polyimide resin and/or an epoxy resin may be mixed with a thermoplastic resin and/or an elastomer. Furthermore, rubber-modified polyimide resin and/or epoxy resin may be mixed. A thermoplastic resin or an elastomer can be mixed to improve flexibility or toughness. Even when the rubber-modified resin is used, the same effect can be obtained.

A cross-linking reaction and/or a polymerization reaction of the light curing type material is caused by an ultraviolet light or a visible light, and the light curing type material cures. The light curing type includes a radical polymerization type and a cationic polymerization type, for example. Representative examples of the radical polymerization type material include a combination of an acrylic resin (epoxy modified acrylic resin, urethane modified acrylic resin, silicone modified acrylic resin) and a photopolymerization initiator. Examples of an ultraviolet radical polymerization initiator include an acetophenone type initiator and a benzophenone type initiator. Examples of a visible light radical polymerization initiator include a benzylic type initiator and a thioxanthone type initiator. Representative examples of a cationic polymerization type material include a combination of an epoxy-based compound and a photo cationic polymerization initiator. Examples of a photo cationic polymerization initiator include an iodonium salt-based compound. A resin material having both light curing and thermal curing characteristics can be used also.

The liquid crystal panel 100Pb illustrated in FIG. 16B is different from the liquid crystal panel 100Pa in that the liquid crystal panel 100Pb further includes an adhesive layer 67 between the resistive film 68 and the dielectric substrate 1. Moreover, the liquid crystal panel 100Pb is different from the liquid crystal panel 100Pa in that the protective layer 69b is formed using a polymer film or glass plate fabricated in advance.

For example, the liquid crystal panel 100Pb including the protective layer 69b formed of a polymer film is manufactured as below.

First, an insulating polymer film that will become the protective layer 69b is prepared. Examples of a polymer film include a polyester film made of polyethylene terephthalate, polyethylene naphthalate or the like, and a film made of super engineering plastic such as polyphenylene sulfone, polyimide, or polyamide. A thickness of the polymer film (that is, a thickness of the protective layer 69b) is greater than or equal to 5 μm and less than or equal to 200 μm, for example.

The resistive film 68 is formed on one surface of this polymer film. The resistive film 68 can be formed by the above method. The resistive film 68 may be patterned, and the polymer film may be also patterned as needed.

The polymer film on which the resistive film 68 is formed (that is, a member integrally formed of the protective layer 69b and the resistive film 68) is bonded to the dielectric substrate 1 with an adhesive. Examples of the adhesive include the same curable resin as the curable resin used to form the protective layer 69a described above. Furthermore, a hot-melt type resin material (adhesive) can be used. The hot-melt type resin material contains a thermoplastic resin as a main component, and melts by heating and solidifies by cooling. Examples of the hot-melt type resin material include polyolefin-based (e.g., polyethylene, polypropylene), polyamide-based, and ethylene vinyl acetate-based resins. A reactive urethane-based hot-melt resin material (adhesive) is also available. In terms of adhesive and durability, the reactive urethane-based resin is preferable.

The adhesive layer 67 may be patterned similar to the resistive film 68 and the protective layer (polymer film) 69b. However, the adhesive layer 67 needs only fix the resistive film 68 and the protective layer 69b to the dielectric substrate 1, and may be smaller than the resistive film 68 and the protective layer 69b.

In place of the polymer film, the glass plate may be also used to form the protective layer 69b. A manufacturing process may be the same as the case using the polymer film. A thickness of the glass plate is preferably less than or equal to 1 mm and further preferably less than or equal to 0.7 mm. A lower limit of the thickness of the glass plate is not specifically specified, but in terms of handling, the thickness of the glass plate is preferably greater than or equal to 0.3 mm.

In the liquid crystal panel 100Pb illustrated in FIG. 16B, the resistive film 68 formed on the protective layer (polymer film or glass plate) 69b is fixed to the dielectric substrate 1 via the adhesive layer 67, but the resistive film 68 needs only be disposed in contact with the dielectric substrate 1 and the resistive film 68 and the protective layer 69b are not necessarily fixed (bonded) to the dielectric substrate 1. In other words, the adhesive layer 67 may be omitted. For example, the polymer film on which the resistive film 68 is formed (that is, a member integrally formed of the protective layer 69b and the resistive film 68) may be disposed such that the resistive film 68 is brought into contact with the dielectric substrate 1 and is pressed against the dielectric substrate 1 with the case housing the scanning antenna. For example, since the thermal contact resistance possibly increases when the polymer film on which the resistive film 68 is formed is merely disposed only, the polymer film is preferably pressed against the dielectric substrate to decrease the thermal contact resistance. Using such a configuration allows the member integrally formed of the resistive film 68 and the protective layer (polymer film or glass plate) 69b to be detachable.

Note that in a case where the resistive film 68 (and the protective layer 69b) is patterned as described later, the resistive film 68 (and the protective layer 69b) is preferably fixed to the dielectric substrate 1 to a degree not to shift in a position with respect to the TFT substrate so that the antenna performance does not decrease.

The heater resistive film 68 may be provided anywhere as long as it does not affect the operation of the scanning antenna, but to efficiently heat the liquid crystal material, the resistive film is preferably provided near the liquid crystal layer. Therefore, the heater resistive film 68 is preferably provided on the outer side of the TFT substrate 101 as illustrated in FIGS. 16A and 16B. In addition, the resistive film 68 directly provided on the outer side of the dielectric substrate 1 of the TFT substrate 101 as illustrated in FIG. 16A is preferable, because an energy efficiency is higher, and controllability of the temperature is higher than those in a case in which the resistive film 68 is provided on the outer side of the dielectric substrate 1 with the adhesive layer 67 therebetween as illustrated in FIG. 16B.

For example, the resistive film 68 may be formed on almost the entire surface of the dielectric substrate 1 of the TFT substrate 104 illustrated in FIG. 13A. The resistive film 68 preferably includes the openings 68a, 68b, and 68c as described for the internal heater structure.

The protective layers 69a and 69b may be formed on the entire surface to cover the resistive film 68. As described above, in a case where the protective layer 69a or 69b has an adverse effect on antenna characteristics, openings corresponding to the openings 68a, 68b, and 68c of the resistive film 68 may be provided. In this case, the openings of the protective layer 69a or 69b are formed inside the openings 68a, 68b, and 68c of the resistive film 68.

To further reduce the influence of the electric field from the heater resistive film 68, a shield conductive layer may be formed. The shield conductive layer is formed on the side of the resistive film 68 closer to the dielectric substrate 1 with an insulating film therebetween, for example. The shield conductive layer is formed on almost the entire surface of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential. In addition, the resistive film preferably has a distribution of the resistance value so that the liquid crystal layer can be uniformly heated. These structures are similar to the structures of the internal heater structure described above.

The resistive film needs only heat the liquid crystal layer LC in the transmission and/or reception region R1, and may be provided on an area corresponding to the transmission and/or reception region R1 as an example described above. However, the structure of the resistive film is not limited to this structure. For example, as illustrated in FIG. 2A, in a case where the TFT substrate 101 has an outline capable of defining a rectangular area encompassing the transmission and/or reception region R1, the resistive film may be provided on an area corresponding to the rectangular area encompassing the transmission and/or reception region R1. Of course, the outline of the resistive film is not limited to a rectangle, and may be any shape encompassing the transmission and/or reception region R1.

In the above example, the resistive film is disposed on the outer side of the TFT substrate 101, but the resistive film may be disposed on an outer side of the slot substrate 201 (opposite to the liquid crystal layer LC). In this case also, the resistive film may be formed directly on the dielectric substrate 51 similar to the liquid crystal panel 100Pa in FIG. 16A, or the resistive film formed on the protective layer (polymer film or glass plate) with the adhesive layer therebetween may be fixed to the dielectric substrate 51 similar to the liquid crystal panel 100Pb in FIG. 16B. Alternatively, the protective layer on which the resistive film is formed without the adhesive layer (that is, the member integrally formed of the protective layer and the resistive film) may be disposed such that the resistive film is in contact with the dielectric substrate 51. For example, since the thermal contact resistance possibly increases in a case where the polymer film on which the resistive film is formed is merely disposed only, the polymer film is preferably pressed against the dielectric substrate 51 to decrease the thermal contact resistance. Using such a configuration allows the member integrally formed of the resistive film and the protective layer (polymer film or glass plate) to be detachable. Note that in a case where the resistive film (and the protective layer) is patterned, the resistive film (and the protective layer) is preferably fixed to the dielectric substrate to a degree not to shift in a position with respect to the slot substrate so that the antenna performance does not decrease.

In a case where the resistive film is disposed on the outer side of the slot substrate 201, openings are preferably provided in the resistive film at positions corresponding to the slots 57. The resistive film has preferably a thickness enough to transmit microwaves.

Here, the example in which the resistive film is used as the heater section is described, but other than the example, a nichrome line (e.g., winding wire), an infrared light heater section, and the like may be used as the heater section, for example. In the cases like these also, the heater section is preferably disposed not to decrease the antenna performance.

Such an external heater structure may automatically operate, for example, when it is detected that the temperature of the scanning antenna has fallen below a preset temperature. Of course, it may also operate in response to the operation of a user.

As a temperature control device for making the external heater structure automatically operate, various known thermostats can be used, for example. For example, a thermostat using bimetal may be connected between one of two terminals connected with the resistive film and a power source. Of course, a temperature control device may be used which supplies current to the external heater structure from the power source to prevent the temperature from falling below a preset temperature by use of a temperature sensor.

Driving Method

Since an antenna unit array of the scanning antenna according to the embodiments of the disclosure has a structure similar to that of an LCD panel, line sequential driving is performed in the same manner as an LCD panel. However, in a case where existing driving methods for LCD panels are applied, the following problems may occur. Problems that may occur in the scanning antenna will be described with reference to the equivalent circuit diagram of one antenna unit of the scanning antenna illustrated in FIG. 17.

First, as mentioned above, since the specific resistance of liquid crystal materials having large dielectric anisotropies $\Delta\varepsilon_M$ (birefringence $\Delta n$ with respect to visible light) in the microwave range is low, in a case where driving methods for LCD panels are applied as is, the voltage applied to the liquid crystal layer cannot be sufficiently maintained. Then, the effective voltage applied to the liquid crystal layer decreases, and the electrostatic capacitance value of the liquid crystal capacitance does not reach the target value.

In this way, when the voltage applied to the liquid crystal layer deviates from the predetermined value, the direction in which the gain of the antenna becomes maximum deviates from the intended direction. Then, for example, communication satellites cannot be accurately tracked. To prevent this, an auxiliary capacitance CS is provided electrically in parallel with the liquid crystal capacitance Clc, and the capacitance value C-Ccs of the auxiliary capacitance CS is sufficiently increased. The capacitance value C-Ccs of the auxiliary capacitance CS is preferably set appropriately such that the voltage retention rate of the liquid crystal capacitance Clc is 90% or greater.

In addition, when a liquid crystal material having a low specific resistance is utilized, a voltage reduction due to the interface polarization and/or the orientation polarization also occurs. To prevent the voltage drop due to these polarizations, it is conceivable to apply a sufficiently high voltage in anticipation of the voltage drop. However, when a high voltage is applied to a liquid crystal layer having a low specific resistance, a dynamic scattering effect (DS effect) may occur. The DS effect is caused by a convection of ionic impurities in the liquid crystal layer, and the dielectric constant $\varepsilon_M$ of the liquid crystal layer approaches an average value $((\varepsilon_M//+2\varepsilon_M\perp)/3)$. Also, to control the dielectric constant $\varepsilon_M$ of the liquid crystal layer in multiple stages (multiple gray scales), it is not always possible to apply a sufficiently high voltage.

To suppress the above-described DS effect and/or the voltage drop due to the polarization, the polarity inversion period of the voltage applied to the liquid crystal layer may be sufficiently shortened. As is well known, in a case where the polarity inversion period of the applied voltage is shortened, a threshold voltage at which the DS effect occurs becomes higher. Accordingly, the polarity inversion frequency may be determined such that the maximum value of the voltage (absolute value) applied to the liquid crystal layer is less than the threshold voltage at which the DS effect occurs. For the polarity inversion frequency of 300 Hz or greater, even in a case where a voltage with an absolute value of 10 V is applied to a liquid crystal layer having a specific resistance of $1\times10^{10}$ Ω·cm and a dielectric anisotropy $\Delta\varepsilon$ (@1 kHz) of about −0.6, a good quality operation can be ensured. In addition, in a case where the polarity inversion frequency (typically equal to twice the frame frequency) is 300 Hz or greater, the voltage drop caused by the polarization is also suppressed. From the viewpoint of power consumption and the like, the upper limit of the polarity inversion period is preferably about less than or equal to 5 KHz.

As described above, since the viscosity of the liquid crystal material depends on the temperature, it is preferable that the temperature of the liquid crystal layer be appropriately controlled. The physical properties and driving conditions of the liquid crystal material described here are values under the operating temperature of the liquid crystal layer. Conversely, the temperature of the liquid crystal layer is preferably controlled such that it can be driven under the above conditions.

An example of a waveform of a signal used for driving the scanning antenna will be described with reference to FIG. 18A to FIG. 18G. Note that FIG. 18D illustrates the waveform of the display signal Vs (LCD) supplied to the source bus line of the LCD panel for comparison.

FIG. 18A illustrates the waveform of a scanning signal Vg supplied to a gate bus line G-L1, FIG. 18B illustrates the waveform of a scanning signal Vg supplied to a gate bus line G-L2, FIG. 18C illustrates the waveform of a scanning signal Vg supplied to a gate bus line G-L3, FIG. 18E illustrates the waveform of a data signal Vda supplied to the source bus line, FIG. 18F illustrates the waveform of a slot voltage Vidc supplied to the slot electrode of the slot substrate (slot electrode), and FIG. 18G illustrates the waveform of the voltage applied to the liquid crystal layer of each antenna unit.

As illustrated in FIG. 18A to FIG. 18C, the voltage of the scanning signal Vg supplied to the gate bus line sequentially changes from a low level (VgL) to a high level (VgH). VgL and VgH can be appropriately set according to the characteristics of the TFT. For example, VgL=from −5 V to 0 V, and VgH=+20 V. Also, VgL=−20 V and VgH=+20 V are possible. A period from the time when the voltage of the scanning signal Vg of a particular gate bus line switches from the low level (VgL) to the high level (VgH) until the time when the voltage of the next gate bus line switches from VgL to VgH will be referred to as one horizontal scan period (1H). In addition, the period during which the voltage of each gate bus line is at the high level (VgH) will be referred to as a selection period PS. In this selection period PS, the TFTs connected to the respective gate bus lines are turned on, and the current voltage of the data signal Vda supplied to the source bus line is supplied to the corresponding patch electrode. The data signal Vda is, for example, from −15 V to 15 V (an absolute value is 15 V), and, for example, a data signal Vda having different absolute values corresponding to 12 gray scales, or preferably corresponding to 16 gray scales is used.

Here, a case is exemplified where an intermediate voltage is applied to all antenna units. That is, it is assumed that the voltage of the data signal Vda is constant with respect to all antenna units (assumed to be connected to m gate bus lines). This corresponds to the case where the gray levels are displayed on the LCD panel over the whole surface thereof. At this time, dot inversion driving is performed in the LCD panel. That is, in each frame, the display signal voltage is supplied such that the polarities of adjacent pixels (dots) are opposite to each other.

FIG. 18D illustrates the waveform of the display signal of the LCD panel on which the dot inversion driving is performed. As illustrated in FIG. 18D, the polarity of Vs (LCD) is reversed every 1H. The polarity of the Vs (LCD) supplied to a source bus line adjacent to a source bus line supplied with the Vs (LCD) having this waveform is opposite to the polarity of the Vs (LCD) illustrated in FIG. 18D. Furthermore, the polarity of the display signal supplied to all the pixels is inverted for each frame. In the LCD panels, it is difficult to perfectly match the magnitude of the effective voltage applied to the liquid crystal layer between the positive polarity and the negative polarity, and further, the difference in effective voltage becomes a difference in luminance, which is observed as flicker. To make this flicker less noticeable, the pixels (dots) to which voltages of different polarities are applied are spatially dispersed in each frame. Typically, by performing the dot inversion driving, the pixels (dots) having different polarities are arranged in a checkered pattern.

In contrast, in the scanning antenna, the flicker itself is not problematic. That is, it is sufficient for the electrostatic capacitance value of the liquid crystal capacitance to be an intended value, and the spatial distribution of the polarity in each frame is not problematic. Accordingly, from the perspective of low power consumption or the like, it is preferable to reduce the number of times of polarity inversion of the data signal Vda supplied from the source bus line; that is, to lengthen the period of polarity inversion. For example, as illustrated in FIG. 18E, the period of polarity inversion may be set to 10 H (such that polarity inversion occurs every 5 H). Of course, in a case where the number of antenna units connected to each source bus line (typically equal to the number of gate bus lines) is m, the period of polarity inversion of the data signal Vda may be 2 m·H (polarity inversion occurs each m·H). The period of polarity inversion of the data signal Vda may be equal to 2 frames (a polarity inversion occurs each frame).

In addition, the polarity of the data signal Vda supplied from all the source bus lines may be the same. Accordingly, for example, in a particular frame, a positive polarity data signal Vda may be supplied from all the source bus lines, and in the next frame, a negative polarity data signal Vda may be supplied from all the source bus lines.

Alternatively, the polarities of the data signals Vda supplied from the adjacent source bus lines may be opposite to each other. For example, in a particular frame, a positive polarity data signal Vda is supplied from odd-numbered source bus lines, and a negative polarity data signal Vda may be supplied from even-numbered source bus lines. Then, in the next frame, the negative polarity data signal Vda is supplied from the odd-numbered source bus lines, and the positive polarity data signal Vda is supplied from the even-numbered source bus lines. In the LCD panels, such a driving method is referred to as source line inversion driving. In a case where the data signals Vda supplied from adjacent source bus line are made to have opposite polarity, by connecting (short-circuiting) adjacent source bus lines to each other before inverting the polarity of the data signals Vda supplied between frames, it is possible to cancel electric charges stored in the liquid crystal capacitance between adjacent columns. Accordingly, an advantage can be obtained such that the amount of electric charge supplied from the source bus line in each frame can be reduced.

As illustrated in FIG. 18F, the voltage Vidc of the slot electrode is, for example, a DC voltage, and is typically a ground potential. Since the capacitance value of the capacitance (liquid crystal capacitance and auxiliary capacitance) of the antenna units is greater than the capacitance value of the pixel capacitance of the LCD panel (for example, about 30 times in comparison with 20-inch LCD panels), there is no affect from a pull-in voltage due to a parasitic capacitance of the TFT, and even in a case where the voltage Vidc of the slot electrode is the ground potential and the data signal Vda is a positive or negative symmetrical voltage with reference to the ground potential, the voltage supplied to the patch electrode is a positive and negative symmetrical voltage. In the LCD panels, although the positive and negative symmetrical voltages are applied to the pixel electrode by adjusting the voltage (common voltage) of the counter electrode in consideration of the pull-in voltage of the TFT, this is not necessary for the slot voltage of the scanning antenna, and ground potential may be used. Also, although not illustrated in FIG. 18A to FIG. 18G, the same voltage as the slot voltage Vidc is supplied to the CS bus line.

Since the voltage applied to the liquid crystal capacitance of each antenna unit is the voltage of the patch electrode with respect to the voltage Vidc (FIG. 18F) of the slot electrode (that is, the voltage of the data signal Vda illustrated in FIG. 18E), when the slot voltage Vidc is the ground potential, as illustrated in FIG. 18G, the voltage coincides with the waveform of the data signal Vda illustrated in FIG. 18E.

The waveform of the signal used for driving the scanning antenna is not limited to the above example. For example, as described below with reference to FIG. 19A to FIG. 19E and FIG. 20A to FIG. 20E, a Viac having an oscillation waveform may also be used as the voltage of the slot electrode.

For example, signals such as those exemplified in FIG. 19A to FIG. 19E can be used. In FIG. 19A to FIG. 19E, although the waveform of the scanning signal Vg supplied to the gate bus line is omitted, the scanning signal Vg described with reference to FIG. 18A to FIG. 18C is also used here.

Figure 19A:
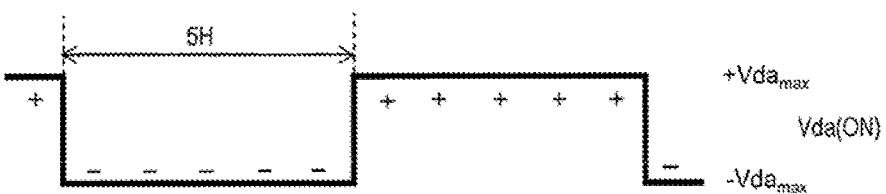

As illustrated in FIG. 19A, similar to that illustrated in FIG. 18E, a case where the waveform of the data signal Vda is inverted in polarity at a 10 H period (every 5 H) will be exemplified. Here, a case where an amplitude is the maximum value |Vda$_{max}$| is illustrated as the data signal Vda. As described above, the waveform of the data signal Vda may be inverted in polarity at a two frame period (each frame).

Figure 19B:
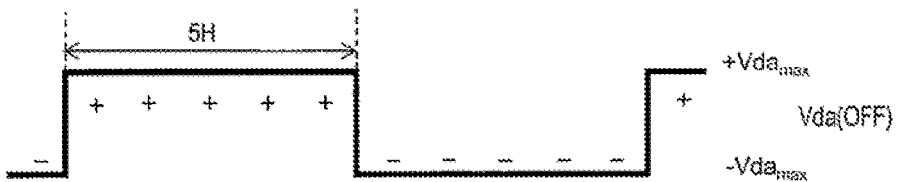
Figure 19C:
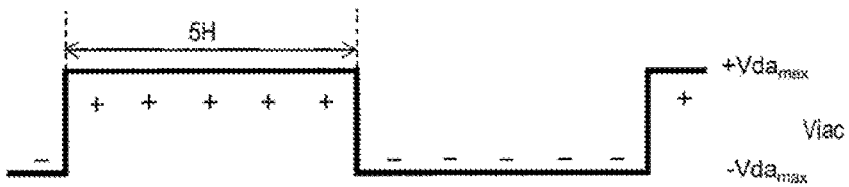

Here, as illustrated in FIG. 19C, the voltage Viac of the slot electrode is an oscillation voltage such that the polarity of the voltage Viac of the slot electrode is opposite to the polarity of the data signal Vda (ON), and the oscillation period of the slot electrode is the same as that of data signal Vda (ON). The amplitude of the voltage Viac of the slot electrode is equal to the maximum value |Vda$_{max}$| of the amplitude of the data signal Vda. That is, the slot voltage Viac is set to a voltage that oscillates between −Vda$_{max}$ and +Vda$_{max}$ with the same period of polarity inversion as that of the data signal Vda (ON) and opposite polarity (the phase differs by 180°).

Figure 19D:
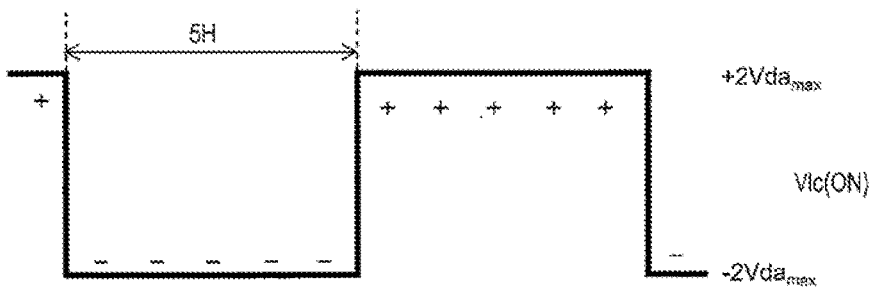

Since a voltage Vlc applied to the liquid crystal capacitance of each antenna unit is the voltage of the patch electrode with respect to the voltage Viac (FIG. 19C) of the slot electrode (that is, the voltage of the data signal Vda (ON) illustrated in FIG. 19A), when the amplitude of the data signal Vda oscillates at ±Vda$_{max}$, the voltage applied to the liquid crystal capacitance has a waveform that oscillates with an amplitude twice Vda$_{max}$ as illustrated in FIG. 19D. Accordingly, the maximum amplitude of the data signal Vda required to make the maximum amplitude of the voltage Vlc applied to the liquid crystal capacitance ±Vda$_{max}$ is ±Vda$_{max}$/2.

Since the maximum amplitude of the data signal Vda can be halved by using such a slot voltage Viac, there is the advantage that a general-purpose driver IC with a breakdown voltage of 20 V or less can be used as a driver circuit for outputting the data signal Vda, for example.

Note that, as illustrated in FIG. 19E, to make the voltage Vlc (OFF) applied to the liquid crystal capacitance of each antenna unit zero, as illustrated in FIG. 19B, it may be preferable for the data signal Vda (OFF) to have the same waveform as that of the slot voltage Viac.

Consider, for example, a case where the maximum amplitude of the voltage Vlc applied to the liquid crystal capacitance is ±15 V. When the Vidc illustrated in FIG. 18F is used as the slot voltage and Vidc=0 V, the maximum amplitude of Vda illustrated in FIG. 18E becomes ±15 V. In contrast, when the Viac illustrated in FIG. 19C is used as the slot voltage and the maximum amplitude of Viac is ±7.5 V, the maximum amplitude of Vda (ON) illustrated in FIG. 19A becomes ±7.5 V.

When the voltage Vlc applied to the liquid crystal capacitance is 0 V, the Vda illustrated in FIG. 18E may be set to 0 V, and the maximum amplitude of the Vda (OFF) illustrated in FIG. 19B may be set to ±7.5 V.

In a case where the Viac illustrated in FIG. 19C is utilized, the amplitude of the voltage Vlc applied to the liquid crystal capacitance is different from the amplitude of Vda, and therefore appropriate conversions are necessary.

Signals such as those exemplified in FIG. 20A to FIG. 20E can also be used. The signals illustrated in FIG. 20A to FIG. 20E are the same as the signals illustrated in FIG. 19A to FIG. 19E in that the voltage Viac of the slot electrode is an oscillation voltage such that the oscillation phase thereof is shifted by 180° from the oscillation phase of the data signal Vda (ON) as illustrated FIG. 20C. However, as illustrated in each of FIG. 20A to FIG. 20C, all of the data signals Vda (ON), Vda (OFF) and the slot voltage Viac are voltages oscillating between 0 V and a positive voltage. The amplitude of the voltage Viac of the slot electrode is equal to the maximum value |Vda$_{max}$| of the amplitude of the data signal Vda.

When such a signal is utilized, the driving circuit only needs to output a positive voltage, which contributes to cost reduction. As described above, even in a case where a voltage oscillating between 0 V and a positive voltage is used, as illustrated in FIG. 20D, the polarity of the voltage Vlc (ON) applied to the liquid crystal capacitance is inverted. In the voltage waveform illustrated in FIG. 20D, + (positive) indicates that the voltage of the patch electrode is higher than the slot voltage, and − (negative) indicates that the voltage of the patch electrode is lower than the slot voltage. That is, the direction (polarity) of the electric field applied to the liquid crystal layer is reversed similarly to the other examples. The amplitude of the voltage Vlc (ON) applied to the liquid crystal capacitance is Vda$_{max}$.

Figure 20A:
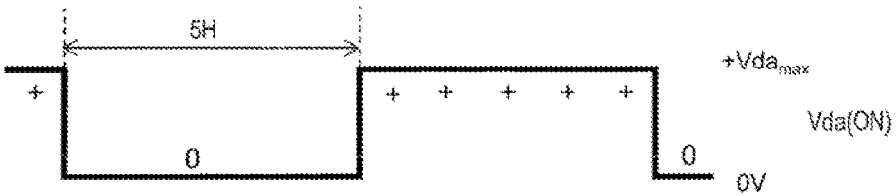
FIG. 20A to FIG. 20E are each a diagram illustrating yet another example of a waveforms of each signal used for driving the scanning antenna according to an embodiment.
Figure 20B:
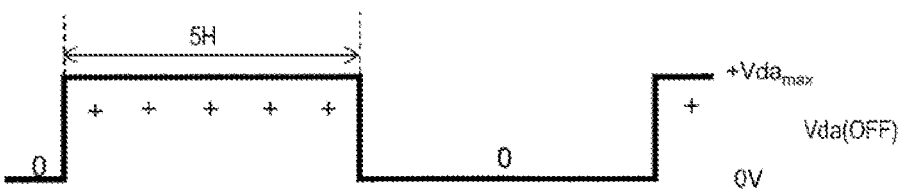
Figure 20C:
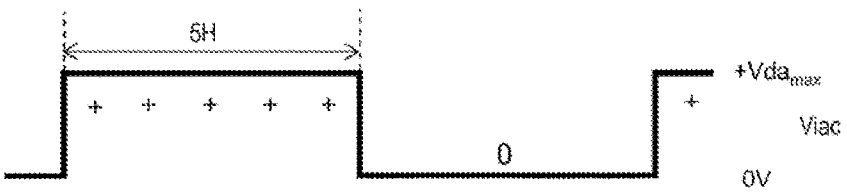
Figure 20D:
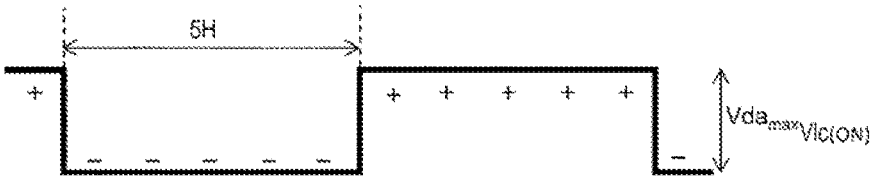
Figure 20E:

Note that, as illustrated in FIG. 20E, to make the voltage Vlc (OFF) applied to the liquid crystal capacitance of each antenna unit zero, as illustrated in FIG. 20B, it may be preferable for the data signal Vda (OFF) to have the same waveform as that of the slot voltage Viac.

The driving method described with reference to FIG. 19A to FIG. 19E and FIG. 20A to FIG. 20E of oscillating (inverting) the voltage Viac of the slot electrodes corresponds to a driving method of inverting the counter voltage in the driving method of LCD panels (sometimes referred to as a "common inversion drive"). In the LCD panels, since the flicker cannot be sufficiently suppressed, the common inversion drive is not utilized. In contrast, in the scanning antennas, since the flicker does not matter, the slot voltage can be reversed. Oscillation (inversion) is performed in each frame, for example (the 5 H in FIG. 19A to FIG. 19E and FIG. 20A to FIG. 20E is set to 1 V (vertical scanning period or frame)).

In the above description, although an example of the voltage Viac of the slot electrode is described in which one voltage is applied; that is, an example in which a common slot electrode is provided for all patch electrodes, the slot electrode may be divided corresponding to one row or two or more rows of the patch electrode. Here, a row refers to a set of patch electrodes connected to one gate bus line with a TFT therebetween. By dividing the slot electrode into a plurality of row portions in this way, the polarities of the voltages of the respective portions of the slot electrode can be made independent from each other. For example, in a freely-selected frame, the polarity of the voltage applied to the patch electrodes can be reversed between the patch electrodes connected to adjacent gate bus lines. In this way, it is possible to perform row inversion in which the polarity is inverted not only for each single row (1H inversion) of the patch electrode, but also m row inversion (mH inversion) in which the polarity is inverted for every two or more rows. Of course, row inversion and frame inversion can be combined.

From the viewpoint of simplicity of driving, it is preferable that the polarity of the voltage applied to the patch electrode be the same in any frame, and the polarity be reversed every frame.

Example of Antenna Unit Array and Connection of Gate Bus Line and Source Bus Line In the scanning antenna according to the embodiments of the disclosure, the antenna units are arranged concentrically, for example.

For example, in a case where the antenna units are arranged in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the mth gate bus line.

In such an arrangement, the number of antenna units connected to each gate bus line is different. In addition, although m antenna units are connected to the nx number of source bus lines connected to the nx number of antenna units that constitute the outermost circle, the number of antenna units connected to the source bus line connected to the antenna units that constitute the inner circle becomes less than m.

In this way, the arrangement of antenna units in the scanning antenna is different from the arrangement of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

Fourth Embodiment

The scanning antenna of a fourth embodiment will be described below.

The TFT substrate in the scanning antenna may include a source-gate connection section disposed in the non-transmission and/or reception region and electrically connecting each of the source bus lines to a connection wiring line (hereinafter referred to as a "gate connection wiring line") in the gate metal layer. The source-gate connection section is provided for each of the source bus lines. The source terminal section may be configured using the gate connection wiring line.

The inventor has found through examination that a source-gate connection section provided to a TFT substrate for a scanning antenna may cause the following problem.

In a TFT substrate for a scanning antenna, a patch electrode is formed using a relatively thick conductive film (patch conductive film). In manufacturing such a TFT substrate, an etchant containing phosphoric acid, nitric acid, and acetic acid, for example, is used for patterning the patch conductive film. The etching time and the overetching time are longer than the time of an etching process for another layer. Thus, in a patterning process in forming the patch conductive film, there is a possibility that the source conductive film or the gate conductive film positioned in the source-gate connection section is damaged. For example, in a process of forming the source-gate connection section, the source bus line and the gate connection wiring line are partially exposed in an opening formed in an insulating film being an upper layer of the source-gate connection section. If the exposed portions of these wiring lines are etched in the patterning process for the patch conductive film, a contact failure may occur. There is a possibility of a similar problem in the source terminal section and the gate terminal section.

Concerning this problem, the inventor has found out a configuration of a TFT substrate that allows patterning of a patch conductive film with a source conductive film and a gate conductive film protected. A specific configuration of the TFT substrate will be described below. In the following description, points different from the above-described embodiments are mainly described, and overlapping description is omitted as appropriate.

In the source-gate connection section of the present embodiment, the source bus line is electrically connected to the gate connection wiring line via a conductor section provided on an upper layer of the source bus line. The conductor section may be formed using the patch conductive film. Alternatively, the conductor section may be formed using another conductor film (transparent conductive film, for example) provided between the source metal layer including the source bus line and the patch metal layer including the patch electrode.

Figure 21:
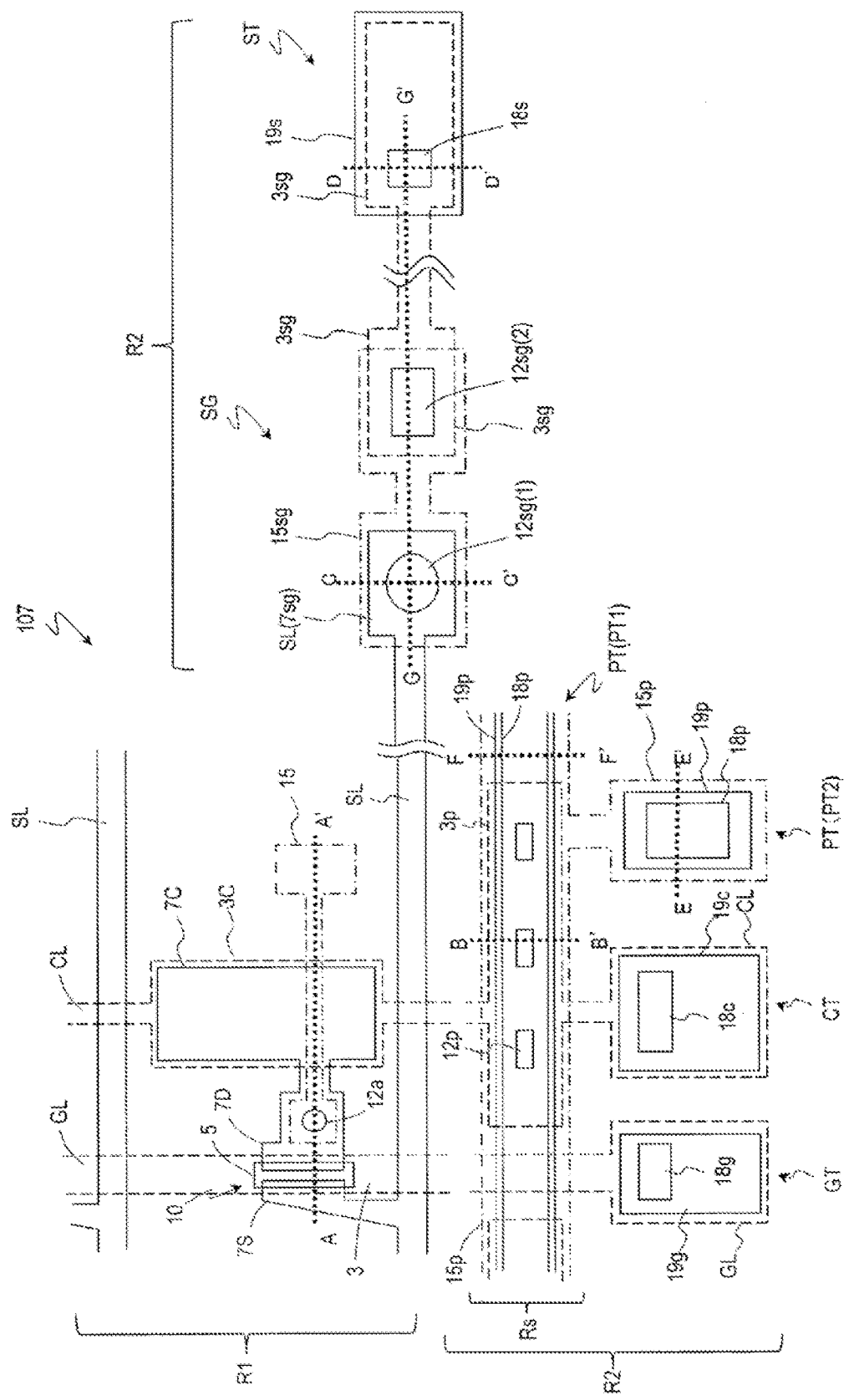
FIG. 21 is a schematic plan view illustrating an example of a TFT substrate 107 according to a fourth embodiment.

FIG. 21 is a schematic plan view illustrating an example of a TFT substrate 107 according to the present embodiment.

The TFT substrate 107 includes a transmission and/or reception region R1 where a plurality of antenna unit regions U are arranged, and a non-transmission and/or reception region R2 provided with terminal sections and the like. The non-transmission and/or reception region R2 includes a seal region Rs provided surrounding the transmission and/or reception region R1. The seal region Rs is located between a terminal section region where the terminal sections are disposed and the transmission and/or reception region R1, for example. FIG. 21 illustrates the antenna unit region U in the transmission and/or reception region R1, and a transfer terminal section PT, a source-gate connection section SG, a gate terminal section GT, a CS terminal section CT, and a source terminal section ST provided in the non-transmission and/or reception region R2. The transfer terminal section (also referred to as a transfer section) PT includes a first transfer terminal section PT1 located in the seal region Rs and a second transfer terminal section PT2 provided outside the seal region Rs. In this example, the first transfer terminal section PT1 extends along the seal region Rs while surrounding the transmission and/or reception region R1.

The gate terminal section GT and the source terminal section ST are typically provided for each of the gate bus lines and the source bus lines, respectively. FIG. 21 illustrates the CS terminal section CT and the second transfer terminal section PT2 aligned with the gate terminal section GT; however, the numbers and arrangements of the CS terminal sections CT and the second transfer terminal sections PT2 are determined independently of the gate terminal sections GT. In general, the numbers of the CS terminal sections CT and the second transfer terminal sections PT2 are smaller than the number of the gate terminal sections GT, and are determined appropriately in consideration of uniformity of voltage of a CS electrode and a slot electrode. The second transfer terminal section PT2 may be omitted if the first transfer terminal section PT1 is formed.

FIGS. 22A to 22E are schematic cross-sectional views illustrating the TFT substrate 107. FIG. 22A illustrates a cross section of the antenna unit region U taken along the line A-A' illustrated in FIG. 21, FIG. 22B illustrates a cross section of the transfer terminal section PT taken along the line B-B' illustrated in FIG. 21, FIG. 22C illustrates a cross section of the source-gate connection section SG taken along the line C-C' illustrated in FIG. 21, FIG. 22D illustrates a cross section of the source terminal section ST taken along the line D-D' illustrated in FIG. 21, and FIG. 22E illustrates a cross section of the transfer terminal section PT taken along the lines E-E' and F-F' illustrated in FIG. 21.

Figure 23:
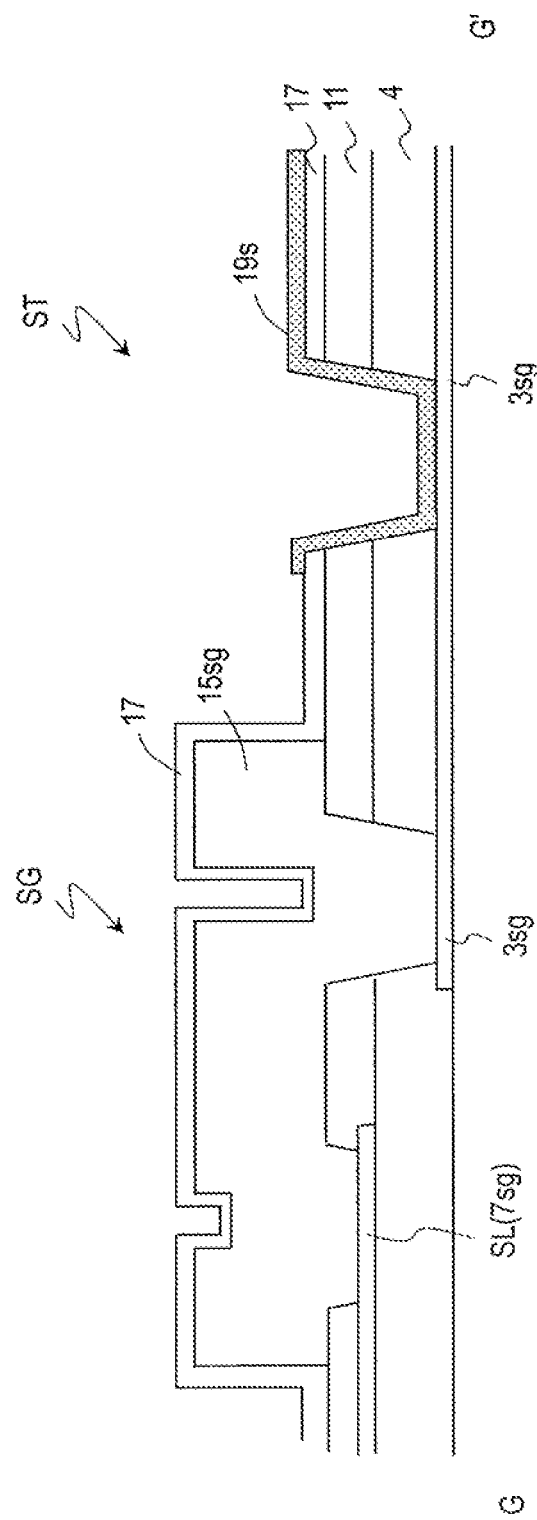
FIG. 23 is a schematic cross-sectional view illustrating a source-gate connection section SG and a source terminal section ST in the TFT substrate 107.

FIG. 23 is a schematic cross-sectional view illustrating the source-gate connection section SG and the source terminal section ST. FIG. 23 illustrates a cross section taken along the line G-G' illustrated in FIG. 21.

Antenna Unit Region U

As illustrated in FIG. 21 and FIG. 22A, each of the antenna unit regions U in the TFT substrate 107 includes a gate bus line GL and a source bus line SL formed on the dielectric substrate 1, a TFT 10, a first insulating layer 11 covering the TFT 10, and a plurality of patch electrodes 15 formed on the first insulating layer 11. A second insulating layer 17 is formed on the first insulating layer 11 and the patch electrodes 15.

The TFT 10 include a gate electrode 3, an island-shaped semiconductor layer 5, contact layers 6S and 6D, a gate insulating layer 4 disposed between the gate electrode 3 and the semiconductor layer 5, a source electrode 7S, and a drain electrode 7D. The TFT 10 has a configuration similar to that described above with reference to FIGS. 3A and 3B and the like. The source electrode 7S of each of the TFTs 10 is connected to the source bus line SL, the drain electrode 7D is connected to the patch electrode 15, and the gate electrode 3 is connected to the gate bus line GL.

The TFT substrate 107 may further include a CS bus line (auxiliary capacity line) CL. In this example, the CS bus line CL is formed using the same conductive film as that of the gate bus line GL. The CS bus line CL extends substantially parallel to the gate bus line GL. The CS bus line CL is partially opposed to a part of the drain electrode 7D with the gate insulating layer 4 interposed therebetween, thereby forming auxiliary capacity. In the present specification, a portion, serving as a lower electrode of the auxiliary capacity, of the CS bus line CL is referred to as a lower capacitance electrode 3C, and a portion, serving as an upper electrode of the auxiliary capacity, of the drain electrode 7D is referred to as an upper capacitance electrode 7C. The lower capacitance electrode 3C may have a width wider than the width of the portion other than the lower capacitance electrode 3C of the CS bus line CL, and the upper capacitance electrode 7C may have a width wider than the width of the portion other than the upper capacitance electrode 7C of the drain electrode 7D.

In this example, the patch electrode 15 extends across the auxiliary capacity composed of the lower capacitance electrode 3C, the upper capacitance electrode 7C, and the gate insulating layer 4 when viewed in the normal direction of the dielectric substrate 1. Note that the arrangement relationship between the auxiliary capacity and the patch electrode 15 is not limited to the illustrated example.

Transfer Terminal Section PT

As illustrated in FIG. 21 and FIG. 22B, the first transfer terminal section PT1 includes a gate connection section 3p, the gate insulating layer 4 and the first insulating layer 11 covering the gate connection section 3p, a transfer terminal patch connection section 15p, the second insulating layer 17, and a transfer terminal upper connection section 19p.

The gate connection section 3p is formed using the same conductive film as that of the gate bus line GL and is connected to (formed integrally with) the CS bus line CL. The transfer terminal patch connection section 15p is formed using the same conductive film as that of the patch electrode 15 and is electrically separated from the patch electrode 15.

The gate connection section 3p is electrically connected to the transfer terminal upper connection section 19p via the transfer terminal patch connection section 15p. In specific, an opening (gate contact hole) 12p reaching the gate connection section 3p is provided in the gate insulating layer 4 and the first insulating layer 11. The transfer terminal patch connection section 15p is formed on the first insulating layer 11 and in the opening 12p, and is in contact with the gate connection section 3p in the opening 12p. The second insulating layer 17 is formed on the transfer terminal patch connection section 15p and the first insulating layer 11, and includes an opening 18p reaching the transfer terminal patch connection section 15p. The transfer terminal upper connection section 19p is provided on the second insulating layer 17 and in the opening 18p, and is in contact with the transfer terminal patch connection section 15p in the opening 18p. The transfer terminal upper connection section 19p is connected to a transfer terminal upper connection section on the slot substrate side via a sealing member containing conductive particles, for example (see FIG. 7).

In this example, the transfer terminal patch connection section 15p and the transfer terminal upper connection section 19p extend across the gate bus line GL. On the other hand, the gate connection section 3p is disposed between two adjacent gate bus lines GL in the seal region Rs. The gate connection sections 3p arranged while being separated from each other with the gate bus lines GL interposed therebetween are electrically connected to each other via the transfer terminal patch connection section 15p and the transfer terminal upper connection section 19p.

Note that, here, the gate connection section 3p is connected to the transfer terminal patch connection section 15p via a plurality of the openings 12p; however, one or more openings 12p may be provided for each gate connection section 3p. The gate connection section 3p may be connected to the transfer terminal patch connection section 15p in the CS terminal section CT.

The transfer terminal patch connection section 15p extends outward (toward the side opposite to the transmission and/or reception region R1) when viewed in the normal direction of the substrate 1, and constitutes the second transfer terminal section PT2.

The second transfer terminal section PT2 is provided outside the seal region Rs (on the side opposite to the transmission and/or reception region R1). The second transfer terminal section PT2 has a cross-sectional structure similar to that illustrated in FIG. 22B, except that the second transfer terminal section PT2 does not include the gate connection section 3p and the opening 12p. In other words, as illustrated in FIG. 22E, the second transfer terminal section PT2 includes the transfer terminal patch connection section 15p, the second insulating layer 17, and the transfer terminal upper connection section 19p. The transfer terminal upper connection section 19p is in contact with the transfer terminal patch connection section 15p in an opening of the second insulating layer 17. Also in the second transfer terminal section PT2, the transfer terminal upper connection section 19p may be connected to a transfer terminal upper connection section on the slot substrate side via a sealing member containing conductive particles, for example. The cross-sectional structure of the first transfer terminal section PT1 (cross section taken along the line F-F' in FIG. 21) that does not overlap with the gate bus line GL nor the gate connection section 3p is similar to the cross-sectional structure of the second transfer terminal section PT2.

Source-Gate Connection Section SG

As illustrated in FIG. 21, FIG. 22C, and FIG. 23, the source-gate connection section SG electrically connects the source bus line SL to a gate connection wiring line 3sg. In this example, the source bus line SL and the gate connection wiring line 3sg are electrically connected to each other via an SG patch connection section 15sg. The gate connection wiring line 3sg is formed using the same conductive film as that of the gate bus line GL and is electrically separated from the gate bus line GL. The SG patch connection section 15sg is formed using the same conductive film as that of the patch electrode 15 and is electrically separated from the patch electrode 15. In the present specification, a portion, located in the source-gate connection section SG, of the source bus line SL may be referred to as a "source connection section 7sg". The source connection section 7sg may have a width wider than the width of the source bus line SL.

In specific, the source-gate connection section SG includes the gate connection wiring line 3sg supported by the dielectric substrate 1, the gate insulating layer 4 extending over the gate connection wiring line 3sg, the source bus line SL formed on the gate insulating layer 4, the first insulating layer 11 extending over the source bus line SL, and the SG patch connection section 15sg. At least part of the gate connection wiring line 3sg is disposed while not overlapping with the source bus line SL when viewed in the normal direction of the dielectric substrate 1. A first opening 12sg(1) reaching the source bus line SL (source connection section 7sg) is formed in the first insulating layer 11. A second opening 12sg(2) reaching the gate connection wiring line 3sg is formed in the gate insulating layer 4 and the first insulating layer 11. The SG patch connection section 15sg is disposed on the first insulating layer 11 and in the opening 12sg(1) and the opening 12sg(2), and is in contact with the source bus line SL in the opening 12sg(1) and with the gate connection wiring line 3sg in the opening 12sg(2). This configuration allows the source bus line SL and the gate connection wiring line 3sg to be electrically connected to each other. The SG patch connection section 15sg may be covered with the second insulating layer 17.

Note that the opening 12sg(1) and the opening 12sg(2) may be continuous. That is, a single opening may be formed that exposes a part of the source bus line SL and a part of the gate connection wiring line 3sg, and the SG patch connection section 15sg may be provided in this opening.

Source Terminal Section ST, Gate Terminal Section GT, CS Terminal Section CT

As illustrated in FIG. 21, FIG. 22D, and FIG. 23, the source terminal section ST includes the gate connection wiring line 3sg extending from the source-gate connection section SG, the gate insulating layer 4 covering the gate connection wiring line 3sg, the first insulating layer 11 and the second insulating layer 17, and a source terminal upper connection section 19s. An opening 18s reaching the gate connection wiring line 3sg is provided in the gate insulating layer 4, the first insulating layer 11, and the second insulating layer 17. The source terminal upper connection section 19s is disposed on the second insulating layer 17 and in the opening 18s, and is in contact with the gate connection wiring line 3sg in the opening 18s.

As illustrated in FIG. 21, the gate terminal section GT and the CS terminal section CT may have a configuration similar to that of the source terminal section ST. In this example, the gate terminal section GT includes a gate terminal upper connection section 19g coming into contact with the gate bus line GL in an opening 18g formed in the gate insulating layer 4, the first insulating layer 11, and the second insulating layer 17. The CS terminal section CT includes a CS terminal upper connection section 19c coming into contact with the CS bus line CL in an opening 18c formed in the gate insulating layer 4, the first insulating layer 11, and the second insulating layer 17.

Manufacturing Method of TFT Substrate 107

As described above, in the present embodiment, the TFT substrate 107 includes, on the dielectric substrate 1, the gate metal layer, the gate insulating layer 4, the source metal layer, the first insulating layer 11, the patch metal layer, the second insulating layer 17, and an upper transparent conductive layer in this order. The gate metal layer includes the gate bus line GL, the gate electrode 3 for the TFT, the gate connection wiring line 3sg, and the gate connection section 3p. The source metal layer includes the source bus line SL, and the source electrode 7S and the drain electrode 7D for the TFT. The patch metal layer includes the patch electrode 15, the SG patch connection section 15sg, and the transfer terminal patch connection section 15p. The upper transparent conductive layer includes the upper connection sections 19s, 19g, 19c, 19p of the terminal sections.

FIG. 24A to FIG. 27N are cross-sectional process drawings illustrating an example of a manufacturing method of the TFT substrate 107. Each of these drawings illustrates cross sections corresponding to those in FIGS. 22A to 22E. In cases where the material, thickness, formation method, or the like of each layer is the same as that described above with reference to FIG. 5, the description thereof is omitted as appropriate.

First, as illustrated in FIG. 24A, a gate conductive film 3' is formed on a dielectric substrate 1 by sputtering or the like. Here, as the gate conductive film 3', a layered film including an Al film (150 nm) and a MoN film (10 nm) in this order is used. Next, the gate conductive film 3' is patterned to obtain a gate metal layer including a gate electrode 3, a gate bus line GL, a lower capacitance electrode 3C, a CS bus line CL, a gate connection section 3p, and a gate connection wiring line 3sg as illustrated in FIG. 24B.

Thereafter, as illustrated in FIG. 24C, a gate insulating layer 4, an intrinsic amorphous silicon film 5', and an $n^+$ type amorphous silicon film 6' are formed in this order so as to cover the gate metal layer. Next, the intrinsic amorphous silicon film 5' and the $n^+$ type amorphous silicon film 6' are patterned to obtain an island-shaped semiconductor layer 5 and a contact layer 6 as illustrated in FIG. 24D.

Next, as illustrated in FIG. 24E, a source conductive film 7' is formed on the gate insulating layer 4 and the contact layer 6. Here, as the source conductive film 7', a layered film (MoN/Al/MoN) is formed by layering MoN (having a thickness of 10 nm, for example), Al (having a thickness of 200 nm, for example), and MoN (having a thickness of 10 nm, for example) in this order.

Next, the source conductive film 7' is patterned to form a source metal layer including a source bus line SL (including a source connection section 7sg), a source electrode 7S, an upper capacitance electrode 7C, and a drain electrode 7D as illustrated in FIG. 25F. At this time, the contact layer 6 is also etched, and the source contact layer 6S and the drain contact layer 6D separated from each other are formed. In this manner, a TFT 10 is obtained.

Next, as illustrated in FIG. 25G, a first insulating layer 11 is formed so as to cover the TFT 10 and the source metal layer. In this example, the first insulating layer 11 is disposed so as to be in contact with the channel region of the semiconductor layer 5. Next, as illustrated in FIG. 25H, by known photolithography, an opening 12p reaching the gate connection section 3p in a transfer terminal section formation region and an opening 12sg(2) (not illustrated) reaching the gate connection wiring line 3sg in a source-gate connection section formation region are provided in the first insulating layer 11 and the gate insulating layer 4, and an opening 12sg(1) reaching the source bus line SL in the source-gate connection section formation region and an opening 12a reaching the drain electrode 7D in an antenna unit region U are formed in the first insulating layer 11.

Next, as illustrated in FIG. 25I, a patch conductive film 15' is formed on the first insulating layer 11 and in the openings 12a, 12p, 12sg(1), 12sg(2). Here, as the patch conductive film 15', a layered film (MoN/Al) including an Al film (having a thickness of 2000 nm, for example) and a MoN film (having a thickness of 10 nm, for example) in this order is used.

Next, the patch conductive film 15' is patterned by a known photolithographic process. This process allows formation of a patch electrode 15 in the antenna unit region U, a transfer terminal patch connection section 15p in the transfer terminal section formation region, and an SG patch connection section 15sg in the source-gate connection section formation region as illustrated in FIG. 26J. The patch electrode 15 is in contact with the drain electrode 7D in the opening 12a. The transfer terminal patch connection section 15p is in contact with the gate connection section 3p in the opening 12p. The SG patch connection section 15sg is in contact with the source bus line SL in the opening 12sg(1) and with the gate connection wiring line 3sg in the not-illustrated opening 12sg(2).

The patch conductive film 15' can be patterned with, for example, a mixed acid liquid of phosphoric acid, nitric acid, and acetic acid as an etchant. The patch conductive film 15' is relatively thick (for example, 0.3 μm or thicker), so that the etching time and the overetching time are long. Thus, if the gate conductive film and the source conductive film are not sufficiently protected in patterning of the patch conductive film 15', these metals may also be etched. Details will be described below. In the present embodiment, in patterning of the patch conductive film 15', the gate connection wiring line 3sg in a terminal section formation region is covered with an inorganic insulating film. In addition, the patch conductive film 15' remains, as the SG patch connection section 15sg, on a portion, exposed from the inorganic insulating film, of the source bus line SL in the source-gate connection section formation region. In this way, the patch conductive film 15' can be patterned with the gate conductive film and the source conductive film protected with the inorganic insulating film (the gate insulating layer 4 and the first insulating layer 11) or the patch conductive film 15', so that the above-mentioned problem does not arise.

Next, as illustrated in FIG. 26K, a second insulating layer 17 is formed on the patch metal layer and the first insulating layer 11. Thereafter, the second insulating layer 17 is etched by, for example, dry etching using a fluorine-based gas. This process allows formation of an opening 18p partially exposing the transfer terminal patch connection section 15p in a transfer section formation region as illustrated in FIG. 27L. In addition, in this etching process, the second insulating layer 17, the first insulating layer 11, and the gate insulating layer 4 are collectively etched to form an opening 18s exposing the gate connection wiring line 3sg in the terminal section formation region. Side surfaces of the second insulating layer 17, the first insulating layer 11, and the gate insulating layer 4 are aligned on a side wall of the resultant opening 18s.

Next, as illustrated in FIG. 27M, a transparent conductive film 19' is formed on the second insulating layer 17 and in the openings 18s, 18sg, 18p by sputtering, for example. As the transparent conductive film, an ITO film having a thickness of 70 nm, for example, is used. Next, the transparent conductive film 19' is patterned. This process allows formation of a transfer terminal upper connection section 19p coming into contact with the transfer terminal patch connection section 15p in the opening 18p and a source terminal upper connection section 19s coming into contact with the gate connection wiring line 3sg in the opening 18s as illustrated in FIG. 27N. In this manner, a transfer terminal section PT and a source terminal section ST are obtained. Note that, although not illustrated in the drawings, a CS terminal section CT and a gate terminal section GT can be formed by a method similar to that for the source terminal section ST. In this manner, a TFT substrate 107 is manufactured.

Fifth Embodiment

The scanning antenna of a fifth embodiment will be described below.

The scanning antenna of the fifth embodiment is characterized by the structure of its transfer section. The transfer section having the structure described here can also be applied to any of the above-described embodiments. Description of the structure other than that of the transfer section may be omitted.

The structures of transfer terminal sections PT-1 to PT-16 of the TFT substrate will be described with reference to FIG. 28A to FIG. 37G. The transfer terminal sections PT-1 to PT-16 may compose either of the first transfer terminal section PT1 located in the seal region Rs and the second transfer terminal section PT2 (see FIG. 21) provided outside the seal region Rs. The terminal section IT (see FIG. 6, for example) of the slot substrate may have the same structure as those of the transfer terminal sections PT-1 to PT-16. In a single scanning antenna, the structure of the transfer terminal section of the TFT substrate and the structure of the terminal section IT of the slot substrate may be selected differently from each other.

Figure 28A:
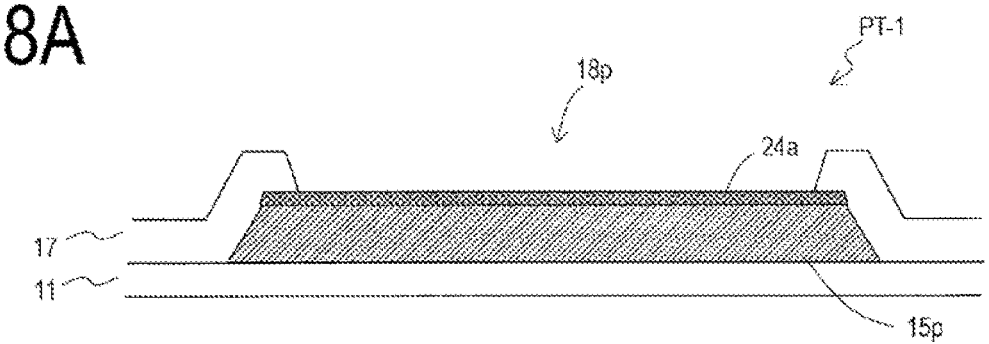
FIGS. 28A and 28B are schematic cross-sectional views of transfer terminal sections PT-1 and PT-2 of the TFT substrate.
Figure 28B:
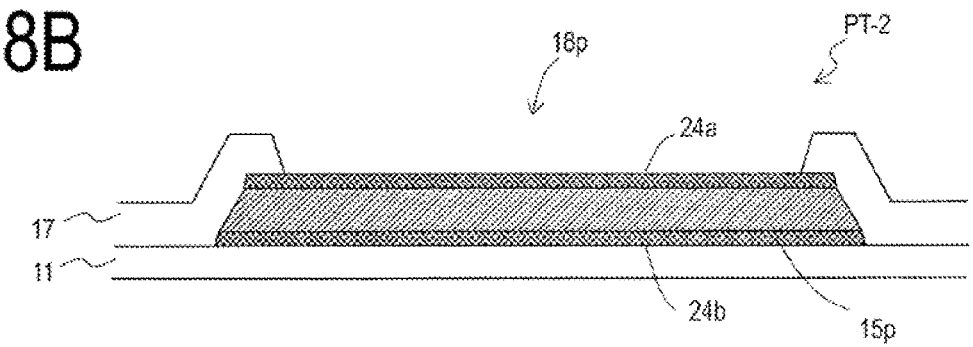

First, see FIGS. 28A and 28B. FIGS. 28A and 28B are schematic cross-sectional views of the transfer terminal sections PT-1 and PT-2 of the TFT substrate, and correspond to the cross-sectional view of the first transfer terminal section PT1 or the second transfer terminal section PT2 of the TFT substrate 107 illustrated in FIG. 21, for example. However, the transfer terminal sections PT-1 and PT-2 do not include the transfer terminal upper connection section 19p formed of a transparent conductive film.

The transfer terminal section PT-1 illustrated in FIG. 28A includes a patch connection section 15p formed on the first insulating layer 11, a refractory metal containing layer 24a formed on the patch connection section 15p, and a second insulating layer 17 including an opening 18p partially exposing an upper face of the refractory metal containing layer 24a. The second insulating layer 17 covers a peripheral portion of the refractory metal containing layer 24a and the entire side surface of the patch connection section 15p. In the present specification, "refractory metal" indicates tungsten (W), molybdenum (Mo), tantalum (Ta), and niobium (Nb), and "refractory metal containing layer" indicates a layer formed from any of: refractory metal; an alloy containing refractory metal; a refractory metal nitride; and a solid solution of refractory metal or an alloy containing refractory metal and a refractory metal nitride.

The transfer terminal section PT-2 illustrated in FIG. 28B differs from the transfer terminal section PT-1 in that the transfer terminal section PT-2 further includes a refractory metal containing layer 24b between the first insulating layer 11 and the patch connection section 15p.

The patch connection section 15p is formed of the same low-resistance metal film (Al film, Cu film, Au film, or Ag film) as that of the patch electrode 15 as described for the scanning antenna in the previous embodiment. The patch connection section 15p is preferably formed of an Al layer having a thickness of 0.3 µm or greater and 2 µm or less, for example. Note that in the present embodiment, the film structure (including the layered structure) of the patch electrode 15 may differ from the film structures (including the layered structures) of the transfer terminal sections PT-1 to PT-16. In the description of the present embodiment, for convenience in describing the film structure of the transfer terminal section PT-1, the patch connection section 15p is formed of only the low-resistance metal film (Al film, Cu film, Au film, or Ag film) included in the patch electrode 15. Note that a layer formed of the low-resistance metal films included in the patch electrode 15 and the patch connection section 15p is also referred to as a "low-resistance metal layer". If the patch electrode 15 and the patch connection section 15p have a layered structure, the Al layer preferably has a thickness of 0.3 µm or greater, and the Cu layer preferably has a thickness of 0.2 µm or greater.

The refractory metal containing layers 24a and 24b are formed from Mo or MoN, for example. The thickness of the refractory metal containing layers 24a and 24b is preferably 10 nm or greater and 200 nm or less, and is, for example, 10 nm. By providing the refractory metal containing layer 24a, a taper shape can be relatively easily controlled in forming the patch connection section 15p by etching. The patch connection section 15p preferably has such a taper shape that interior angles (also referred to as base angles or cone angles) at both ends of the lower base of a trapezoid are 15° or greater and 75° or less, for example. Note that the refractory metal containing layer 24b may be omitted.

A silicon oxide (SiOx) film, a silicon nitride (SixNy) film, a silicon oxynitride (SiOxNy; x>y) film, or a silicon nitride oxide (SiNxOy; x>y) film, for example, can be used as the second insulating layer 17 as appropriate. As the second insulating layer 17, for example, a SiNx layer having a thickness of 200 nm is formed. As the second insulating layer 17, a SiNx layer having a thickness of 20 nm or greater and 200 nm or less is preferable. The second insulating layer 17 having a thickness of greater than 200 nm increases loss of microwaves.

Unfortunately, if the TFT substrate including the transfer terminal section PT-1 or PT-2 and the slot substrate including the terminal section IT having a structure similar to that of the transfer terminal section PT-1 or PT-2 are bonded to each other via conductive particles (conductive spacers), a problem may arise that the thickness of the liquid crystal layer (substrate gap) varies. This problem occurs when glass fibers or glass beads (including those subjected to conductive coating, hereinafter referred to as "glass spacers") are used as the conductive spacers. The patch connection section 15p is formed of a relatively thick layer formed of the same low-resistance metal film as that of the patch electrode 15 (a low-resistance metal layer, for example, an Al layer having a thickness of 0.3 µm or greater), and thus readily deforms. With the glass spacers, external force in bonding the substrates causes the spacers to stick in the transfer terminal section PT-1 or PT-2 and the terminal section IT, causing deformation. The resultant scanning antenna has insufficient moisture resistance reliability, and corrosion may thus occur in the transfer section.

The transfer terminal sections PT-3 to PT-16 described with reference to FIG. 29A to FIG. 37G can solve both of the above two problems.

Figure 29A:
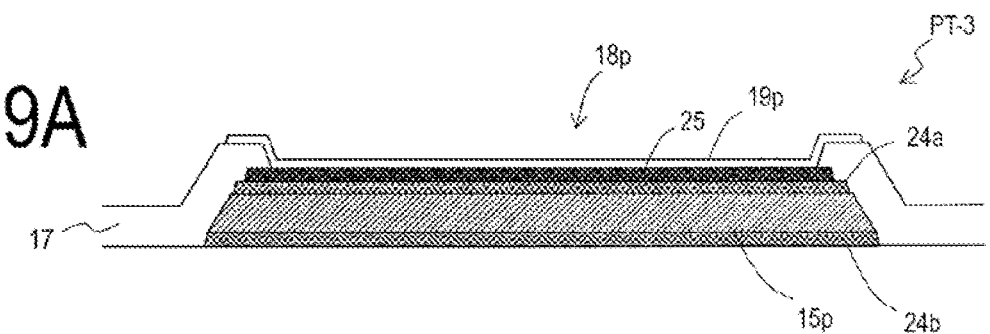
FIGS. 29A to 29C are schematic cross-sectional views of transfer terminal sections PT-3 to PT-5.
Figure 29B:
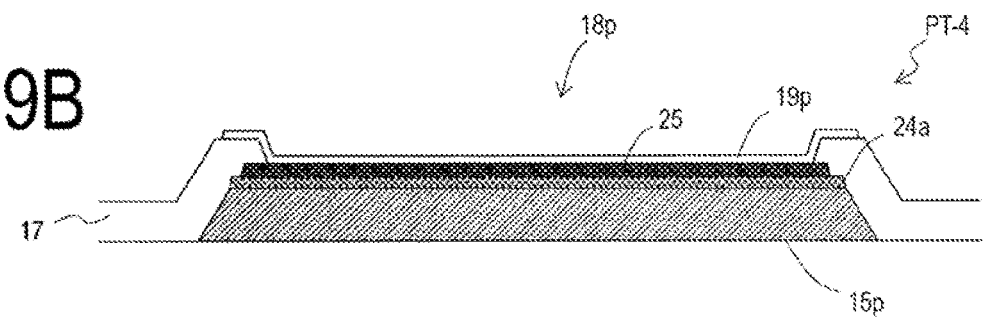
Figure 29C:
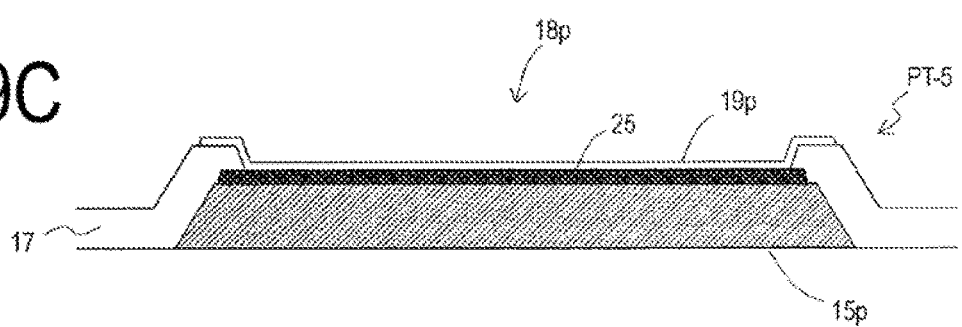

FIGS. 29A to 29C are schematic cross-sectional views of the transfer terminal sections PT-3 to PT-5. The transfer terminal section PT-3 illustrated in FIG. 29A includes a protection metal layer 25 disposed on the refractory metal containing layer 24a in the transfer terminal section PT-2 illustrated in FIG. 28B and a transparent conductive layer (upper connection section) 19p covering the protection metal layer 25 exposed in the opening 18p of the second insulating layer 17. The second insulating layer 17 covers a peripheral portion of the protection metal layer 25 and the entire side surfaces of the refractory metal containing layer 24a and the patch connection section 15p.

Here, the protection metal layer 25 is formed of at least one layer selected from the group consisting of a Ti layer, a MoNb layer, a MoNbNi layer, a MoNbN layer, and a MoNbNiN layer. In other words, the protection metal layer 25 may be formed of one layer or two or more laminated layers selected from the group consisting of a Ti layer, a MoNb layer, a MoNbNi layer, a MoNbN layer, and a MoNbNiN layer. The protection metal layer 25 has a thickness of, for example, 18 nm or greater. A Ti layer, a MoNb layer, a MoNbNi layer, a MoNbN layer, or a MoNbNiN layer having a thickness of 18 nm or greater can sufficiently suppress sticking-in of the glass spacers. To more effectively suppress sticking-in of the glass spacers, the protection metal layer 25 preferably has a thickness of 28 nm or greater. The upper limit of the thickness of the protection metal layer 25 is, for example, 300 nm. Furthermore, the protection metal layer 25 can enhance moisture resistance reliability.

The transfer terminal section PT-3 also includes the transparent conductive layer 19p disposed on the protection metal layer 25. As the transparent conductive layer 19p, an indium tin oxide (ITO) layer, an indium zinc oxide (IZO, which is a trade name of Idemitsu Kosan Co., Ltd.) layer, or a zinc oxide (ZnO) layer can be used. The transparent conductive layer 19p has a thickness of, for example, 20 nm or greater and 250 nm or less. By providing the transparent conductive layer 19p formed from the oxide, the moisture resistance reliability can be further enhanced.

The transfer terminal section PT-4 illustrated in FIG. 29B has the same structure as the transfer terminal section PT-3 in FIG. 29A but does not include the refractory metal containing layer 24b. The transfer terminal section PT-5 illustrated in FIG. 29C has the same structure as the transfer terminal section PT-3 in FIG. 29A but does not include either of the refractory metal containing layers 24a and 24b. Although not illustrated in the drawings, only the refractory metal containing layer 24a may be omitted in the transfer terminal section PT-3 in FIG. 29A. Note that the refractory metal containing layer 24a allows easy control of the taper angles of the patch connection section 15p; however, even if the refractory metal containing layer 24a is omitted, adjustment of etching conditions enables desired taper angles to be formed.

Figure 30A:
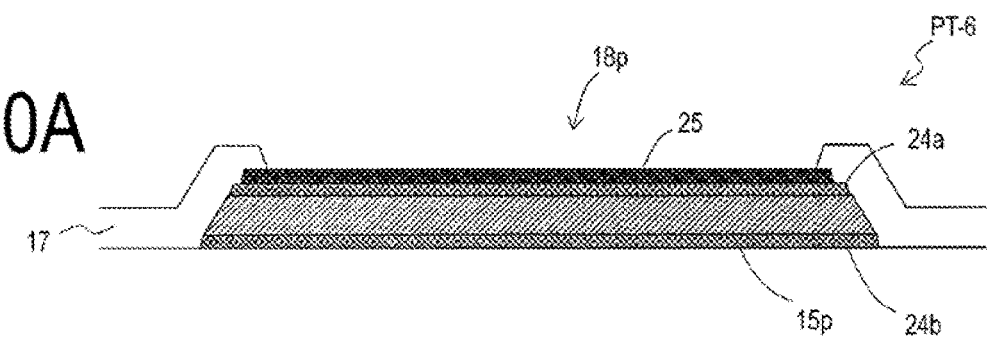
FIGS. 30A to 30C are schematic cross-sectional views of transfer terminal sections PT-6 to PT-8.
Figure 30B:
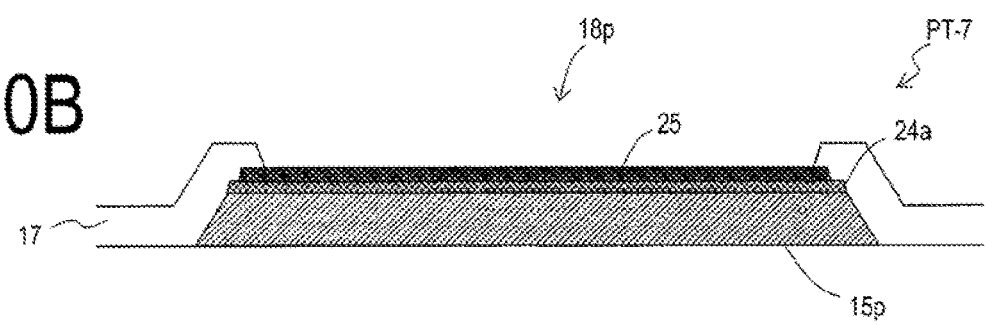
Figure 30C:
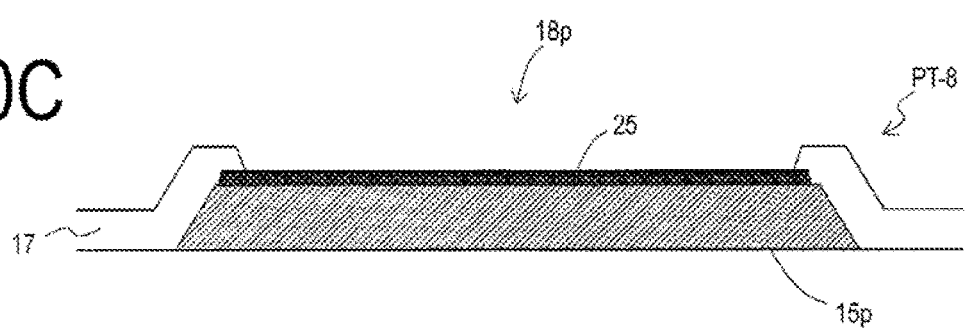

The transfer terminal sections PT-6 to PT-8 illustrated in FIGS. 30A to 30C respectively have the same structures as the transfer terminal sections PT-3 to PT-5 illustrated in FIGS. 29A to 29C but do not include the transparent conductive layer 19p.

In this way, the protection metal layer 25 is formed on the patch connection section 15p, and the second insulating layer 17 (preferably a SixNy layer) is further formed covering the peripheral portion of the upper face of the protection metal layer 25 and the entire side surfaces of the patch connection section 15p and the protection metal layer 25, thereby solving the above problems. Note that a terminal section IT having the same configuration as any of the transfer terminal sections PT-3 to PT-8 is formed for the slot substrate. However, the main layer 55M of the slot electrode 55 included in the terminal section IT is formed of a Cu layer having a thickness of, for example, 2 μm or greater and 6 μm or less, which is thicker than the patch connection section 15p included in the transfer terminal section PT.

Next, a manufacturing method of the transfer terminal section PT-4 (FIG. 29B) will be described with reference to FIGS. 31A to 31G. FIGS. 31A to 31G are schematic cross-sectional view for describing a manufacturing method of the transfer terminal section PT-4.

Figure 31A:
FIGS. 31A to 31G are schematic cross-sectional view for describing a manufacturing method of the transfer terminal section PT-4.

After a first insulating layer 11 including a predetermined contact hole is formed through processes similar to those in the manufacturing method of the TFT substrate 101 described with reference to FIG. 5, for example, a patch conductive film 15' and a refractory metal containing film 24a' are formed on the substantially entire surface of the first insulating layer (not illustrated) as illustrated in FIG. 31A.

Figure 31B:

Next, as illustrated in FIG. 31B, the patch conductive film 15' and the refractory metal containing film 24a' are etched to obtain a patch connection section 15p and a refractory metal containing layer 24a. For example, an etching mask is formed with a photoresist, and the etching is performed with an acid chemical solution. At this time, since the refractory metal containing film 24a' is formed on the patch conductive film 15', the taper angle of the patch connection section 15p can be relatively easily controlled so as to be within a range from 15° to 75°.

Figure 31C:
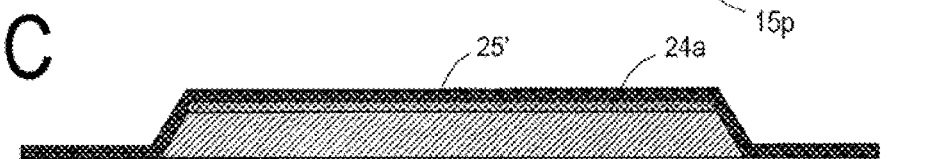
Figure 31D:
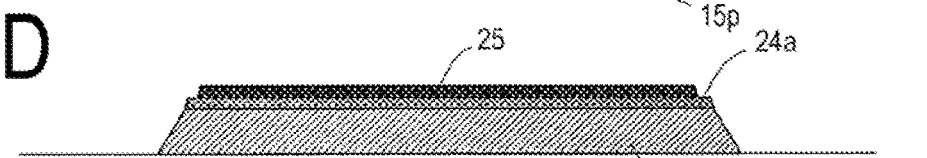

Next, as illustrated in FIG. 31C, a protection metal film 25' is formed on the substantially entire surface, and as illustrated in FIG. 31D, the protection metal film 25' is patterned to form a protection metal layer 25 on the refractory metal containing layer 24a.

Figure 31E:
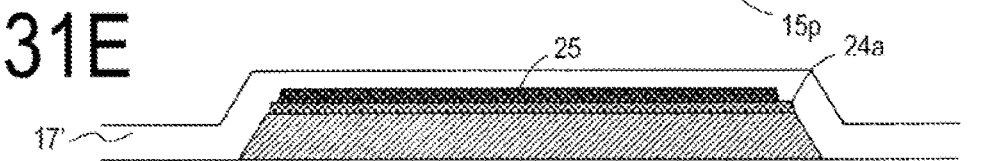
Figure 31F:
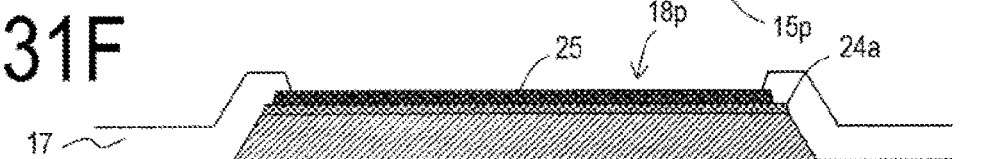

Thereafter, as illustrated in FIG. 31E, a second insulating film 17' is formed on the substantially entire surface, and as illustrated in FIG. 31F, the second insulating film 17' is patterned to form a second insulating layer 17 including an opening 18p.

Figure 31G:
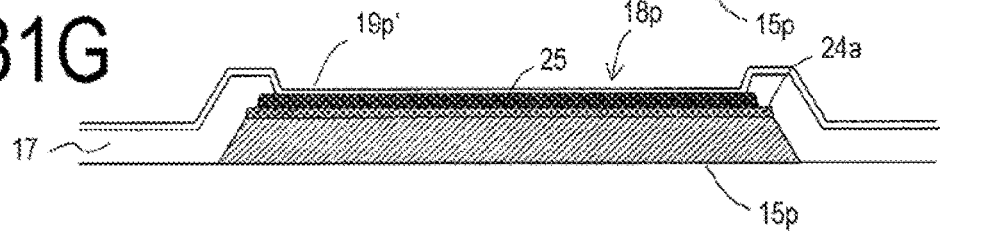

Thereafter, as illustrated in FIG. 31G, a transparent conductive film 19p' is formed on the substantially entire surface, and the transparent conductive film 19p' is patterned to obtain a transfer terminal section PT-4 (FIG. 29B) including a transparent conductive layer (transfer terminal upper connection section) 19p.

Each of the processes in the above-described manufacturing methods can be achieved by a known method, and detailed description thereof is thus omitted. It will be apparent to those skilled in the art that the other transfer terminal sections PT-1 to PT-3 and PT-5 to PT-8 are manufactured by modifying the above-described manufacturing method, and description thereof is thus omitted.

FIGS. 32A, 32B, 33A, and 33B are schematic cross-sectional views of the transfer terminal sections PT-9 to PT-12.

Figure 32A:
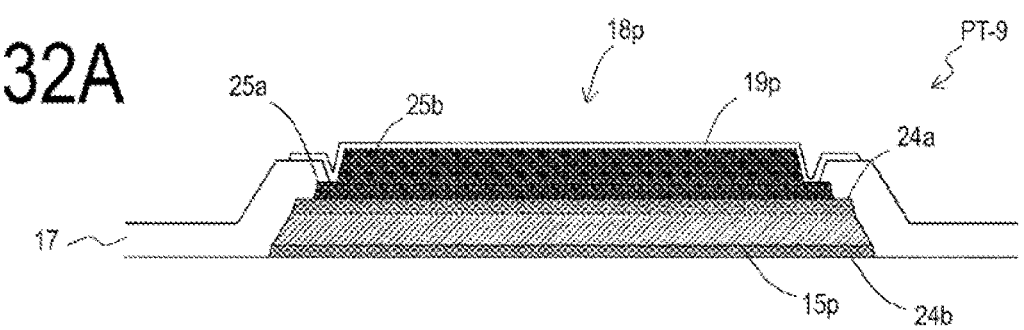
FIGS. 32A and 32B are schematic cross-sectional views of transfer terminal sections PT-9 and PT-10.

The transfer terminal section PT-9 illustrated in FIG. 32A further includes a second protection metal layer 25b disposed on a first protection metal layer 25a corresponding to the protection metal layer 25 in the transfer terminal section PT-3 illustrated in FIG. 29A. The second insulating layer 17 covers a peripheral portion of the refractory metal containing layer 24a and the entire side surface of the patch connection section 15p, and the second protection metal layer 25b is formed on the first protection metal layer 25a exposed in the opening 18p of the second insulating layer 17. The transparent conductive layer 19p is formed covering the entire second protection metal layer 25b and reaching the second insulating layer 17 in the vicinity of the opening 18p.

The upper face of the transparent conductive layer 19p formed on the second protection metal layer 25b is in the highest position of the transfer terminal section PT-9 (with reference to the front face of the glass substrate, for example). On the other hand, the upper face of the transparent conductive layer 19 formed on the second insulating layer 17 in the vicinity of the opening 18p is in the highest position of the transfer terminal section PT-3 illustrated in FIG. 29A, and the upper face of the transparent conductive layer 19p on the protection metal layer 25 is in the recessed position in the opening 18p. In this case, when a transfer section is formed with a resin containing conductive spacers, the positions of the conductive spacers (having a spherical or cylindrical shape) are unstable, which may result in non-uniform thickness (substrate gap) of the liquid crystal layer. When, like the transfer terminal section PT-9, the transparent conductive layer 19p formed on the second protection metal layer 25b is in a position higher than the second insulating layer 17, the conductive spacers positioned on the transparent conductive layer 19p on the second protection metal layer 25b can stably maintain the thickness (substrate gap) of the liquid crystal layer.

Figure 32B:
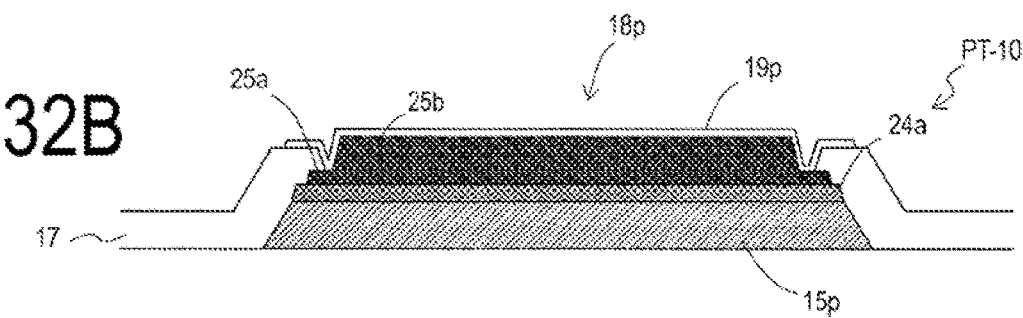

The transfer terminal section PT-10 illustrated in FIG. 32B has the same structure as the transfer terminal section PT-9 in FIG. 32A but does not include the refractory metal containing layer 24b.

Figure 33A:
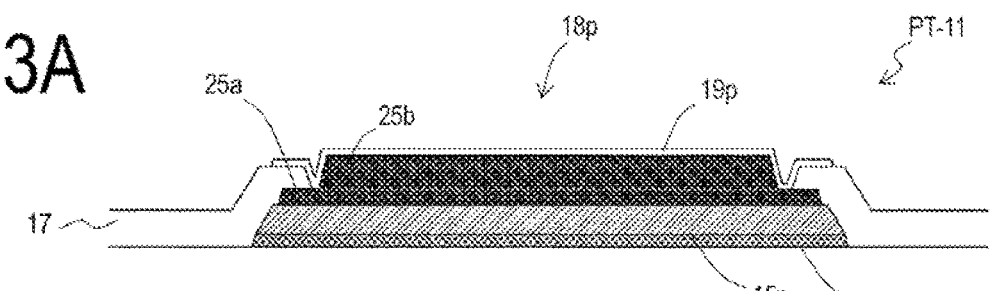
FIGS. 33A and 33B are schematic cross-sectional views of transfer terminal sections PT-11 and PT-12.

The transfer terminal section PT-11 illustrated in FIG. 33A has the same structure as the transfer terminal section PT-9 in FIG. 32A but does not include the refractory metal containing layer 24a. The transfer terminal section PT-12 illustrated in FIG. 33B has the same structure as the transfer terminal section PT-9 in FIG. 32A but does not include either of the refractory metal containing layers 24a and 24b.

Figure 34A:
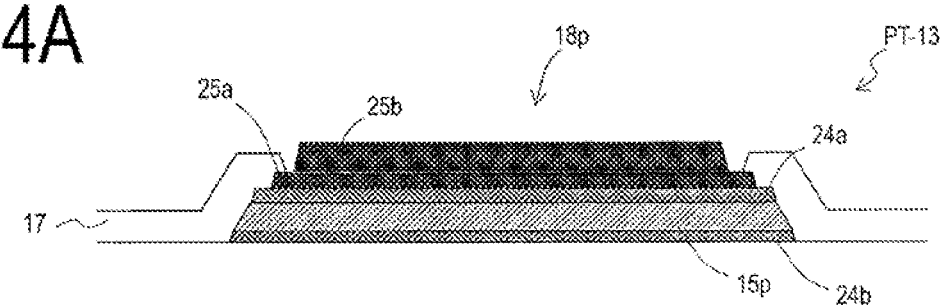
FIGS. 34A and 34B are schematic cross-sectional views of transfer terminal sections PT-13 and PT-14.
Figure 34B:
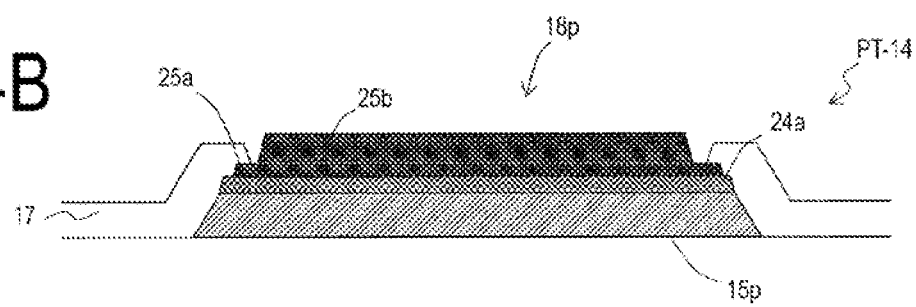

The transfer terminal sections PT-13 and PT-14 illustrated in FIGS. 34A and 34B respectively have the same structures as the transfer terminal sections PT-9 and PT-10 illustrated in FIGS. 32A and 32B but do not include the transparent conductive layer 19p.

Figure 33B:
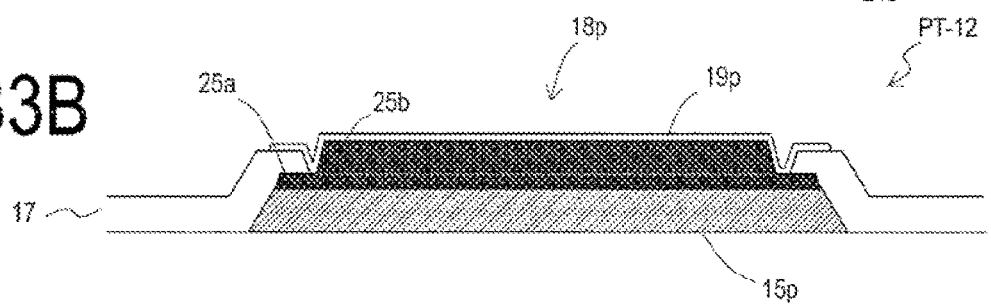
Figure 35A:
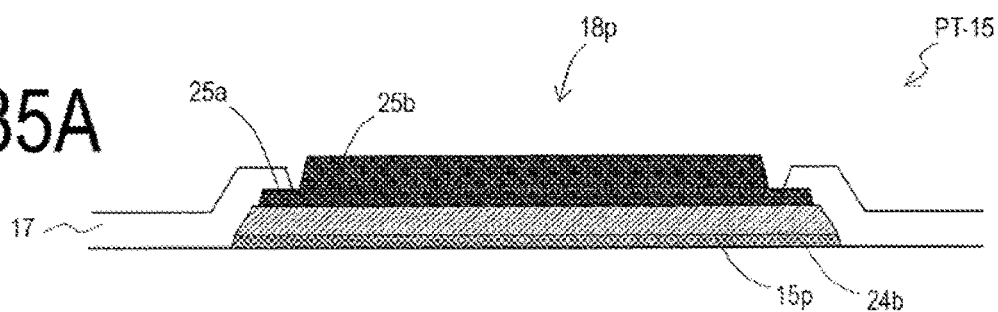
FIGS. 35A and 35B are schematic cross-sectional views of transfer terminal section PT-15 and PT-16.
Figure 35B:
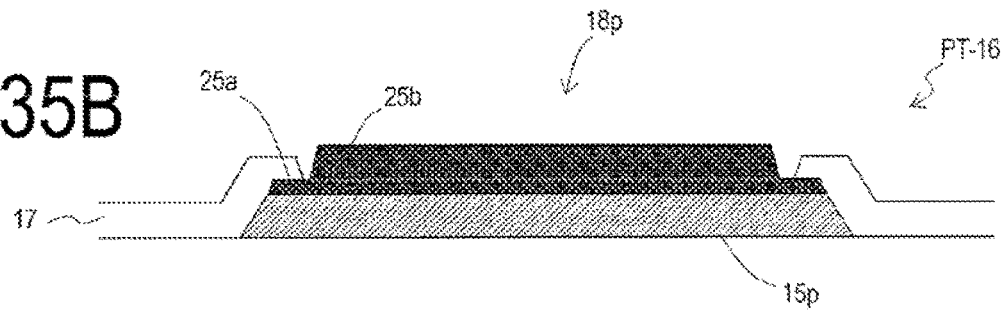

The transfer terminal sections PT-15 and PT-16 illustrated in FIGS. 35A and 35B respectively have the same structure as the transfer terminal sections PT-11 and PT-12 illustrated in FIGS. 33A and 33B but do not include the transparent conductive layer 19p.

When, like the transfer terminal sections PT-9 to PT-16, the upper face of the second protection metal layer 25b formed in the opening 18p of the second insulating layer 17 is in a position higher than the second insulating layer (the second insulating layer in the vicinity of the opening 18p) 17, the thickness (substrate gap) of the liquid crystal layer can be stably maintained as described above.

Figure 36A:
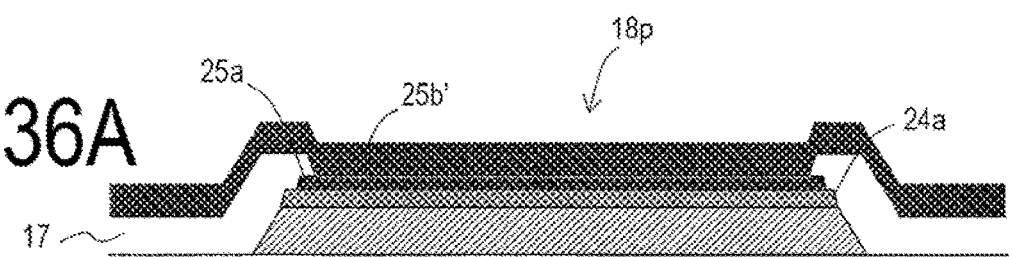
FIGS. 36A to 36C are schematic cross-sectional views for describing a manufacturing method of the transfer terminal section PT-10.
Figure 36B:
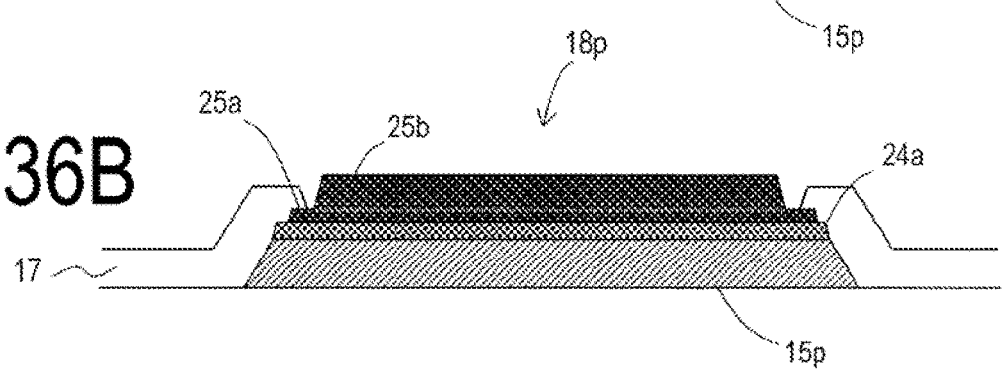
Figure 36C:
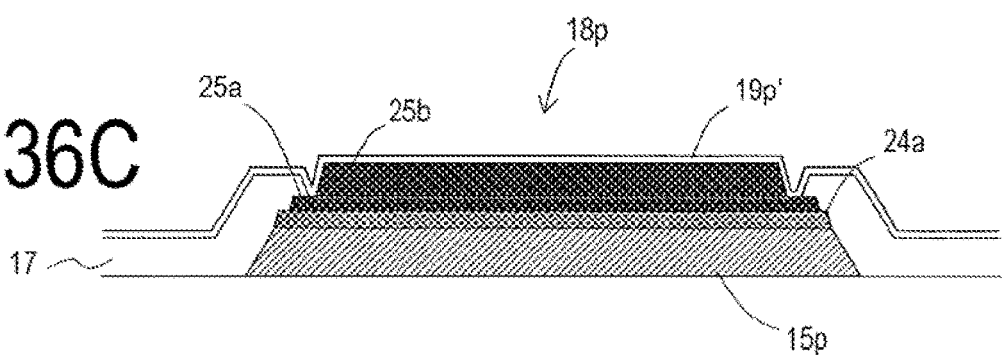

Next, a manufacturing method of the transfer terminal section PT-10 (sec FIG. 32B) will be described with reference to FIGS. 36A to 36C. FIGS. 36A to 36C are schematic cross-sectional views for describing a manufacturing method of the transfer terminal section PT-10.

First, through processes similar to those in the manufacturing method of the transfer terminal section PT-4 described with reference to FIGS. 31A to 31G, a second insulating layer 17 including an opening 18$p$ exposing a portion (a central portion other than a peripheral portion) of the upper face of a first protection metal layer 25$a$ is formed.

Thereafter, as illustrated in FIG. 36A, a second protection metal film 25$b'$ is formed on the substantially entire surface, and as illustrated in FIG. 36B, the second protection metal film 25$b'$ is patterned to form a second protection metal layer 25$b$ on the first protection metal layer 25$a$.

Thereafter, as illustrated in FIG. 36C, a transparent conductive film 19$p'$ is formed on the substantially entire surface, and the transparent conductive film 19$p'$ is patterned to obtain a transfer terminal section PT-10 (FIG. 32B) including a transparent conductive layer (transfer terminal upper connection section) 19$p$.

Next, a manufacturing method of the transfer terminal section PT-12 (see FIG. 33B) will be described with reference to FIGS. 37A to 37G. FIGS. 37A to 37G are schematic cross-sectional views for describing a manufacturing method of the transfer terminal section PT-12.

Figure 37A:
FIGS. 37A to 37G are schematic cross-sectional views for describing a manufacturing method of the transfer terminal section PT-12.

After a first insulating layer 11 including a predetermined contact hole is formed through processes similar to those in the manufacturing method of the TFT substrate 101 described with reference to FIG. 5, for example, a patch conductive film 15' and a first protection metal film 25$a'$ are formed on the substantially entire surface of the first insulating layer (not illustrated) as illustrated in FIG. 37A.

Figure 37B:

Next, as illustrated in FIG. 37B, the patch conductive film 15' and the first protection metal film 25$a'$ are etched to obtain a patch connection section 15$p$ and a first protection metal layer 25$a$. For example, an etching mask is formed with a photoresist, and the etching is performed with an acid chemical solution. At this time, since the first protection metal film 25$a'$ is formed on the patch conductive film 15', the taper angle of the patch connection section 15$p$ can be relatively easily controlled so as to be within a range from 15° to 75°.

Figure 37C:
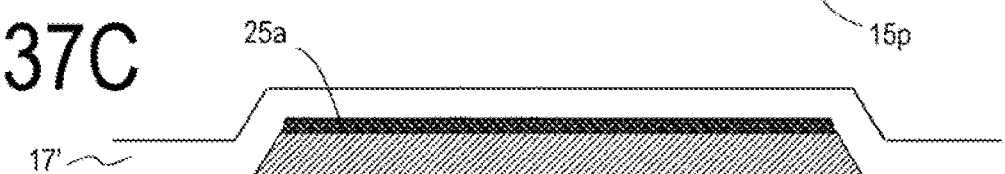
Figure 37D:
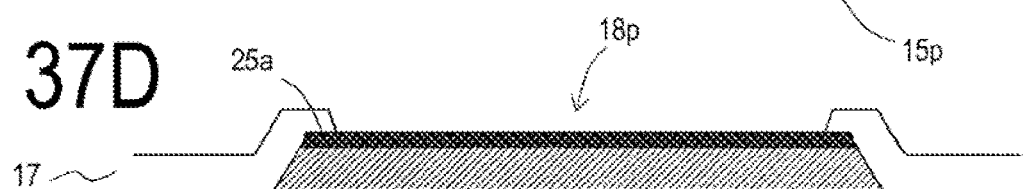

Next, as illustrated in FIG. 37C, a second insulating film 17' is formed on the substantially entire surface, and as illustrated in FIG. 37D, the second insulating film 17' is patterned to form a second insulating layer 17 including an opening 18$p$.

Figure 37E:
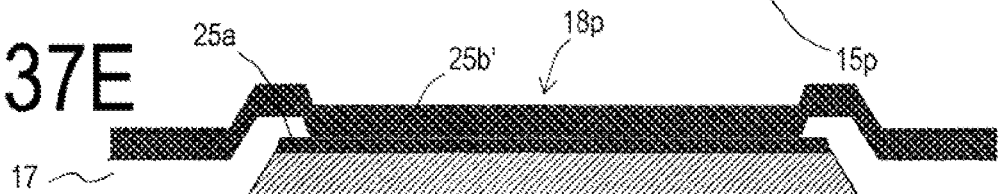
Figure 37F:
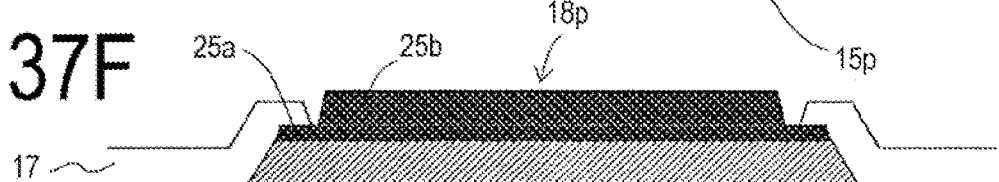

Thereafter, as illustrated in FIG. 37E, a second protection metal film 25$b'$ is formed on the substantially entire surface, and as illustrated in FIG. 37F, the second protection metal film 25$b'$ is patterned to form a second protection metal layer 25$b$ on the upper face of the first protection metal layer 25$a$ exposed in the opening 18$p$ of the second insulating layer 17.

Figure 37G:
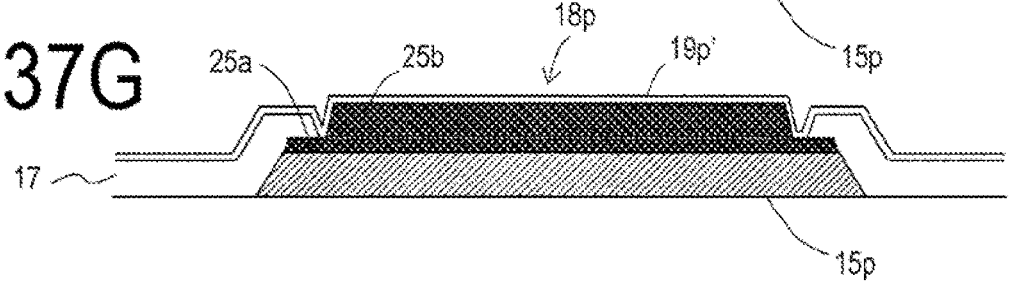

Thereafter, as illustrated in FIG. 37G, a transparent conductive film 19$p'$ is formed on the substantially entire surface, and the transparent conductive film 19$p'$ is patterned to obtain a transfer terminal section PT-12 (FIG. 33B) including a transparent conductive layer (transfer terminal upper connection section) 19$p$.

Each of the processes in the above-described manufacturing methods can be achieved by a known method, and detailed description thereof is thus omitted. It will be apparent to those skilled in the art that the other transfer terminal sections PT-9, PT-11, and PT-13 to PT-16 are manufactured by modifying the above-described manufacturing methods, and description thereof is thus omitted.

Similar to the cases of using the transfer terminal sections PT-3 to PT-8, the above problems can be solved by using the transfer terminal sections PT-9 to PT-16. Note that a terminal section IT having the same configuration as any of the transfer terminal sections PT-3 to PT-16 is formed as the terminal section IT of the slot substrate. However, the main layer 55M of the slot electrode 55 included in the terminal section IT is formed of a Cu layer having a thickness of, for example, 2 µm or greater and 6 µm or less, which is thicker than the patch connection section 15$p$ included in the transfer terminal section PT. The main layer 55M of the slot electrode 55 is referred to as a "low-resistance metal layer", and a portion of the terminal section IT formed of the low-resistance metal layer and corresponding to the patch connection section 15$p$ in the transfer terminal sections PT-3 to PT-16 is referred to as a "slot connection section". Note that the slot electrode 55 may be formed directly on the glass substrate 51, for example. The slot electrode 55 may be formed on the third insulating layer 52 formed on the glass substrate 51.

Sixth Embodiment

The scanning antenna of a sixth embodiment will be described below. The scanning antenna of the sixth embodiment is characterized by the structure of the terminal section IT of the slot substrate. The terminal section IT of the slot substrate having the structure described here can also be applied to any of the above-described embodiments. However, regarding the structure of the transfer section, a combination with the transfer terminal sections PT-3 to PT-16 of the scanning antenna of the fifth embodiment is preferable. Description of the structure other than that of the terminal section may be omitted below.

The terminal section IT of the slot substrate includes the main layer 55M of the slot electrode 55 (the slot connection section, for example, a Cu film or an Al film having a thickness of 2 µm or greater and 6 µm or less), so that a crack in the fourth insulating layer 58 covering the slot electrode 55 in the terminal section IT may decrease moisture resistance reliability. The slot substrate of the scanning antenna of the present embodiment can solve this problem.

First, a problem that occurs in a terminal section IT of a slot substrate. 204 will be described with reference to FIGS. 38A, 38B, 39A, and 39B.

Figure 38A:
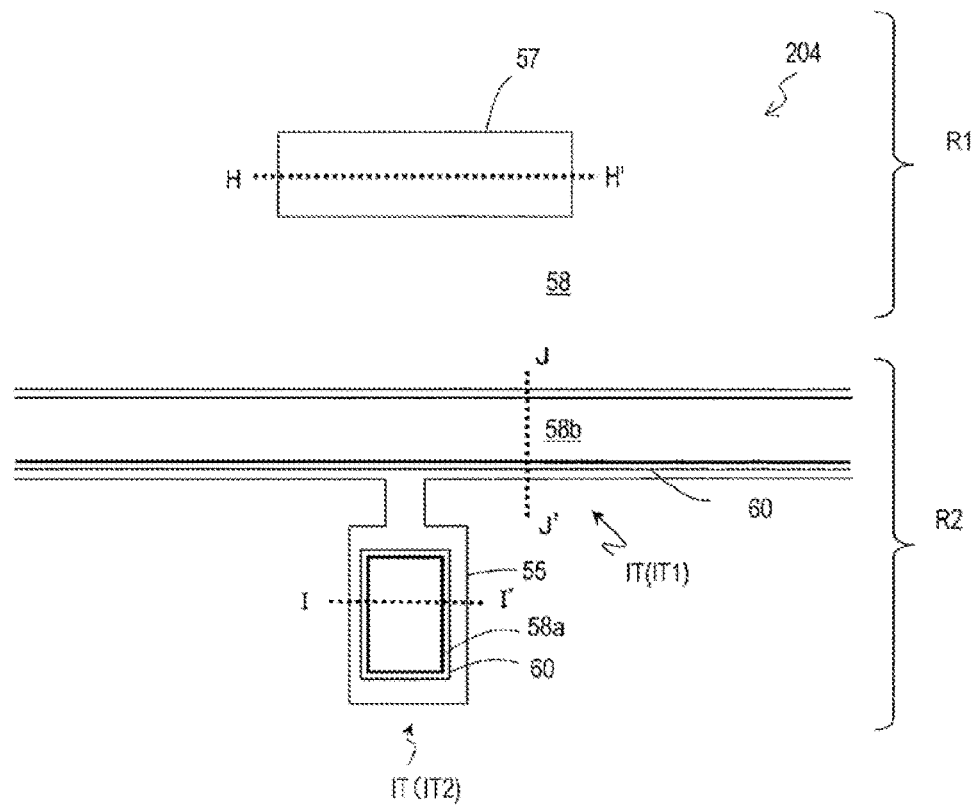
FIG. 38A is a schematic top view of a slot substrate 204.
Figure 38B:
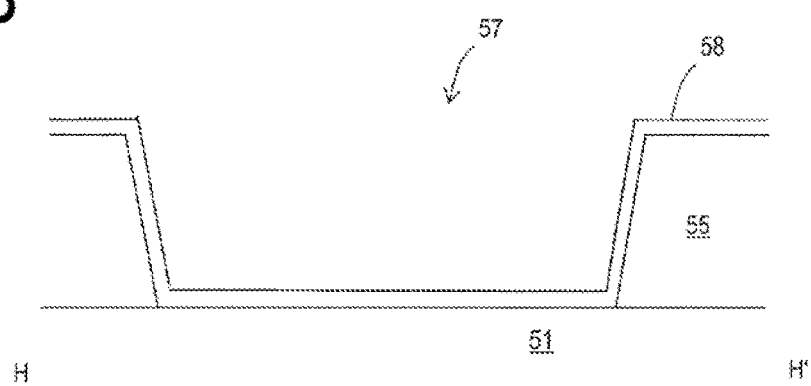
FIG. 38B is a schematic cross-sectional view taken along the line H-H' in FIG. 38A.
Figure 39A:
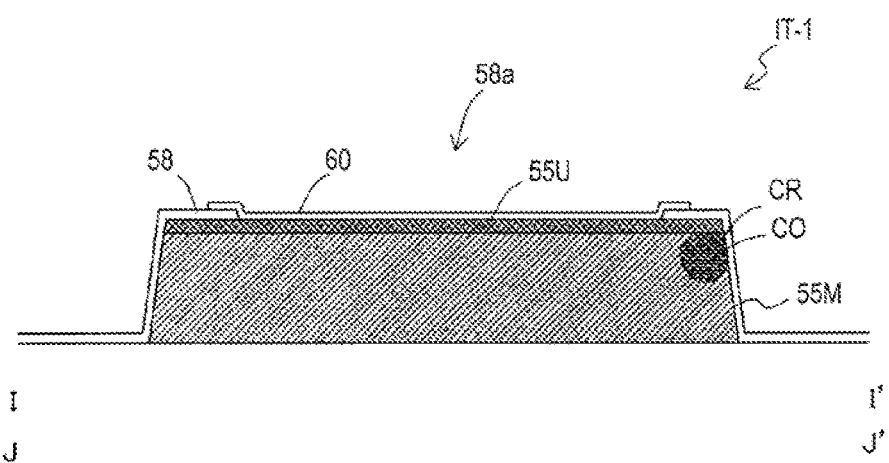
FIG. 39A is a schematic cross-sectional view of a terminal section IT-1 taken along the line I-I' or the line J-J' in FIG. 38A.
Figure 39B:
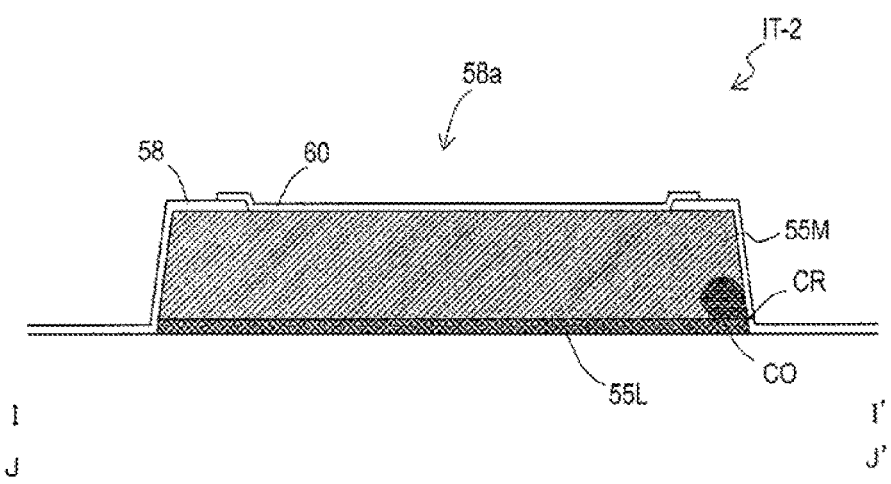
FIG. 39B is a schematic cross-sectional view of a terminal section IT-2 taken along the line I-I' or the line J-J' in FIG. 38A.

FIG. 38A is a schematic top view of the slot substrate 204, and FIG. 38B is a schematic cross-sectional view taken along the line H-H' in FIG. 38A. FIGS. 39A and 39B are schematic cross-sectional views taken along the line I-I' or the line J-J' in FIG. 38A.

The slot substrate 204 includes, for example, a slot electrode 55 formed on a glass substrate 51 and a fourth insulating layer 58 covering the slot electrode 55. The slot electrode 55 includes a plurality of slots 57 in a transmission and/or reception region R1. The fourth insulating layer 58 includes openings 58$a$ and 58$b$ respectively in a first terminal section IT1 and a second terminal section IT2 in the non-transmission and/or reception region R2. The first terminal section IT1 and the second terminal section IT2 respectively form transfer sections together with the first transfer terminal section PT1 and the second transfer terminal section PT2 (see FIG. 21) of the TFT substrate, for example. The fourth insulating layer 58 covers the substantially entire surface of the slot substrate 204 except for the openings 58$a$ and 58$b$. The slot electrode 55 is exposed in the openings 58$a$ and 58$b$ of the fourth insulating layer 58, and an upper connection section (transparent conductive layer) 60 covering the openings 58a and 58b is in contact with the slot electrode 55 in the openings 58a and 58b.

In a terminal section IT-1 illustrated in FIG. 39A, the slot electrode 55 includes a main layer 55M and an upper layer 55U. The main layer 55M is, for example, a Cu layer or an Al layer having a thickness of 2 μm or greater and 6 μm or less, and the upper layer 55U is a refractory metal containing layer 55U formed from, for example, Mo or MoN. The thickness of the refractory metal containing layer 55U is, for example, 10 nm or greater and 300 nm or less, and is, for example, 10 nm.

In a terminal section IT-2 illustrated in FIG. 39B, the slot electrode 55 includes a main layer 55M and a lower layer 55L. The main layer 55M is, for example, a Cu layer or an Al layer having a thickness of 2 μm or greater and 6 μm or less, and the lower layer 55L is a refractory metal containing layer 55L formed from, for example, Mo or MoN. The thickness of the refractory metal containing layer 55L is, for example, 10 nm or greater and 300 nm or less, and is, for example, 10 nm.

A silicon oxide (SiOx) film, a silicon nitride (SixNy) film, a silicon oxynitride (SiOxNy; x>y) film, or a silicon nitride oxide (SiNxOy; x>y) film, for example, can be used as the fourth insulating layer 58 in the terminal sections IT-1 and IT-2 as appropriate. As the fourth insulating layer 58, for example, a SiNx layer having a thickness of 200 nm is formed. As the fourth insulating layer 58, a SiNx layer having a thickness of 20 nm or greater and 200 nm or less is preferable. The fourth insulating layer 58 having a thickness of greater than 200 nm unnecessarily increases loss of microwaves.

As the transparent conductive layer 60, an indium tin oxide (ITO) layer, an indium zinc oxide (IZO) layer, or a zinc oxide (ZnO) layer can be used. The thickness of the transparent conductive layer 60 is set so that its sheet resistance is less than 0.10 Ω/sq, for example. The transparent conductive layer 60 has a thickness of 20 nm or greater and 250 nm or less, for example.

As illustrated in FIGS. 39A and 39B, a crack CR is generated in the fourth insulating layer 58 in the terminal sections IT-1 and IT-2, and moisture entering from the crack may cause corrosion CO in the Cu layer or Al layer of the main layer 55M. A crack is readily generated in the interface between the main layer 55M and the upper layer 55U and the interface between the main layer 55M and the lower layer 55L.

Terminal sections IT-3 to IT-14 described with reference to FIG. 40A to FIG. 43C can solve the above problem.

Figure 40A:
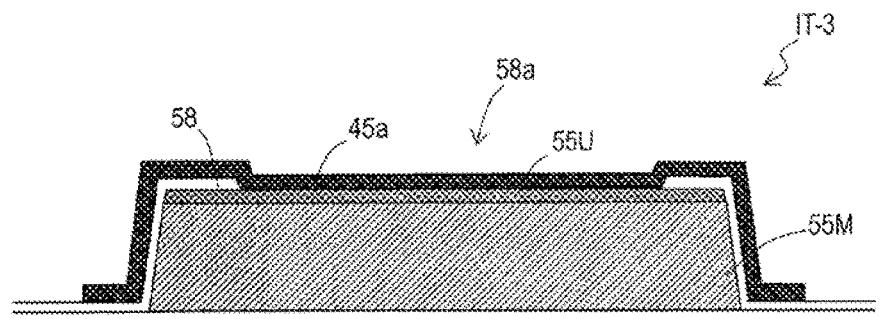
FIGS. 40A to 40C are schematic cross-sectional views of terminal sections IT-3 to IT-5.
Figure 40B:
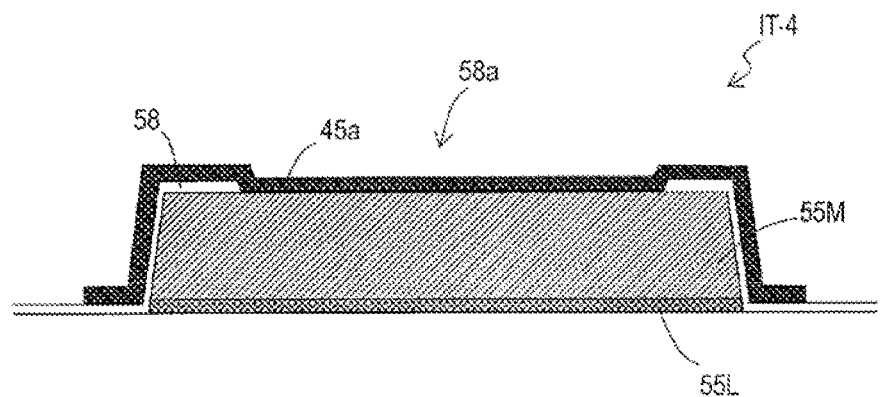
Figure 40C:
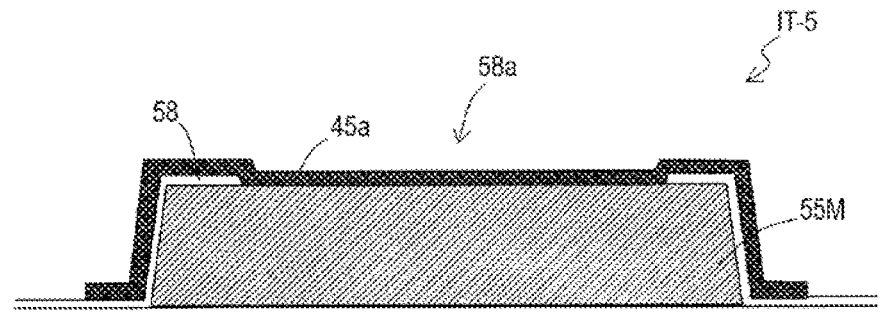

FIGS. 40A to 40C are schematic cross-sectional views of the terminal sections IT-3 to IT-5.

The terminal section IT-3 illustrated in FIG. 40A includes a protection metal layer 45a covering the refractory metal containing layer 55U exposed in the opening 58a of the fourth insulating layer 58 and the side surface of the fourth insulating layer 58, instead of the transparent conductive layer 60 in the terminal section IT-1 illustrated in FIG. 39A. Similar to the protection metal layer 25 of the fifth embodiment, the protection metal layer 45a is formed of at least one layer selected from the group consisting of a Ti layer, a MoNb layer, a MoNbNi layer, a MoNbN layer, and a MoNbNiN layer. In other words, the protection metal layer 45a may be formed of one layer or two or more laminated layers selected from the group consisting of a Ti layer, a MoNb layer, a MoNbNi layer, a MoNbN layer, and a MoNbNiN layer. Similar to the protection metal layer 25 of the fifth embodiment, the protection metal layer 45a has a thickness of, for example, 18 nm or greater, and preferably 28 nm or greater.

The terminal section IT-4 illustrated in FIG. 40B includes a protection metal layer 45a covering the main layer 55M exposed in the opening 58a of the fourth insulating layer 58 and the entire side surface of the fourth insulating layer 58, instead of the transparent conductive layer 60 in the terminal section IT-2 in FIG. 39B.

The terminal section IT-5 illustrated in FIG. 40C has the same structure as the terminal section IT-4 in FIG. 40B but does not include the refractory metal containing layer 55L. Although not illustrated in the drawings, a refractory metal containing layer 55L may be disposed below the main layer 55M in the terminal section IT-3 in FIG. 40A.

Figure 41A:
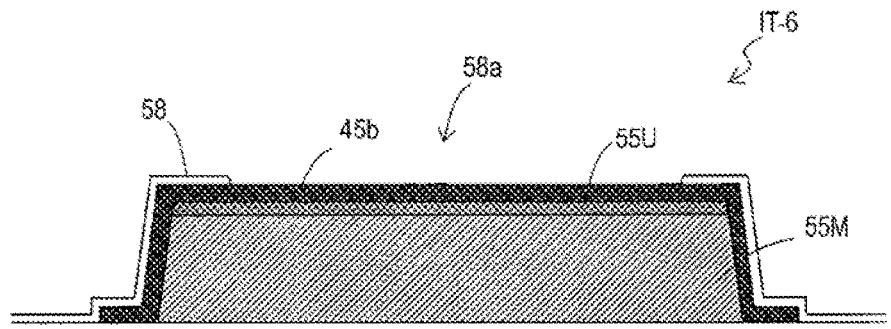
FIGS. 41A to 41C are schematic cross-sectional views of terminal sections IT-6 to IT-8.
Figure 41B:
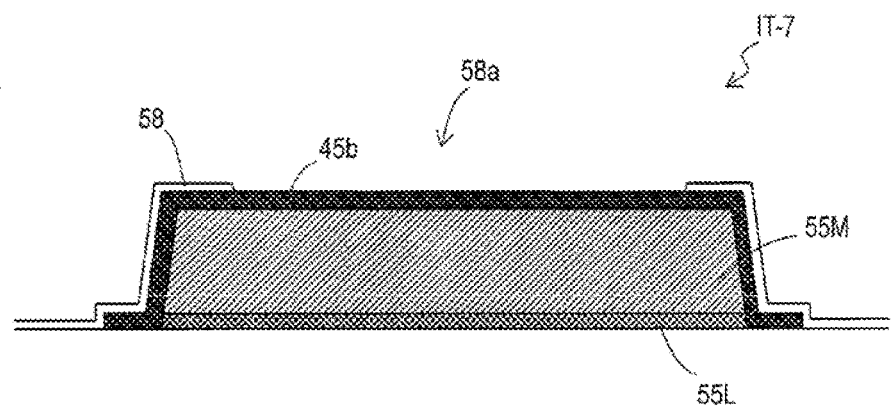
Figure 41C:
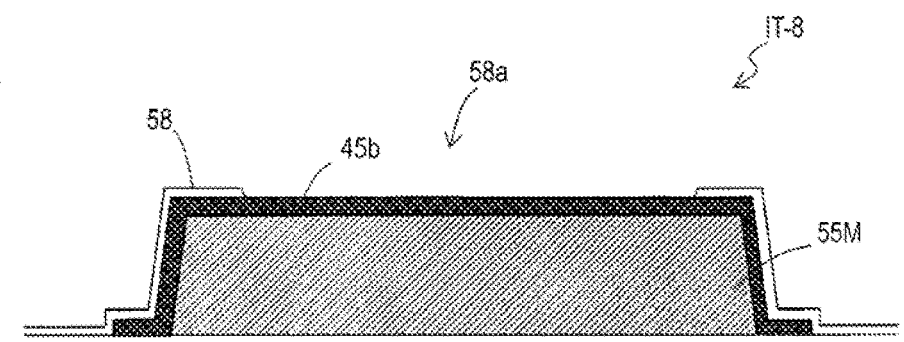

In the terminal sections IT-6 to IT-8 illustrated in FIGS. 41A to 41C, the layering order of the fourth insulating layer 58 and the protection metal layer 45a is reverse to that in the terminal sections IT-3 to IT-5 illustrated in FIGS. 40A to 40C, respectively.

The terminal section IT-6 illustrated in FIG. 41A includes a protection metal layer 45b covering the upper faces and the entire side surfaces of the main layer 55M and the refractory metal containing layer 55U. The terminal section IT-6 includes a fourth insulating layer 58 (preferably a SixNy layer) covering a peripheral portion of the upper face and the entire side surface of the protection metal layer 45b. The terminal section IT-7 illustrated in FIG. 41B includes a protection metal layer 45b covering the upper face of the main layer 55M and the entire side surfaces of the main layer 55M and the refractory metal containing layer 55L. The terminal section IT-8 illustrated in FIG. 41C includes a protection metal layer 45b covering the upper face and the entire side surface of the main layer 55M. Although not illustrated in the drawings, a refractory metal containing layer 55L may be disposed below the main layer 55M in the terminal section IT-6 in FIG. 41A.

Figure 42A:
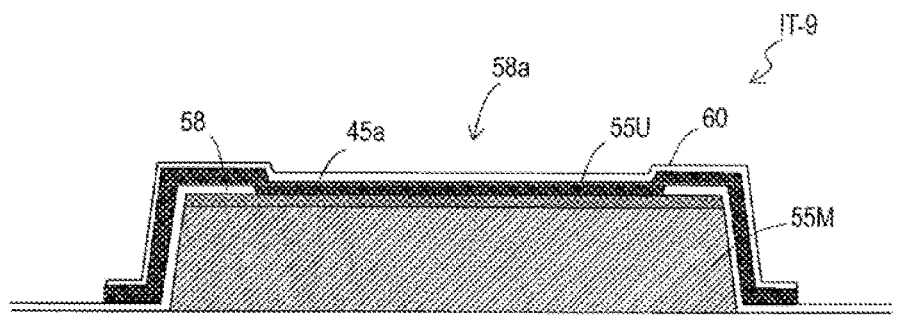
FIGS. 42A to 42C are schematic cross-sectional views of terminal sections IT-9 to IT-11.
Figure 42B:
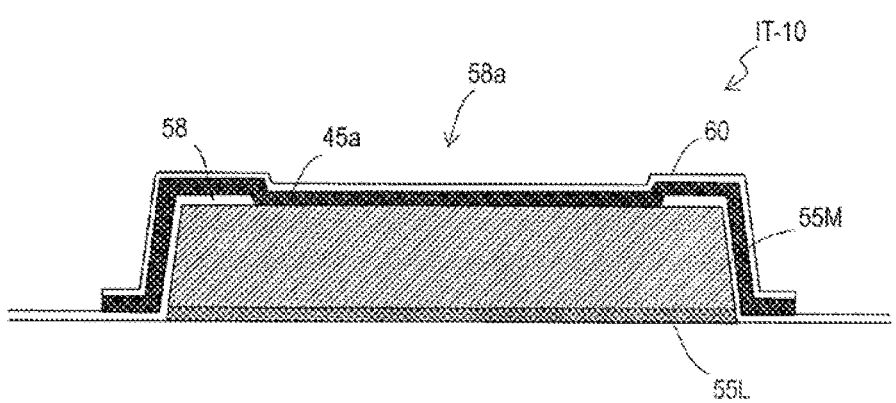
Figure 42C:
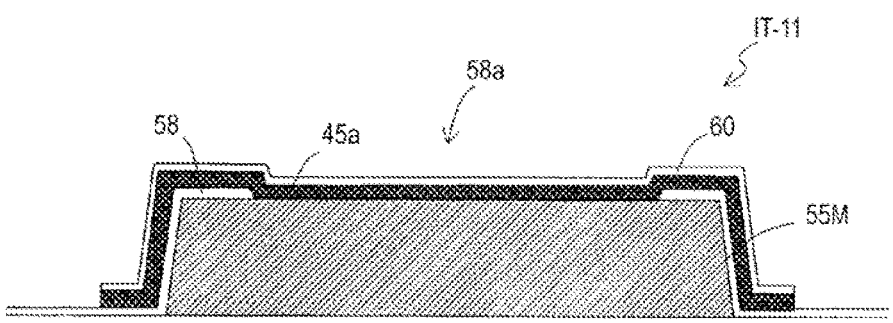

In the terminal sections IT-9 to IT-11 illustrated in FIGS. 42A to 42C, a transparent conductive layer 60 is formed on the protection metal layer 45a in the terminal sections IT-3 to IT-5 illustrated in FIGS. 40A to 40C, respectively. By further providing the transparent conductive layer 60, the moisture resistance reliability can be further enhanced.

Figure 43A:
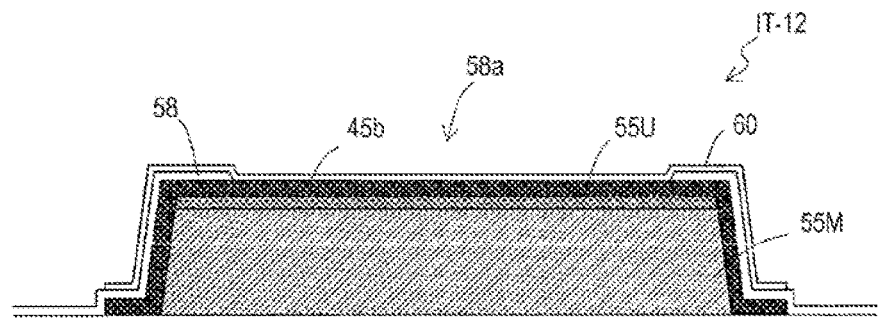
FIGS. 43A to 43C are schematic cross-sectional views of terminal sections IT-12 to IT-14.
Figure 43B:
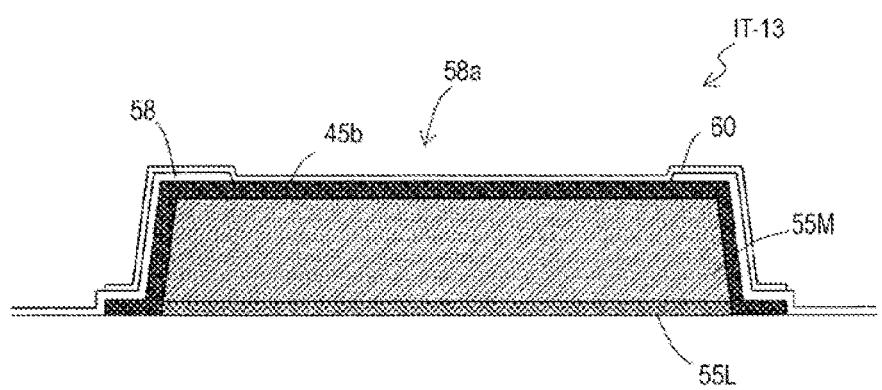
Figure 43C:
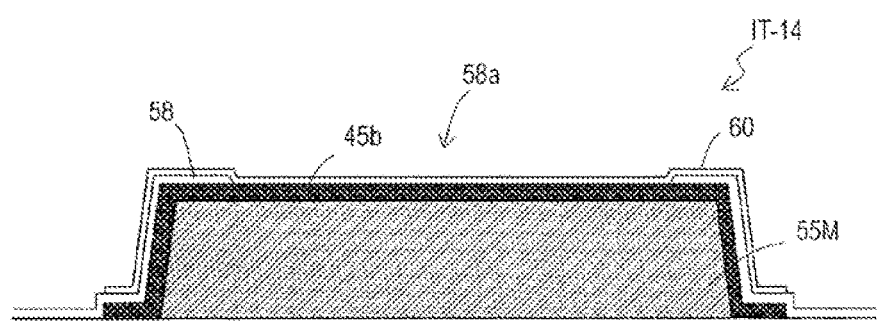

In the terminal sections IT-12 to IT-14 illustrated in FIGS. 43A to 43C, a transparent conductive layer 60 is formed on the protection metal layer 45b in the terminal sections IT-6 to IT-8 illustrated in FIGS. 41A to 41C, respectively. In the terminal sections IT-12 to IT-14, the fourth insulating layer 58 is formed, covering the peripheral portion of the upper face and the entire side surface of the protection metal layer 45b, which indicates that the fourth insulating layer 58 is disposed between the transparent conductive layer 60 and the protection metal layer 45b.

Next, a manufacturing method of the terminal section IT-4 (FIG. 40B) will be described with reference to FIGS. 44A to 44E.

Figure 44A:
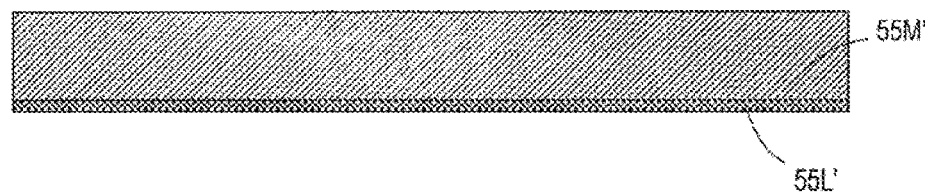
FIGS. 44A to 44E are schematic cross-sectional views for describing a manufacturing method of the terminal section IT-4.

As illustrated in FIG. 44A, a refractory metal containing film 55L' and a Cu film 55M' to be the main layer of the slot electrode 55 are formed on the substantially entire surface of a glass substrate (not illustrated), for example.

Figure 44B:
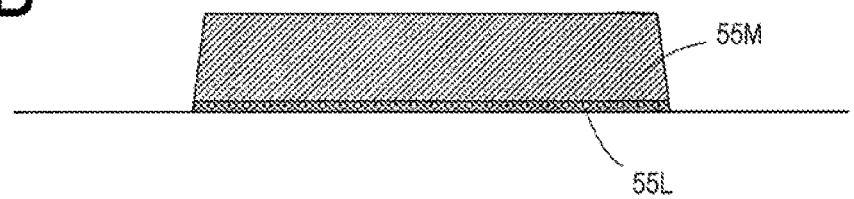

Next, as illustrated in FIG. 44B, the Cu film 55M' and the refractory metal containing film 55L' are etched to obtain a refractory metal containing layer 55L and a main layer 55M. For example, an etching mask is formed with a photoresist, and the etching is performed with an acid chemical solution. At this time, etching conditions are adjusted to control the taper angle of the refractory metal containing layer 55L and the main layer 55M so as to be within a range from 15° to 75°.

Figure 44C:
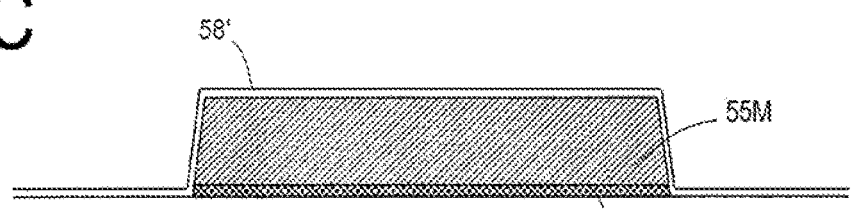
Figure 44D:
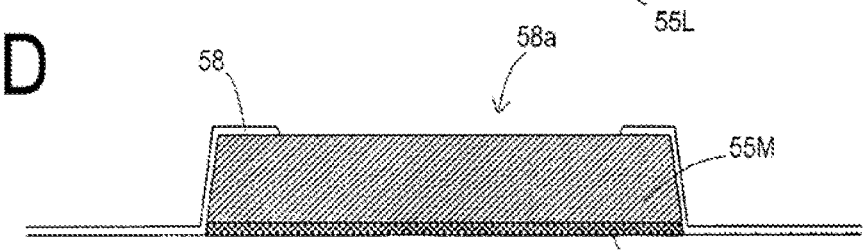

Next, as illustrated in FIG. 44C, a fourth insulating film 58' is formed on the substantially entire surface, and as illustrated in FIG. 44D, the fourth insulating film 58' is patterned to form a fourth insulating layer 58 including an opening 58a.

Figure 44E:
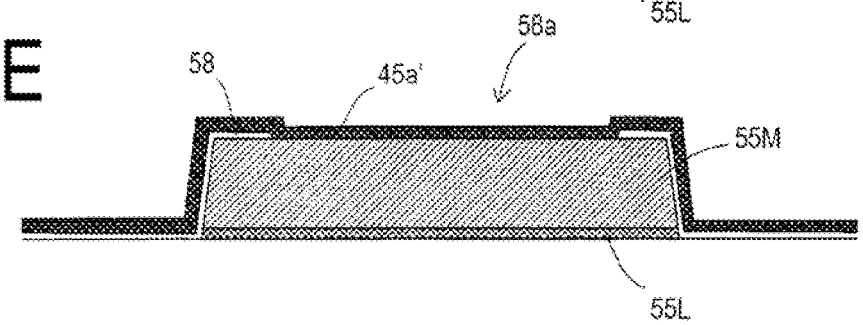

Next, as illustrated in FIG. 44E, a protection metal film 45a' is formed on the substantially entire surface, and the protection metal film 45a' is patterned to obtain a terminal section IT-4 (FIG. 40B).

Next, a manufacturing method of the terminal section IT-7 (FIG. 41B) will be described with reference to FIGS. 45A to 45C.

First, through processes similar to those described with reference to FIGS. 44A and 44B, a refractory metal containing layer 55L and a main layer 55M are obtained.

Figure 45A:
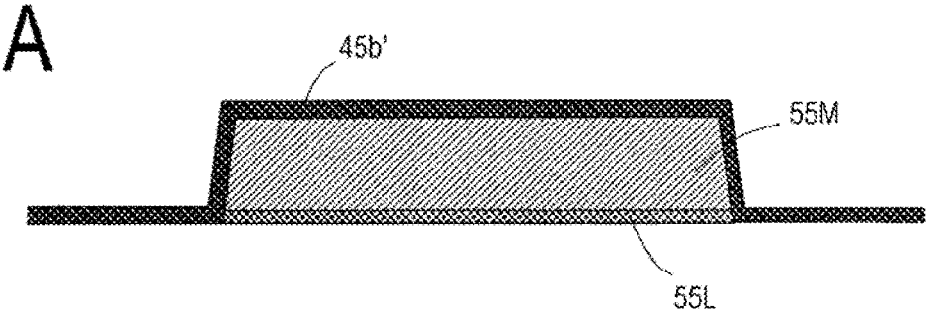
FIGS. 45A to 45C are schematic cross-sectional views for describing a manufacturing method of the terminal section IT-7.
Figure 45B:
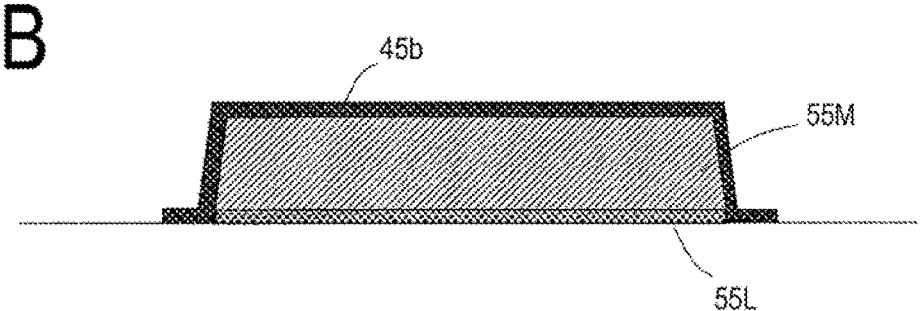

Thereafter, as illustrated in FIG. 45A, a protection metal film 45b' is formed on the substantially entire surface, and as illustrated in FIG. 45B, the protection metal film 45b' is patterned to form a protection metal layer 45b.

Figure 45C:
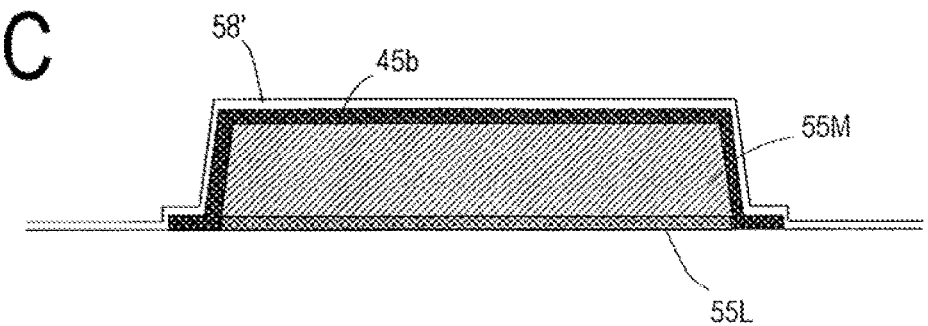

Thereafter, as illustrated in FIG. 45C, a fourth insulating film 58' is formed on the substantially entire surface. The fourth insulating film 58' is patterned to form a fourth insulating layer 58 including an opening 58a, thereby obtaining a terminal section IT-7 (see FIG. 41B).

Figure 46:
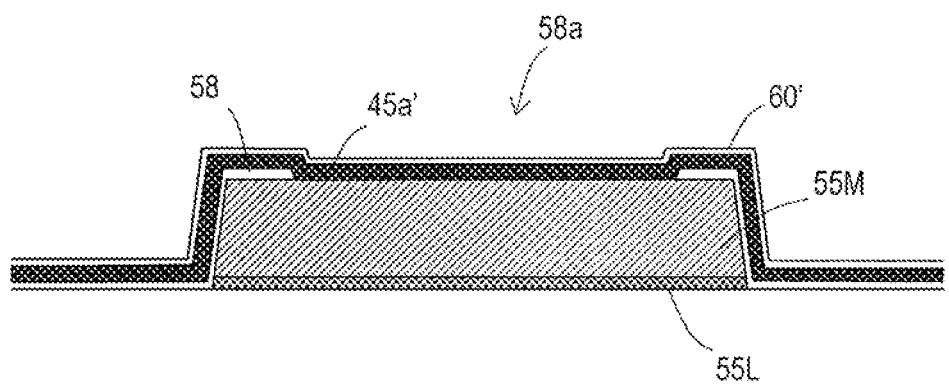
FIG. 46 is a schematic cross-sectional view for describing a manufacturing method of the terminal section IT-10.

The terminal section IT-10 illustrated in FIG. 42B is formed by, after the process illustrated in FIG. 44E, forming a transparent conductive film 60' on the substantially entire surface and then patterning the transparent conductive film 60' and the protection metal film 45a' as illustrated in FIG. 46.

Figure 47:
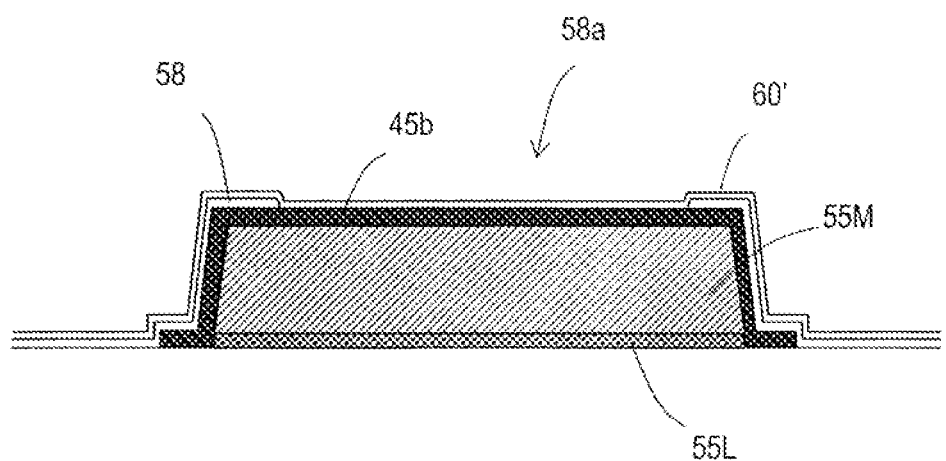
FIG. 47 is a schematic cross-sectional view for describing a manufacturing method of the terminal section IT-13.

The terminal section IT-13 illustrated in FIG. 43B is formed by, after forming the terminal section IT-7 illustrated in FIG. 41B through the processes described with reference to FIGS. 45A to 45C, forming a transparent conductive film 60' on the substantially entire surface and then patterning the transparent conductive film 60' as illustrated in FIG. 47.

Each of the processes in the above-described manufacturing methods can be achieved by a known method, and detailed description thereof is thus omitted. It will be apparent to those skilled in the art that the other terminal sections IT-1 to IT-3, IT-5, IT-6, IT-8, IT-9, IT-11, and IT-12 are manufactured by modifying the above-described manufacturing methods, and description thereof is thus omitted.

With the terminal sections IT-3 to IT-14, the protection metal layer 45a or 45b covers the upper face and the entire side surface of the main layer 55M (and the upper layer 55U and/or the lower layer 55L), so that the above problem can be solved. That is, the scanning antenna including the slot substrate including any of the terminal sections IT-3 to IT-14 excels in moisture resistance reliability. By forming the transparent conductive layer 60 on the protection metal layer 45a or 45b, the moisture resistance reliability can be further enhanced. In addition, the protection metal layer 45a or 45b has a thickness of 18 nm or greater, and preferably 28 nm or greater, and the terminal section is used in combination with the transfer terminal sections PT-3 to PT-16 described in the fifth embodiment. This can achieve the same effect as that of the fifth embodiment.

Note that the main layer 55M of the terminal sections IT-3 to IT-14 is formed of the same low-resistance metal film as that of the main layer 55M of the slot electrode 55 in the transmission and/or reception region R1. The upper layer 55U and/or lower layer 55L of the terminal sections IT-3 to IT-14 may be formed of the same film as or separately from that of the upper layer 55U and/or lower layer 55L of the slot electrode 55 in the transmission and/or reception region R1.

However, the protection metal layer 45a or 45b and the transparent conductive layer 60 are preferably formed only in the terminal sections IT-3 to IT-14 in the non-transmission and/or reception region R2 and not formed on the slot electrode 55 in the transmission and/or reception region R1. This is because, if the protection metal layer 45a or 45b and the transparent conductive layer 60 are formed on the slot electrode 55 in the transmission and/or reception region R1, loss of microwaves may be increased.

On the other hand, the fourth insulating layer 58 is preferably formed in the entire transmission and/or reception region R1 and the entire non-transmission and/or reception region R2 to suppress elution of Cu from the slot electrode 55 into the liquid crystal layer LC as described above, but may be omitted. Especially in the terminal section formed in the non-transmission and/or reception region R2, the protection metal layer 45a or 45b covers the upper face and the entire side surface of the main layer 55M (and the upper layer SSU and/or the lower layer 55L), so that the above problem can be solved.

The scanning antenna according to the embodiments of the disclosure is housed in a plastic housing, for example, as necessary. It is preferable to use a material having a small dielectric constant $\varepsilon_M$ that does not affect microwave transmission and/or reception in the housing. In addition, a through-hole may be provided in a portion of the housing corresponding to the transmission and/or reception region R1. Furthermore, a light blocking structure may be provided such that the liquid crystal material is not exposed to light. The light blocking structure is, for example, provided so as to block light that passes through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in desired locations.

INDUSTRIAL APPLICABILITY

Embodiments according to the disclosure are used in scanning antennas for satellite communication or satellite broadcasting that are mounted on mobile bodies (ships, aircraft, and automobiles, for example).

REFERENCE SIGNS LIST

1 Dielectric substrate
2 Base insulating film
3 Gate electrode
4 Gate insulating layer
5 Semiconductor layer
6D Drain contact layer
6S Source contact layer
7D Drain electrode
7S Source electrode
7p Source connection wiring line
11 First insulating layer
15 Patch electrode
15p Patch connection section 17 Second insulating layer
18g, 18s, 18p Opening
19g Gate terminal upper connection section
19p Transfer terminal upper connection section (Transparent conductive layer)
19s Source terminal upper connection section
21 Alignment mark
23 Protective conductive layer
24, 24a, 24b Refractory metal containing layer
25, 25a, 25b, 45a, 45b Protection metal layer
51 Dielectric substrate
52 Third insulating layer
54 Dielectric layer (air Layer)
55 Slot electrode
55L Lower layer
55M Main layer
55U Upper layer
55c Contact surface
57 Slot
58 Fourth insulating layer
60 Upper connection section
65 Reflective conductive plate
67 Adhesive layer
68 Heater resistive film
70 Power feed device
71 Conductive beads
72 Power feed pin
73 Sealing portion
101, 102, 103, 104 TFT substrate
201, 203 Slot substrate
1000 Scanning antenna
CH1, CH2, CH3, CH4, CH5, CH6 Contact hole
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U, U1, U2 Antenna unit, Antenna unit region

The invention claimed is:

1. A scanning antenna including a plurality of antenna units arranged therein, the scanning antenna comprising:
a TFT substrate including:
a first dielectric substrate;
a plurality of TFTs supported by the first dielectric substrate;
a plurality of gate bus lines;
a plurality of source bus lines; and
a plurality of patch electrodes connected to drains of the respective TFTs;
a slot substrate including:
a second dielectric substrate; and
a slot electrode formed on a first main surface of the second dielectric substrate, the slot electrode including a plurality of slots disposed in correspondence with the patch electrodes;
a liquid crystal layer disposed between the TFT substrate and the slot substrate; and
a reflective conductive plate facing a second main surface of the second dielectric substrate with a dielectric layer interposed between the reflective conductive plate and the second main surface, the second main surface being opposite to the first main surface,
wherein the TFT substrate further includes a transfer terminal section disposed in a non-transmission and/or reception region,
the transfer terminal section includes a patch connection section formed of a same low-resistance metal film as that of a first low-resistance metal layer of the patch electrodes, a first protection metal layer formed on the patch connection section, and a first insulating layer including an opening partially exposing an upper face of the first protection metal layer,
the slot substrate further includes a terminal section disposed in the non-transmission and/or reception region,
the terminal section includes a slot connection section formed of a same low-resistance metal film as that of a second low-resistance metal layer of the slot electrode, a second protection metal layer formed on the slot connection section, and a second insulating layer including an opening partially exposing an upper face of the second protection metal layer, and
the first and second protection metal layers are each formed of at least one layer selected from the group consisting of a Ti layer, a MoNb layer, a MoNbNi layer, a MoNbN layer, and a MoNbNiN layer, and have a thickness of 18 nm or greater.

2. The scanning antenna according to claim 1, wherein the transfer terminal section further includes a first refractory metal containing layer disposed between the patch connection section and the first protection metal layer.

3. The scanning antenna according to claim 1, wherein the terminal section further includes a second refractory metal containing layer disposed between the slot connection section and the second protection metal layer.

4. The scanning antenna according to claim 3, wherein the first or second refractory metal containing layer contains Mo or MoN.

5. The scanning antenna according to claim 1, wherein the upper face, exposed from the opening of the first insulating layer, of the first protection metal layer is in a position higher than the first insulating layer with respect to a front face of the first dielectric substrate.

6. The scanning antenna according to claim 1, wherein the first and second insulating layers are each composed of a silicon nitride layer having a thickness of 0.2 μm or less.

7. The scanning antenna according to claim 1, wherein the second protection metal layer covers an upper face and an entire side surface of the slot connection section.

8. A scanning antenna including a plurality of antenna units arranged therein, the scanning antenna comprising:
a TFT substrate including:
a first dielectric substrate;
a plurality of TFTs supported by the first dielectric substrate;
a plurality of gate bus lines;
a plurality of source bus lines; and
a plurality of patch electrodes connected to drains of the respective TFTs;
a slot substrate including:
a second dielectric substrate; and a slot electrode formed on a first main surface of the second dielectric substrate, the slot electrode including a plurality of slots disposed in correspondence with the patch electrodes;

a liquid crystal layer disposed between the TFT substrate and the slot substrate; and a reflective conductive plate facing a second main surface of the second dielectric substrate with a dielectric layer interposed between the reflective conductive plate and the second main surface, the second main surface being opposite to the first main surface, wherein the TFT substrate further includes a transfer terminal section disposed in a non-transmission and/or reception region, the transfer terminal section includes a patch connection section formed of a same low-resistance metal film as that of a first low-resistance metal layer of the patch electrodes, a first protection metal layer formed on the patch connection section, and a first insulating layer including an opening partially exposing an upper face of the first protection metal layer, the slot substrate further includes a terminal section disposed in the non-transmission and/or reception region, the terminal section includes a slot connection section formed of a same low-resistance metal film as that of a second low-resistance metal layer of the slot electrode, and a second protection metal layer covering an upper face and an entire side surface of the slot connection section, and the first and second protection metal layers are each formed of at least one layer selected from the group consisting of a Ti layer, a MoNb layer, a MoNbNi layer, a MoNbN layer, and a MoNbNiN layer.

9. The scanning antenna according to claim 8, wherein the terminal section further includes a second insulating layer including an opening partially exposing the upper face of the slot connection section, and the second protection metal layer is formed on the second insulating layer.

10. The scanning antenna according to claim 9, wherein the first and second insulating layers are each composed of a silicon nitride layer having a thickness of 0.2 μm or less.

11. The scanning antenna according to claim 8, wherein the terminal section further includes a second insulating layer including an opening partially exposing an upper face of the second protection metal layer.

12. The scanning antenna according to claim 1, wherein the terminal section further includes a transparent conductive layer formed on the second protection metal layer.

* * * * *